United States Patent
Diev et al.

(10) Patent No.: US 10,897,025 B2
(45) Date of Patent: Jan. 19, 2021

(54) ELECTROACTIVE MATERIALS

(71) Applicant: LG Chem, Ltd., Seoul (KR)

(72) Inventors: Viacheslav V. Diev, Wilmington, DE (US); Weiying Gao, Landenberg, PA (US); John David Allen, New Castle, DE (US); Weishi Wu, Landenberg, PA (US); Gene M. Rossi, Wilmington, DE (US); Kerwin D. Dobbs, Wilmington, DE (US); Michael R. Moseley, New Castle, DE (US); Chi Zhang, Goleta, CA (US)

(73) Assignee: LG Chem, Ltd.

( * ) Notice: Subject to any disclaimer, the term of this patent is extended or adjusted under 35 U.S.C. 154(b) by 301 days.

(21) Appl. No.: 15/562,182

(22) PCT Filed: May 18, 2016

(86) PCT No.: PCT/US2016/033051
§ 371 (c)(1),
(2) Date: Sep. 27, 2017

(87) PCT Pub. No.: WO2016/191171
PCT Pub. Date: Dec. 1, 2016

(65) Prior Publication Data
US 2018/0097193 A1 Apr. 5, 2018

Related U.S. Application Data

(60) Provisional application No. 62/166,333, filed on May 26, 2015.

(51) Int. Cl.
*H01L 51/50* (2006.01)
*C09K 11/06* (2006.01)
(Continued)

(52) U.S. Cl.
CPC ............ *H01L 51/508* (2013.01); *C08G 61/12* (2013.01); *C08G 73/026* (2013.01); *C08K 5/01* (2013.01);
(Continued)

(58) Field of Classification Search
CPC .................................................... C08G 73/026
See application file for complete search history.

(56) References Cited

U.S. PATENT DOCUMENTS

| 6,670,645 B2 | 12/2003 | Grushin et al. |
| 7,351,358 B2 | 4/2008 | Hsu et al. |

(Continued)

FOREIGN PATENT DOCUMENTS

| JP | 2012131993 A | 7/2012 |
| JP | 2013-018717 A | 1/2013 |

(Continued)

OTHER PUBLICATIONS

Wang, Y., Kirk-Othmer Encyclopedia of Chemical Technology, Fourth Edition, 1996, vol. 18, pp. 837-860 (Book Not Included).
(Continued)

*Primary Examiner* — Peter F Godenschwager
(74) *Attorney, Agent, or Firm* — Lerner, David, Littenberg, Krumholz & Mentlik, LLP

(57) ABSTRACT

There is provided a compound having Formula I (Continued)

In Formula I: $Ar^1$ and $Ar^2$ are the same or different and are aryl, heteroaryl, or deuterated analogs thereof; $L^1$ and $L^2$ are the same or different and are H, D, halogen, aryl, arylamino, crosslinkable groups, deuterated aryl, deuterated arylamino, or deuterated crosslinkable groups; $R^1$-$R^4$ are the same or different at each occurrence and are D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, or deuterated germyl, wherein adjacent groups selected from $R^1$-$R^4$ can be joined together to form a fused ring; a is 0 or 1; b is 0 or 1; x and x1 are the same or different and are an integer from 0-5; y and y1 are the same or different and are an integer from 0-4; n is an integer greater than 0, with the proviso that when n=1, $L^1$ and $L^2$ are selected from Cl, Br, crosslinkable groups and deuterated crosslinkable groups; and BzF is benzofluorene.

19 Claims, 2 Drawing Sheets

(51) Int. Cl.
  *C08G 61/12* (2006.01)
  *H01L 51/00* (2006.01)
  *C08L 65/00* (2006.01)
  *C08K 5/01* (2006.01)
  *C08G 73/02* (2006.01)

(52) U.S. Cl.
  CPC .............. *C08L 65/00* (2013.01); *C09K 11/06* (2013.01); *H01L 51/0043* (2013.01); *H01L 51/0054* (2013.01); *H01L 51/5064* (2013.01); *C08G 2261/148* (2013.01); *C08G 2261/149* (2013.01); *C08G 2261/1412* (2013.01); *C08G 2261/3142* (2013.01); *C08G 2261/3162* (2013.01); *C08G 2261/5222* (2013.01); *C08G 2261/5242* (2013.01); *C08G 2261/95* (2013.01); *C09K 2211/1007* (2013.01); *C09K 2211/1011* (2013.01); *C09K 2211/1029* (2013.01); *C09K 2211/1416* (2013.01); *C09K 2211/1425* (2013.01); *C09K 2211/1466* (2013.01); *H01L 51/5012* (2013.01)

(56) References Cited

U.S. PATENT DOCUMENTS

| | | |
|---|---|---|
| 2004/0102577 A1 | 5/2004 | Hsu et al. |
| 2004/0127637 A1 | 7/2004 | Hsu et al. |
| 2005/0184287 A1 | 8/2005 | Herron et al. |
| 2005/0205860 A1 | 9/2005 | Hsu et al. |
| 2008/0160348 A1* | 7/2008 | Smith ............... C07C 211/61 428/704 |
| 2013/0082251 A1 | 4/2013 | Park et al. |
| 2016/0254450 A1* | 9/2016 | Herron ............... C09K 11/06 548/440 |

FOREIGN PATENT DOCUMENTS

| | | |
|---|---|---|
| KR | 10-2013-0118811 A | 10/2013 |
| WO | 2003/008424 A1 | 1/2003 |
| WO | 2003/040257 A1 | 5/2003 |
| WO | 2003/063555 A1 | 7/2003 |
| WO | 2003/091688 A2 | 11/2003 |
| WO | 2004/016710 A1 | 2/2004 |
| WO | 2005/052027 A1 | 6/2005 |
| WO | 2007/145979 A3 | 4/2008 |
| WO | 2013/065589 A1 | 5/2013 |
| WO | 2014/069602 A1 | 5/2014 |

OTHER PUBLICATIONS

PCT International Search Report for Application No. PCT/US2016/033051; Oh Se Zu, Authorized Officer; ISA/KR; dated Jul. 8, 2016.
Gustafsson, G. et al. "Flexible light-emitting diodes made from soluble conducting polymers," Letters to Nature, Jun. 11, 1992, vol. 357, pp. 477-479.
CRC Handbook of Chemistry and Physics, 81st Edition (2000-2001) (Book Not Included).

* cited by examiner

ELECTROACTIVE MATERIALS

CLAIM OF BENEFIT OF PRIOR APPLICATION

This application claims the benefit of U.S. Provisional Application No. 62/166,333, filed May 26, 2015, which is incorporated in its entirety herein by reference.

BACKGROUND INFORMATION

Field of the Disclosure

The present disclosure relates to novel electroactive compounds. The disclosure further relates to electronic devices having at least one layer comprising such an electroactive compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a compound having Formula I

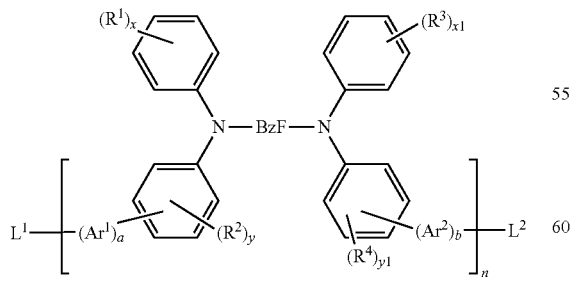

(I)

wherein:
Ar$^1$ and Ar$^2$ are the same or different and are selected from the group consisting of hydrocarbon aryl, heteroaryl, and deuterated analogs thereof;

L$^1$ and L$^2$ are the same or different and are selected from the group consisting of H, D, halogen, aryl, arylamino, crosslinkable groups, deuterated aryl, deuterated arylamino, and deuterated crosslinkable groups;

R$^1$-R$^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from R$^1$-R$^4$ can be joined together to form a fused ring;

a is 0 or 1;
b is 0 or 1;
x and x1 are the same or different and are an integer from 0-5;
y and y1 are the same or different and are an integer from 0-4;
n is an integer greater than 0, with the proviso that when n=1, L$^1$ and L$^2$ are selected from the group consisting of Cl, Br, crosslinkable groups and deuterated crosslinkable groups; and BzF is selected from the group consisting of BzF-1, BzF-2, and BzF-3, having the formulae shown below

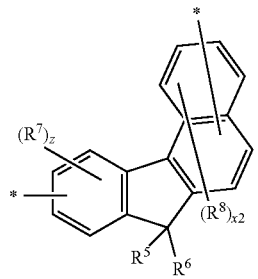

BzF-1

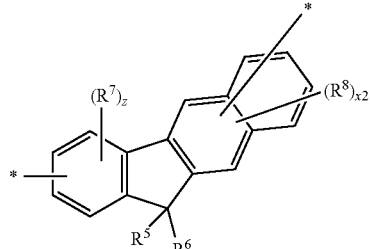

BzF-2

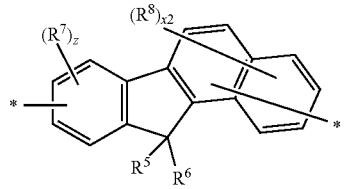

BzF-3 where
R$^5$ and R$^6$ are the same or different at each occurrence and are selected from the group consisting of alkyl, aryl, and deuterated analogs thereof, where two alkyl R$^5$ and R$^6$ groups can be joined together to make a cycloalkyl spiro ring, and where two $R^5$ and $R^6$ phenyl groups can be joined to form a spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

x2 is an integer from 0-5;

z is an integer from 0-3; and

* indicates a point of attachment.

There is also provided a compound having Formula II

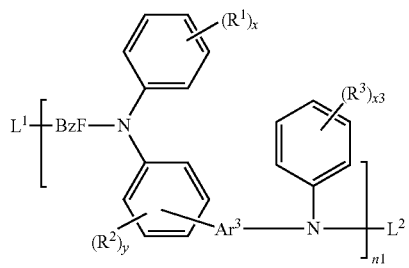

(II)

wherein:
$Ar^3$ is selected from the group consisting of hydrocarbon aryl, heteroaryl, and deuterated analogs thereof;
n1 is an integer greater than 1;
x3 is an integer from 0-5; and
BzF, $L^1$, $L^2$, $R^1$-$R^3$, x, x1, and y, are as defined above for Formula I.

There is also provided a compound having Formula III

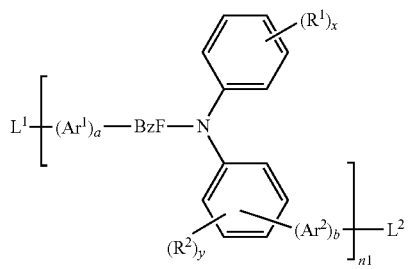

(III)

wherein:
$Ar^1$, $Ar^2$, BzF, $L^1$, $L^2$, $R^1$, $R^2$, a, b, x, and y, are as defined above for Formula I; and
n1 is as defined above for Formula II.

There is also provided a copolymer having Formula IV

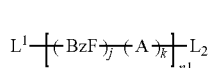

(IV)

wherein:
A is an arylamine monomeric unit;
j and k are non-zero mole fractions, such that j+k=1; and
BzF, $L^1$, $L^2$, and n1 are as defined above.

There is also provided a polymer having at least one monomeric unit having Formula V

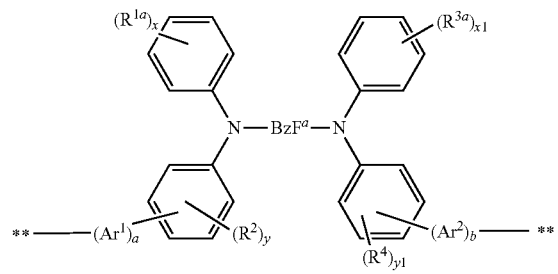

(V)

wherein:
$BzF^a$, $R^{1a}$, and $R^{3a}$ are described in detail below;
$Ar^1$, $Ar^2$, $R^2$, $R^4$, a, b, x, x1, y, and y1, are as defined above for Formula I; and
** indicates a point of attachment in the copolymer.

There is also provided a copolymer having Formula VI

(VI)

wherein:
MU is a monomeric unit having Formula V;
M and MM are different and are monomeric units;
p, q, and r are mole fractions such that p+q+r=1, where p and q are non-zero; and
$L^1$ and $L^2$ are as defined above for Formula I.

There is also provided an electronic device having at least one layer comprising a compound or copolymer having any of the above formulae.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
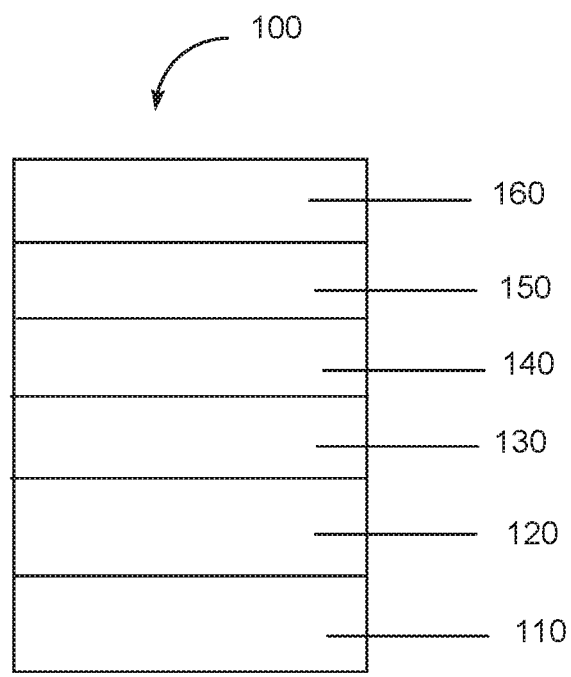
FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a compound having Formula I, as described in detail below.

There is further provided a compound having Formula II, as described in detail below.

There is further provided a compound having Formula III, as described in detail below.

There is further provided a copolymer having Formula IV, as described in detail below.

There is further provided a polymer having at least one monomeric unit having Formula V, as described in detail below.

There is further provided a copolymer having Formula VI, as described in detail below.

There is further provided an electronic device having at least one layer comprising a compound or copolymer having any of the above formulae.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Compound of Formula I, the Compound of Formula II, the Compound of Formula III, the Copolymer of Formula IV, the Polymer Having at Least One Monomeric Unit of Formula V or the Copolymer Having Formula VI, the Electronic Device, and finally Examples.

1. Definitions and Clarification of Terms

Before addressing details of embodiments described below, some terms are defined or clarified.

As used in the "Definitions and Clarification of Terms", R, R' and R" and any other variables are generic designations and may be the same as or different from those defined in the formulas.

As used herein, the term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tert-butyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "aromatic compound" is intended to mean an organic compound comprising at least one unsaturated cyclic group having 4n+2 delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like. The term "hydrocarbon aromatic compound" or "hydrocarbon aryl" refers to an aromatic compound or aryl group having only carbon atoms within the cyclic rings.

The term "aryl" or "aryl group" means a moiety derived from an aromatic compound. A group "derived from" a compound, indicates the radical formed by removal of one or more H or D. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl. anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include heteroaryl groups. Heteroaryl groups may have from 4-50 ring carbon atoms; in some embodiments, 4-30 ring carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxy, siloxane, thioalkoxy, —S(O)$_2$—, —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups. Any of the preceding groups with available hydrogens, may also be deuterated.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), cycloalkenes, and acetylenic groups.

The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The prefix "hetero" indicates that one or more carbon atoms have been replaced with a different atom. In some embodiments, the different atom is N, O, or S.

The term "host material" is intended to mean a material, usually in the form of a layer, to which a dopant may be added. The host material may or may not have electronic characteristic(s) or the ability to emit, receive, or filter radiation.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating or printing. Discontinuous deposition techniques include, but are not limited to, ink jet printing, gravure printing, and screen printing.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The terms "luminescent material", "emissive material" and "emitter" are intended to mean a material that emits light when activated by an applied voltage (such as in a light-emitting diode or light-emitting electrochemical cell). The term "blue luminescent material" is intended to mean a material capable of emitting radiation that has an emission maximum at a wavelength in a range of approximately 445-490 nm.

The term "organic electronic device" or sometimes just "electronic device" is intended to mean a device including one or more organic semiconductor layers or materials.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "siloxane" refers to the group $R_3SiOR_2Si$—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

The term "siloxy" refers to the group $R_3SiO$—, where R is the same or different at each occurrence and is H, D, C1-20 alkyl, deuterated alkyl, fluoroalkyl, aryl, or deuterated aryl.

The term "silyl" refers to the group $R_3Si$—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each $sp^3$ carbon atom is assumed to have enough bonded hydrogen atoms in order to give it a total of four bonds; each $sp^2$ carbon, three bonds; each sp carbon, two bonds. Thus, for example, toluene is depicted as

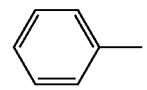

In a structure where a substituent bond passes through one or more rings as shown below,

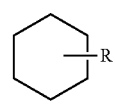 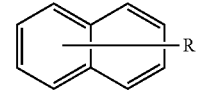

it is meant that the substituent R may be bonded at any available position on the one or more rings.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). Exemplary adjacent R groups are shown below:

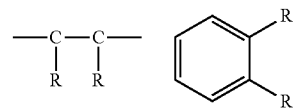

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81st Edition (2000-2001).

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each $sp^3$ carbon atom is assumed to have enough bonded hydrogen atoms in order to give it a total of four bonds; each $sp^2$ carbon, three bonds; each sp carbon, two bonds. The depictions of formulae herein are examples of the use of the line-angle formula convention.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Compounds of Having Formula I

In some embodiments, the compounds having Formula I or Formula I-a are useful as emissive materials. In some embodiments, the compounds are blue emissive materials. They can be used alone or as a dopant in a host material.

In some embodiments, the electroactive compound has Formula I

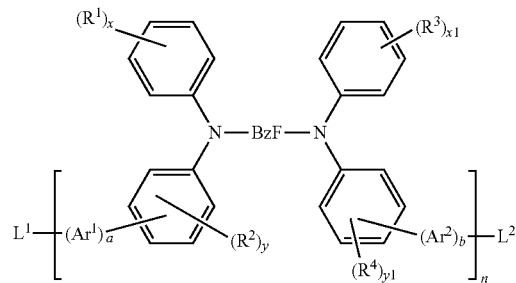

wherein:

$Ar^1$ and $Ar^2$ are the same or different and are selected from the group consisting of hydrocarbon aryl, heteroaryl, and deuterated analogs thereof;

$L^1$ and $L^2$ are the same or different and are selected from the group consisting of H, D, halogen, aryl, arylamino, crosslinkable groups, deuterated aryl, deuterated arylamino, and deuterated crosslinkable groups;

$R^1$-$R^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from $R^1$-$R^4$ can be joined together to form a fused ring; a is 0 or 1;

b is 0 or 1;

x and x1 are the same or different and are an integer from 0-5;

y and y1 are the same or different and are an integer from 0-4;

n is an integer greater than 0, with the proviso that when n=1, $L^1$ and $L^2$ are selected from the group consisting of Cl, Br, crosslinkable groups and deuterated crosslinkable groups; and BzF is selected from the group consisting of BzF-1, BzF-2, and BzF-3, having the formulae shown below

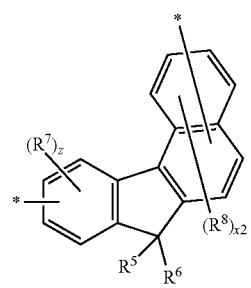

BzF-1

BzF-2

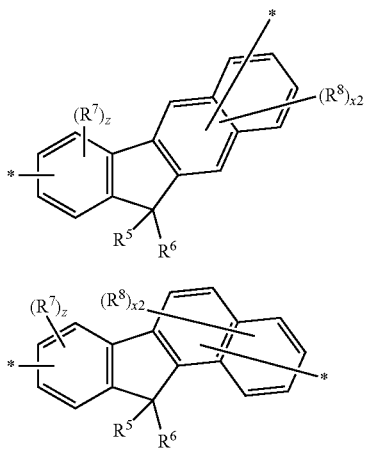

BzF-3 where
- R$^5$ and R$^6$ are the same or different at each occurrence and are selected from the group consisting of alkyl, aryl, and deuterated analogs thereof, where two alkyl R$^5$ and R$^6$ groups can be joined together to make a cycloalkyl spiro ring, and where two R$^5$ and R$^6$ phenyl groups can be joined to form a spiro fluorene group;
- R$^7$ and R$^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R$^7$ and/or R$^8$ groups can be joined together to form a fused ring;
- x2 is an integer from 0-5;
- z is an integer from 0-3; and
- * indicates a point of attachment.

The compound having Formula I can be a small molecule with n=1, an oligomer, or a polymer. As used herein, the term "compound having Formula I" is intended to include small molecules, oligomers and polymers.

In some embodiments of Formula I, n=1 and L$^1$ is Cl or Br. Such compounds can be useful as monomers for the formation of polymeric compounds.

In some embodiments of Formula I, n=1 and L$^1$=Br.

In some embodiments of Formula I, n=1 and L$^2$ is Cl or Br.

In some embodiments of Formula I, n=1 and L$^2$=Br.

In some embodiments of Formula I, n=1 and L$^1$ is a crosslinking group or deuterated crosslinking group.

In some embodiments of Formula I, n=1 and L$^2$ is a crosslinking group or deuterated crosslinking group.

In some embodiments of Formula I, n=2-10.

In some embodiments of Formula I, the compound is a polymer with n≥10. Designating the number of repeat units in a polymer with a variable such as "n" is standard practice in the chemical arts. One of ordinary skill in the art would know that there is no exact upper limit for n. The number of units in a given polymer is determined by the chemistry of the monomer, polymerization reaction conditions, and other known factors.

In some embodiments, the compound is a polymer with $M_n$>20,000; in some embodiments, $M_n$>50,000. In some embodiments, the $M_n$ is in the range of 20,000-2×10$^6$; in some embodiments, 20,000-500,000; in some embodiments, 50,000-300,000.

In some embodiments of Formula I, n≥10 and L$^1$ is selected from aryl, arylamino, crosslinkable groups, and deuterated analogs thereof.

In some embodiments of Formula I, n≥10 and L$^2$ is selected from aryl, arylamino, crosslinkable groups, and deuterated analogs thereof.

In some embodiments of Formula I, n≥10 and L$^1$ is selected from phenyl, biphenyl, diphenylamino, and deuterated analogs thereof.

In some embodiments of Formula I, n≥10 and L$^2$ is selected from phenyl, biphenyl, diphenylamino, and deuterated analogs thereof.

In some embodiments of Formula I, n≥10 and L$^1$ is selected from H, Br, phenyl, or biphenyl.

In some embodiments of Formula I, n≥10 and L$^2$ is selected from H, Br, phenyl, or biphenyl.

In some embodiments, the compound having Formula I is deuterated. In some embodiments, the compound is at least 10% deuterated. By "% deuterated" or "% deuteration" is meant the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, deuteration is present on the core benzofluorene group.

In some embodiments of Formula I, deuteration is present on one or more substituent groups.

In some embodiments of Formula I, deuteration is present on the core benzofluorene group and one or more substituent groups.

In some embodiments of Formula I, BzF has formula BzF-1, shown above. For this core benzofluorene structure, the numbers below indicate the positions on the core.

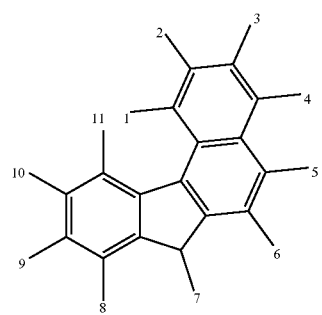

In some embodiments of Formula I, BzF has formula BzF-1 and at least one amino nitrogen is bonded to position 1 on the benzofluorene core.

In some embodiments of Formula I, BzF has formula BzF-1 and at least one amino nitrogen is bonded to position 2 on the benzofluorene core.

In some embodiments of Formula I, BzF has formula BzF-1 and at least one amino nitrogen is bonded to position 3 on the benzofluorene core.

In some embodiments of Formula I, BzF has formula BzF-1 and at least one amino nitrogen is bonded to position 4 on the benzofluorene core.

In some embodiments of Formula I, BzF has formula BzF-1 and at least one amino nitrogen is bonded to position 5 on the benzofluorene core.

In some embodiments of Formula I, BzF has formula BzF-1 and at least one amino nitrogen is bonded to position 6 on the benzofluorene core.

In some embodiments of Formula I, BzF has formula BzF-1 and at least one amino nitrogen is bonded to position 8 on the benzofluorene core.

In some embodiments of Formula I, BzF has formula BzF-1 and at least one amino nitrogen is bonded to position 9 on the benzofluorene core.

In some embodiments of Formula I, BzF has formula BzF-1 and at least one amino nitrogen is bonded to position 10 on the benzofluorene core.

In some embodiments of Formula I, BzF has formula BzF-1 and at least one amino nitrogen is bonded to position 11 on the benzofluorene core.

In some embodiments of Formula I, BzF has formula BzF-2, shown above. For this core benzofluorene structure, the numbers below indicate the positions on the core.

In some embodiments of Formula I, BzF has formula BzF-2 and at least one amino nitrogen is bonded to position 1 on the benzofluorene core.

In some embodiments of Formula I, BzF has formula BzF-2 and at least one amino nitrogen is bonded to position 2 on the benzofluorene core.

In some embodiments of Formula I, BzF has formula BzF-2 and at least one amino nitrogen is bonded to position 3 on the benzofluorene core.

In some embodiments of Formula I, BzF has formula BzF-2 and at least one amino nitrogen is bonded to position 4 on the benzofluorene core.

In some embodiments of Formula I, BzF has formula BzF-2 and at least one amino nitrogen is bonded to position 5 on the benzofluorene core.

In some embodiments of Formula I, BzF has formula BzF-2 and at least one amino nitrogen is bonded to position 6 on the benzofluorene core.

In some embodiments of Formula I, BzF has formula BzF-2 and at least one amino nitrogen is bonded to position 7 on the benzofluorene core.

In some embodiments of Formula I, BzF has formula BzF-2 and at least one amino nitrogen is bonded to position 8 on the benzofluorene core.

In some embodiments of Formula I, BzF has formula BzF-2 and at least one amino nitrogen is bonded to position 9 on the benzofluorene core.

In some embodiments of Formula I, BzF has formula BzF-2 and at least one amino nitrogen is bonded to position 10 on the benzofluorene core.

In some embodiments of Formula I, BzF has formula BzF-3, shown above. For this core benzofluorene structure, the numbers below indicate the positions on the core.

In some embodiments of Formula I, BzF has formula BzF-3 and at least one amino nitrogen is bonded to position 2 on the benzofluorene core.

In some embodiments of Formula I, BzF has formula BzF-3 and at least one amino nitrogen is bonded to position 3 on the benzofluorene core.

In some embodiments of Formula I, BzF has formula BzF-3 and at least one amino nitrogen is bonded to position 4 on the benzofluorene core.

In some embodiments of Formula I, BzF has formula BzF-3 and at least one amino nitrogen is bonded to position 5 on the benzofluorene core.

In some embodiments of Formula I, BzF has formula BzF-3 and at least one amino nitrogen is bonded to position 6 on the benzofluorene core.

In some embodiments of Formula I, BzF has formula BzF-3 and at least one amino nitrogen is bonded to position 7 on the benzofluorene core.

In some embodiments of Formula I, BzF has formula BzF-3 and at least one amino nitrogen is bonded to position 8 on the benzofluorene core.

In some embodiments of Formula I, BzF has formula BzF-3 and at least one amino nitrogen is bonded to position 9 on the benzofluorene core.

In some embodiments of Formula I, BzF has formula BzF-3 and at least one amino nitrogen is bonded to position 10 on the benzofluorene core.

In some embodiments of formula BzF-1, formula BzF-2 or formula BzF-3, $R^5$ is selected from the group consisting of alkyl and deuterated alkyl having 1-12 carbons; in some embodiments, 3-8 carbons; in some embodiments 1-4 carbons.

In some embodiments of formula BzF-1, formula BzF-2 or formula BzF-3, $R^5$ is selected from the group consisting of aryl and deuterated aryl.

In some embodiments of formula BzF-1, formula BzF-2 or formula BzF-3, $R^5$ is selected from the group consisting of phenyl and deuterated phenyl.

In some embodiments of formula BzF-1, formula BzF-2 or formula BzF-3, $R^6$ is selected from the group consisting of alkyl and deuterated alkyl having 1-12 carbons; in some embodiments, 3-8 carbons; in some embodiments 1-4 carbons.

In some embodiments of formula BzF-1, formula BzF-2 or formula BzF-3, $R^6$ is selected from the group consisting of aryl and deuterated aryl.

In some embodiments of formula BzF-1, formula BzF-2 or formula BzF-3, $R^6$ is selected from the group consisting of phenyl and deuterated phenyl.

In some embodiments of formula BzF-1, formula BzF-2 or formula BzF-3, $R^5$ and $R^6$ groups are joined together to form a 5- or 6-membered aliphatic ring.

In some embodiments of formula BzF-1, formula BzF-2 or formula BzF-3, $R^5$ and $R^6$ groups are phenyl groups which are joined together to form a spirofluorene group.

In some embodiments of formula BzF-1, formula BzF-2 or formula BzF-3, z=0.

In some embodiments of formula BzF-1, formula BzF-2 or formula BzF-3, z=1.

In some embodiments of Formula I-a, z=2.

In some embodiments of formula BzF-1, formula BzF-2 or formula BzF-3, z=3.

In some embodiments of formula BzF-1, formula BzF-2 or formula BzF-3, z>0 and at least one $R^7$ is D.

In some embodiments of formula BzF-1, formula BzF-2 or formula BzF-3, z>0 and at least one $R^7$ is an alkyl or deuterated alkyl having 1-20 carbons; in some embodiments, 1-12 carbons; in some embodiments, 3-8 carbons.

In some embodiments of formula BzF-1, formula BzF-2 or formula BzF-3, z>0 and at least one $R^7$ is a hydrocarbon aryl group having 6-36 ring carbons. The hydrocarbon aryl group can include one or more single ring groups bonded together, one or more fused rings, or combinations thereof.

In some embodiments of formula BzF-1, formula BzF-2 or formula BzF-3, x2=0.

In some embodiments of formula BzF-1, formula BzF-2 or formula BzF-3, x2=1.

In some embodiments of formula BzF-1, formula BzF-2 or formula BzF-3, x2=2.

In some embodiments of formula BzF-1, formula BzF-2 or formula BzF-3, x2=3.

In some embodiments of formula BzF-1, formula BzF-2 or formula BzF-3, x2=4.

In some embodiments of formula BzF-1, formula BzF-2 or formula BzF-3, x2=5.

In some embodiments of formula BzF-1, formula BzF-2 or formula BzF-3, x2>0 and at least one $R^8$ is D.

In some embodiments of formula BzF-1, formula BzF-2 or formula BzF-3, x2>0 and at least one $R^8$ is an alkyl or deuterated alkyl having 1-20 carbons; in some embodiments, 1-12 carbons; in some embodiments, 3-8 carbons.

In some embodiments of formula BzF-1, formula BzF-2 or formula BzF-3, x2>0 and at least one $R^8$ is a hydrocarbon aryl group having 6-36 ring carbons. The hydrocarbon aryl group can include one or more single ring groups bonded together, one or more fused rings, or combinations thereof.

In some embodiments of Formula I, x=0.
In some embodiments of Formula I, x=1.
In some embodiments of Formula I, x=2.
In some embodiments of Formula I, x=3.
In some embodiments of Formula I, x=4.
In some embodiments of Formula I, x=5.

In some embodiments of Formula I, x>0 and at least one $R^1$ is an alkyl or deuterated alkyl having 1-20 carbons; in some embodiments, 1-12 carbons; in some embodiments, 3-8 carbons.

In some embodiments of Formula I, x>0 and at least one $R^1$ is a hydrocarbon aryl group having 6-36 ring carbons. The hydrocarbon aryl group can include one or more single ring groups bonded together, one or more fused rings, or combinations thereof.

In some embodiments of Formula I, x>0 and at least one $R^1$ has no heteroaromatic groups.

In some embodiments of Formula I, x>0 and at least one $R^1$ is an amino or deuterated amino group.

In some embodiments of Formula I, x>0 and at least one $R^1$ has Formula a

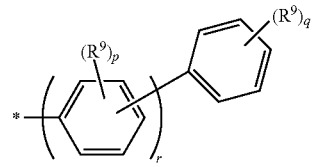

Formula a where:
$R^9$ is the same or different at each occurrence and is selected from the group consisting of D, alkyl, alkoxy, siloxane, silyl, diarylamino, carbazolyl, deuterated alkyl, deuterated alkoxy, deuterated siloxane, deuterated silyl, deuterated diarylamino, and deuterated carbazolyl, where adjacent $R^9$ groups can be joined together to form an fused aromatic ring or a deuterated fused aromatic ring;

p is the same or different at each occurrence and is an integer from 0-4;

q is an integer from 0-5;

r is an integer from 1 to 5; and

* indicates the point of attachment.

In some embodiments of Formula I, x>0 and at least one $R^1$ has Formula b

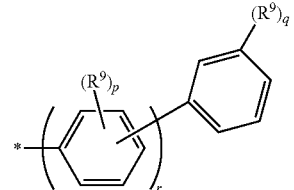

Formula b where $R^9$, p, q, r and * are as in Formula a.

In some embodiments of Formula I, x>0 and at least one $R^1$ is a heteroaryl having at least one ring atom which is selected from the group consisting of N, O, and S.

In some embodiments of Formula I, x>0 and at least one $R^1$ is an N-heteroaryl or deuterated N-heteroaryl having at least one ring atom which is N.

In some embodiments, the N-heteroaryl is selected from the group consisting of pyrrole, pyridine, pyrimidine, carbazole, imidazole, benzimidazole, imidazolobenzimidazole, triazole, benzotriazole, triazolopyridine, indolocarbazole, phenanthroline, quinoline, isoquinoline, quinoxaline, substituted derivatives thereof, and deuterated analogs thereof.

In some embodiments, the N-heteroaryl is a carbazole or deuterated carbazole.

In some embodiments, the N-heteroaryl is a carbazole or deuterated carbazole having formula Cz-1:

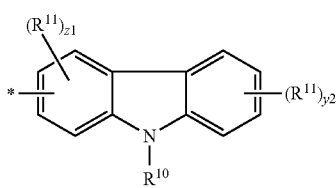Cz-1 wherein:
R[10] is selected from the group consisting of aryl and deuterated aryl;
R[11] is the same or different at each occurrence and is selected from the group consisting of D, alkyl, silyl, aryl, deuterated alkyl, deuterated silyl, and deuterated aryl;
z1 is an integer of 0-3;
y2 is an integer of 0-4; and
* represents the point of attachment.

In some embodiments, the N-heteroaryl is a carbazole or deuterated carbazole having formula Cz-2:

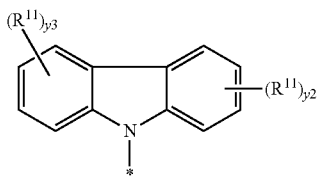Cz-2 where y3 is an integer of 0-4 and R[11], y2, and * are as defined above for Cz-1.

In some embodiments, the N-heteroaryl is a carbazole or deuterated carbazole having formula Cz-3:

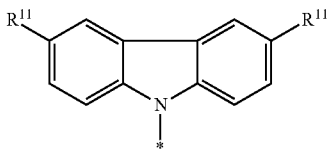Cz-3 where R[11] and * are as defined above for Cz-1.

In some embodiments, the N-heteroaryl is a carbazole or deuterated carbazole having formula Cz-4:

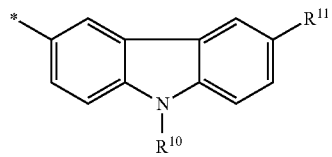Cz-4 where R[10], R[11], and * are as defined above for Cz-1.

In some embodiments, the N-heteroaryl is a carbazole or deuterated carbazole having formula Cz-5:

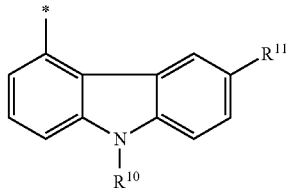Cz-5 where R[10], R[11], and * are as defined above for Cz-1.

In some embodiments of Formula I, x>0 and at least one R[1] is an S-heteroaryl having at least one ring atom which is S.

In some embodiments, the S-heteroaryl is selected form the group consisting of thiophene, benzothiophene, dibenzothiophene, and deuterated analogs thereof.

In some embodiments, the S-heteroaryl is a dibenzothiophene or deuterated dibenzothiophene.

In some embodiments, the S-heteroaryl is a dibenzothiophene or deuterated dibenzothiophene having formula DBT-1

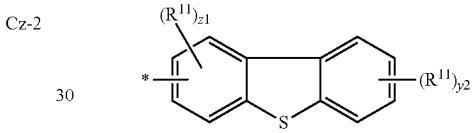DBT-1 where R[11], y2, z1, and * are as defined above for Cz-1.

In some embodiments, the S-heteroaryl is a dibenzothiophene or deuterated dibenzothiophene having formula DBT-2

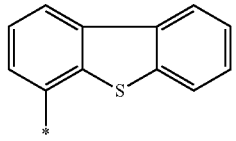DBT-2 wherein * represents the point of attachment.

In some embodiments, the S-heteroaryl is a dibenzothiophene or deuterated dibenzothiophene having formula DBT-3:

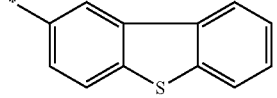DBT-3 wherein * represents the point of attachment.

In some embodiments of Formula I, x>0 and at least one R[1] is an O-heteroaryl having at least one ring atom that is O.

In some embodiments, the O-heteroaryl is selected from the group consisting of furan, benzofuran, dibenzofuran, and deuterated analogs thereof.

In some embodiments, the O-heteroaryl is a dibenzofuran or deuterated dibenzofuran.

In some embodiments, the O-heteroaryl is a dibenzofuran or deuterated dibenzofuran having formula DBF-1:

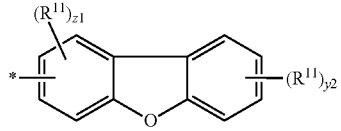

DBF-1 where $R^{11}$, y2, z1, and * are as defined above for Cz-1.

In some embodiments, the O-heteroaryl is a dibenzofuran or deuterated dibenzofuran having formula DBF-2

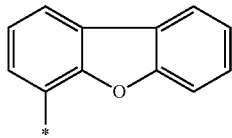

DBF-2 wherein * represents the point of attachment.

In some embodiments, the O-heteroaryl is a dibenzofuran or deuterated dibenzofuran having formula DBF-3:

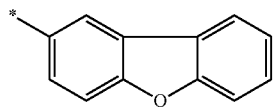

DBF-3 wherein * represents the point of attachment.

In some embodiments of Formula I, x>0 and at least one $R^1$ is an N,O-heteroaryl having at least one ring atom that is N and at least one ring atom that is O.

In some embodiments, the N,O-heteroaryl is selected from the group consisting of oxazole, benzoxazole, and deuterated analogs thereof.

In some embodiments, the N,O-heteroaryl is a benzoxazole or deuterated benzoxazole having formula BzO-1:

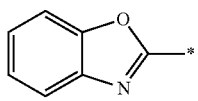

BzO-1 wherein * represents the point of attachment.

In some embodiments of Formula I, x>0 and at least one is an N,S-heteroaryl having at least one ring atom that is N and at least one ring atom that is S.

In some embodiments, the N,S-heteroaryl is selected from the group consisting of thiazole, benzothiazole, and deuterated analogs thereof.

In some embodiments, the N,S-heteroaryl is a benzothiazole or deuterated benzothiazole having formula BT-1:

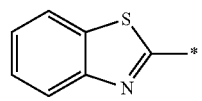

BT-1

In some embodiments of Formula I, x>0 and at least one $R^1$ is selected from the group consisting of phenyl, naphthyl, Formula a, and deuterated analogs thereof.

In some embodiments of Formula I, x>0 and at least one $R^1$ has substituents selected from the group consisting of D, F, CN, alkyl, alkoxy, silyl, siloxy, siloxane, hydrocarbon aryl, heteroaryl, diarylamino, carbazolyl, deuterated alkyl, deuterated alkoxy, deuterated silyl, deuterated siloxy, deuterated siloxane, deuterated hydrocarbon aryl, deuterated heteroaryl, deuterated diarylamino, and deuterated carbazolyl.

In some embodiments of Formula I, x1=0.
In some embodiments of Formula I, x1=1.
In some embodiments of Formula I, x1=2.
In some embodiments of Formula I, x1=3.
In some embodiments of Formula I, x1=4.
In some embodiments of Formula I, x1=5.
In some embodiments of Formula I, x1>0 and at least one $R^3$ is as described above for $R^1$.
In some embodiments of Formula I, y=0.
In some embodiments of Formula I, y=1.
In some embodiments of Formula I, y=2.
In some embodiments of Formula I, y=3.
In some embodiments of Formula I, y=4.
In some embodiments of Formula I, y=5.
In some embodiments of Formula I, y>0 and at least one $R^2$ is as described above for $R^1$.
In some embodiments of Formula I, y1=0.
In some embodiments of Formula I, y1=1.
In some embodiments of Formula I, y1=2.
In some embodiments of Formula I, y1=3.
In some embodiments of Formula I, y1=4.
In some embodiments of Formula I, y1=5.
In some embodiments of Formula I, y1>0 and at least one $R^4$ is as described above for $R^1$.
In some embodiments of Formula I, a=0.
In some embodiments of Formula I, a=1.
In some embodiments of Formula I, $Ar^1$ is a hydrocarbon aryl group or deuterated hydrocarbon aryl group having 6-36 ring carbons. The hydrocarbon aryl group can include one or more single ring groups bonded together, one or more fused rings, or combinations thereof.

In some embodiments of Formula I, $Ar^1$ has Formula c

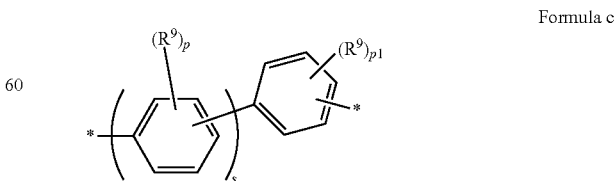

Formula c where p1 is 0-4, s is 0-5, and $R^9$, p and * are as defined above for Formula a.

In some embodiments of Formula I, Ar¹ has Formula d

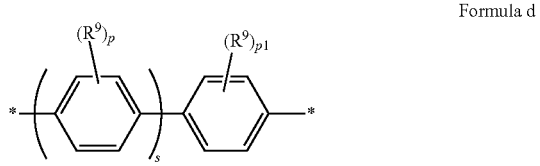

Formula d

Where p, p1, s, $R^9$, and * are as defined above for Formula c.

In some embodiments of Formula I, Ar¹ is selected from the group consisting of phenyl, naphthyl, Formula c, and deuterated analogs thereof.

In some embodiments of Formula I, Ar¹ is selected from the group consisting of 1,4-phenylene, Formula d, and deuterated analogs thereof.

In some embodiments of Formula I, Ar¹ has substituents selected from the group consisting of D, F, CN, alkyl, alkoxy, silyl, siloxy, siloxane, hydrocarbon aryl, heteroaryl, diarylamino, carbazolyl, deuterated alkyl, deuterated alkoxy, deuterated silyl, deuterated siloxy, deuterated siloxane, deuterated hydrocarbon aryl, deuterated heteroaryl, deuterated diarylamino, and deuterated carbazolyl.

In some embodiments of Formula I, b=0.

In some embodiments of Formula I, b=1.

In some embodiments of Formula I, Ar² is as described above for Ar¹.

In some embodiments of Formula I, the compound has Formula I-a deuterated silyl, deuterated siloxane, deuterated siloxy, and deuterated germyl, wherein adjacent groups selected from $R^1$-$R^4$ can be joined together to form a fused ring;

$R^5$ and $R^6$ are the same or different at each occurrence and are selected from the group consisting of alkyl, aryl, and deuterated analogs thereof, where two alkyl $R^5$ and $R^6$ groups can be joined together to make a cycloalkyl spiro ring, and where two $R^5$ and $R^6$ substituted phenyl groups can be joined to form a substituted spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

a is 0 or 1;

b is 0 or 1;

x, x1, and x2 are the same or different and are an integer from 0-5;

y and y1 are the same or different and are an integer from 0-4;

z is an integer from 0-3; and

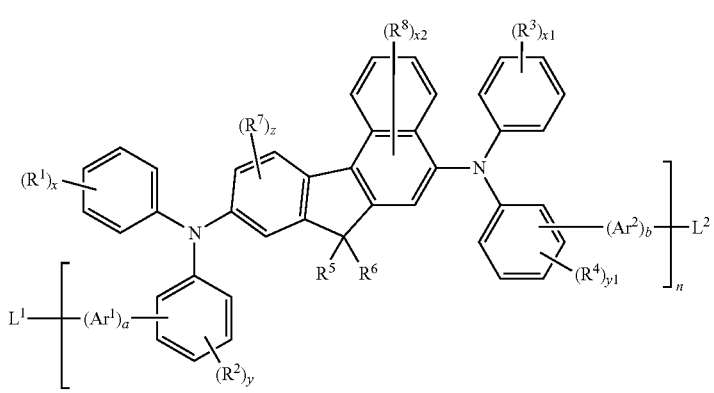

(I-a)

wherein:
Ar¹ and Ar² are the same or different and are selected from the group consisting of hydrocarbon aryl, heteroaryl, and deuterated analogs thereof;

$L^1$ and $L^2$ are the same or different and are selected from the group consisting of H, D, halogen, aryl, arylamino, crosslinkable groups, deuterated aryl, deuterated arylamino, and deuterated crosslinkable groups;

$R^1$-$R^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, n is an integer greater than 0, with the proviso that when n=1, $L^1$ and $L^2$ are selected from the group consisting of Cl, Br, crosslinkable groups and deuterated crosslinkable groups.

All of the embodiments of $R^5$-$R^8$, x2 and z described above for formula BzF-1 apply equally to Formula I-a.

All of the embodiments of Ar¹, Ar², $L^1$, $L^2$, $R^1$-$R^4$, a, b, n, x, x1, y and y1 described above for Formula I apply equally to Formula I-a.

Any of the above embodiments of Formula I can be combined with one or more of the other embodiments, so long as they are not mutually exclusive. For example, the embodiment in which a=1, BzF=BzF-2 and an amino nitrogen is bonded to position 3 on the benzofluorene core can be combined with the embodiment where Ar¹ is phenyl. The same is true for the other non-mutually-exclusive embodiments discussed above. The skilled person would understand which embodiments were mutually exclusive and would thus readily be able to determine the combinations of embodiments that are contemplated by the present application.

Any of the above embodiments of Formula I-a can be likewise combined with one or more of the other embodiments, so long as they are not mutually exclusive.

The compounds of Formula I or Formula I-a can be made using any technique that will yield a C—C or C—N bond and known polymerization techniques. A variety of such techniques are known, such as Suzuki, Yamamoto, Stille, and metal-catalyzed C—N couplings as well as metal catalyzed and oxidative direct arylation.

Deuterated compounds can be prepared in a similar manner using deuterated precursor materials or, more generally, by treating the non-deuterated compound with deuterated solvent, such as benzene-d6, in the presence of a Lewis acid H/D exchange catalyst, such as trifluoromethanesulfonic acid, aluminum trichloride or ethyl aluminum dichloride.

Exemplary preparations are given in the Examples.

Some non-limiting examples of compounds having Formula I are shown below. In the compounds below, the asterisk can be H, Br, phenyl, or biphenyl, or can indicate attachment to the polymer. The polymers have at least ten repeating units.

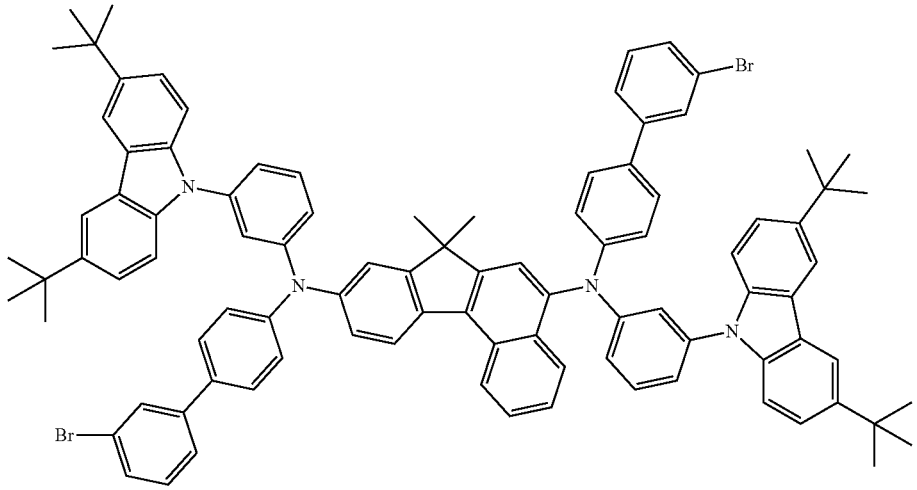

Monomer 3

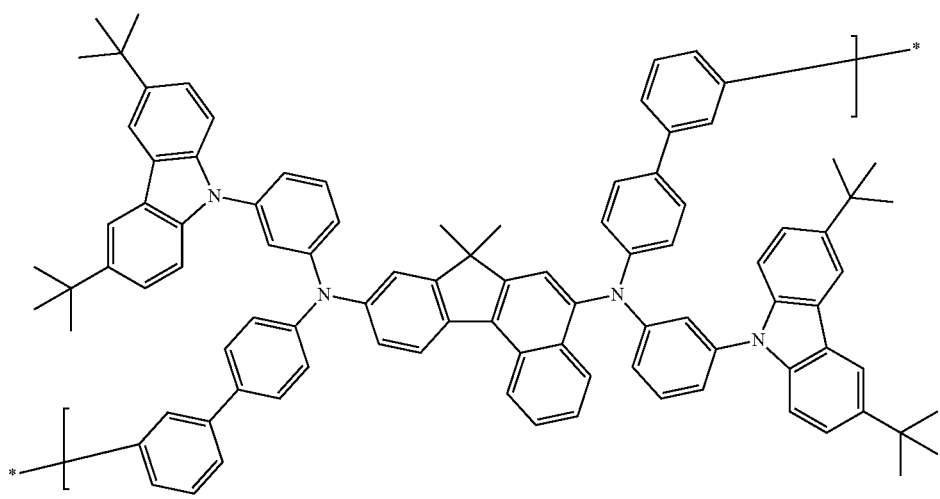

Oligomer/Polymer 4

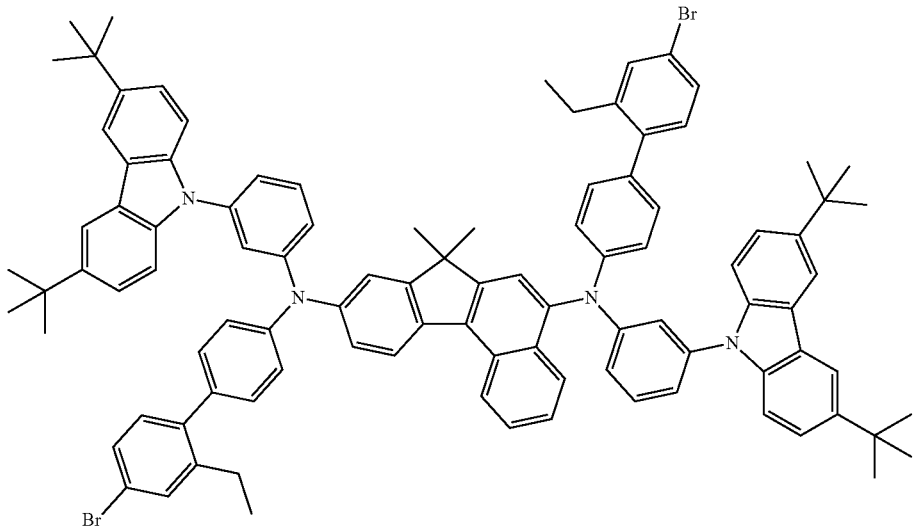

Monomer 5

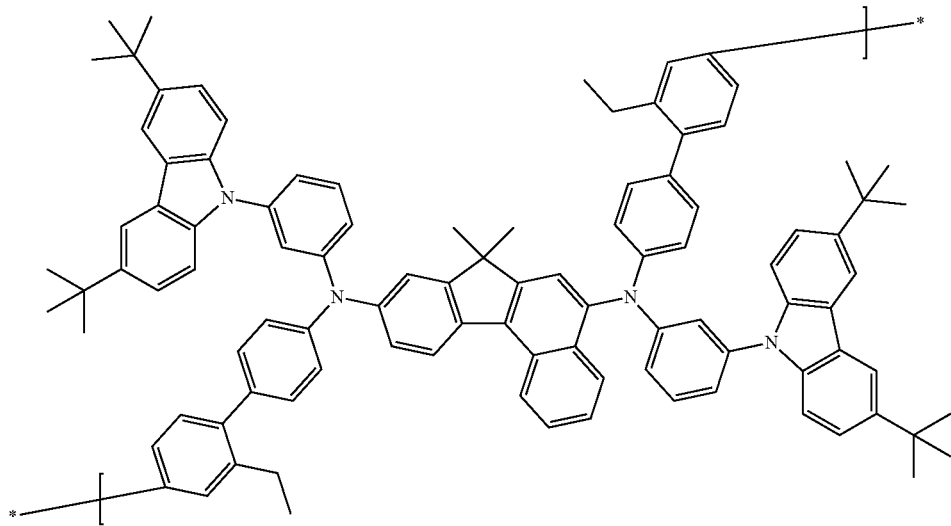

Polymer 6

The compounds can be formed into layers for electronic devices. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous liquid deposition techniques, include but are not limited to, spin coating, gravure coating, curtain coating, dip coating, slot-die coating, spray coating, and continuous nozzle coating. Discontinuous liquid deposition techniques include, but are not limited to, ink jet printing, gravure printing, and screen printing.

In some embodiments, the new compounds having Formula I are electroluminescent and can be used as emissive materials in devices.

In some embodiments, the new compounds having Formula I can be used as hosts for electroluminescent materials.

3. Compound Having Formula II

In some embodiments, the electroactive compound has Formula II

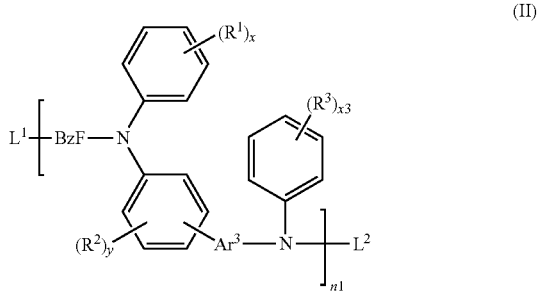

wherein:

Ar$^3$ is selected from the group consisting of hydrocarbon aryl, heteroaryl, and deuterated analogs thereof;

$L^1$ and $L^2$ are the same or different and are selected from the group consisting of H, D, halogen, aryl, arylamino, crosslinkable groups, deuterated aryl, deuterated arylamino, and deuterated crosslinkable groups;

$R^1$-$R^3$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from $R^1$-$R^4$ can be joined together to form a fused ring;

x, x1, and x3 are the same or different and are an integer from 0-5;

y is an integer from 0-4;

n1 is an integer greater than 1; and

BzF is selected from the group consisting of BzF-1, BzF-2, and BzF-3, having the formulae shown below

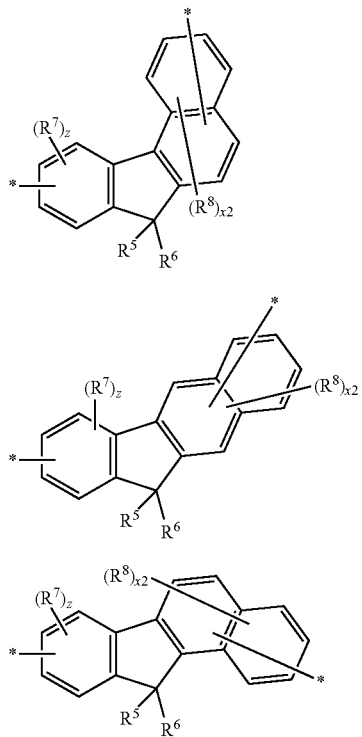

BzF-1

BzF-2

BzF-3 where $R^5$ and $R^6$ are the same or different at each occurrence and are selected from the group consisting of alkyl, aryl, and deuterated analogs thereof, where two alkyl $R^5$ and $R^6$ groups can be joined together to make a cycloalkyl spiro ring, and where two $R^5$ and $R^6$ substituted phenyl groups can be joined to form a substituted spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

x2 is an integer from 0-5;

z is an integer from 0-3; and

* indicates a point of attachment.

The compound having Formula II can be a small molecule with n1=2, an oligomer, or a polymer. As used herein, the term "compound having Formula II" is intended to include small molecules, oligomers and polymers.

In some embodiments of Formula II, $L^1$ is Cl or Br.

In some embodiments of Formula II, $L^1$=Br.

In some embodiments of Formula II, $L^2$ is Cl or Br.

In some embodiments of Formula II, $L^2$=Br.

In some embodiments of Formula II, $L^1$ is a crosslinking group or deuterated crosslinking group.

In some embodiments of Formula II, $L^2$ is a crosslinking group or deuterated crosslinking group.

In some embodiments of Formula II, n1=3-10.

In some embodiments of Formula II, the compound is a polymer with n1≥10. In some embodiments, the compound is a polymer with $M_n$>20,000; in some embodiments, $M_n$>50,000.

In some embodiments of Formula II, n1≥10 and $L^1$ is selected from aryl, arylamino, crosslinkable groups, and deuterated analogs thereof.

In some embodiments of Formula II, n1≥10 and $L^2$ is selected from aryl, arylamino, crosslinkable groups, and deuterated analogs thereof.

In some embodiments of Formula II, n1≥10 and $L^1$ is selected from phenyl, biphenyl, diphenylamino, and deuterated analogs thereof.

In some embodiments of Formula II, n1≥10 and $L^2$ is selected from phenyl, biphenyl, diphenylamino, and deuterated analogs thereof.

In some embodiments, the compound having Formula II is deuterated. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula II, BzF has formula BzF-1, shown above. For this core benzofluorene structure, the numbers indicating the positions on the core are shown above.

In some embodiments of Formula II, BzF has formula BzF-1 and at least one amino nitrogen is bonded to position 1 on the benzofluorene core.

In some embodiments of Formula II, BzF has formula BzF-1 and at least one amino nitrogen is bonded to position 2 on the benzofluorene core.

In some embodiments of Formula II, BzF has formula BzF-1 and at least one amino nitrogen is bonded to position 3 on the benzofluorene core.

In some embodiments of Formula II, BzF has formula BzF-1 and at least one amino nitrogen is bonded to position 4 on the benzofluorene core.

In some embodiments of Formula II, BzF has formula BzF-1 and at least one amino nitrogen is bonded to position 5 on the benzofluorene core.

In some embodiments of Formula II, BzF has formula BzF-1 and at least one amino nitrogen is bonded to position 6 on the benzofluorene core.

In some embodiments of Formula II, BzF has formula BzF-1 and at least one amino nitrogen is bonded to position 8 on the benzofluorene core.

In some embodiments of Formula II, BzF has formula BzF-1 and at least one amino nitrogen is bonded to position 9 on the benzofluorene core.

In some embodiments of Formula II, BzF has formula BzF-1 and at least one amino nitrogen is bonded to position 10 on the benzofluorene core.

In some embodiments of Formula II, BzF has formula BzF-1 and at least one amino nitrogen is bonded to position 11 on the benzofluorene core.

In some embodiments of Formula II, BzF has formula BzF-2, shown above. For this core benzofluorene structure, the numbers indicating the positions on the core are shown above.

In some embodiments of Formula II, BzF has formula BzF-2 and at least one amino nitrogen is bonded to position 1 on the benzofluorene core.

In some embodiments of Formula II, BzF has formula BzF-2 and at least one amino nitrogen is bonded to position 2 on the benzofluorene core.

In some embodiments of Formula II, BzF has formula BzF-2 and at least one amino nitrogen is bonded to position 3 on the benzofluorene core.

In some embodiments of Formula II, BzF has formula BzF-2 and at least one amino nitrogen is bonded to position 4 on the benzofluorene core.

In some embodiments of Formula II, BzF has formula BzF-2 and at least one amino nitrogen is bonded to position 5 on the benzofluorene core.

In some embodiments of Formula II, BzF has formula BzF-2 and at least one amino nitrogen is bonded to position 6 on the benzofluorene core.

In some embodiments of Formula II, BzF has formula BzF-2 and at least one amino nitrogen is bonded to position 7 on the benzofluorene core.

In some embodiments of Formula II, BzF has formula BzF-2 and at least one amino nitrogen is bonded to position 8 on the benzofluorene core.

In some embodiments of Formula II, BzF has formula BzF-2 and at least one amino nitrogen is bonded to position 9 on the benzofluorene core.

In some embodiments of Formula II, BzF has formula BzF-2 and at least one amino nitrogen is bonded to position 10 on the benzofluorene core.

In some embodiments of Formula II, BzF has formula BzF-3, shown above. For this core benzofluorene structure, the numbers indicating the positions on the core are shown above.

In some embodiments of Formula II, BzF has formula BzF-3 and at least one amino nitrogen is bonded to position 1 on the benzofluorene core.

In some embodiments of Formula II, BzF has formula BzF-3 and at least one amino nitrogen is bonded to position 2 on the benzofluorene core.

In some embodiments of Formula II, BzF has formula BzF-3 and at least one amino nitrogen is bonded to position 3 on the benzofluorene core.

In some embodiments of Formula II, BzF has formula BzF-3 and at least one amino nitrogen is bonded to position 4 on the benzofluorene core.

In some embodiments of Formula II, BzF has formula BzF-3 and at least one amino nitrogen is bonded to position 5 on the benzofluorene core.

In some embodiments of Formula II, BzF has formula BzF-3 and at least one amino nitrogen is bonded to position 6 on the benzofluorene core.

In some embodiments of Formula II, BzF has formula BzF-3 and at least one amino nitrogen is bonded to position 7 on the benzofluorene core.

In some embodiments of Formula II, BzF has formula BzF-3 and at least one amino nitrogen is bonded to position 8 on the benzofluorene core.

In some embodiments of Formula II, BzF has formula BzF-3 and at least one amino nitrogen is bonded to position 9 on the benzofluorene core.

In some embodiments of Formula II, BzF has formula BzF-3 and at least one amino nitrogen is bonded to position 10 on the benzofluorene core.

The different embodiments for $Ar^1$ in Formula I apply equally to $Ar^3$ in Formula II.

The different embodiments for BzF, $L^1$, $L^2$, $R^1$-$R^3$, x, and y discussed above for Formula I apply equally to Formula II.

The different embodiments for $R^5$, $R^6$, $R^7$, $R^8$, x2 and z discussed above for BzF-1, BzF-2, and BzF-3 in Formula I apply equally to Formula II.

The different embodiments for x1 discussed above for Formula I apply equally to x3 in Formula II.

In some embodiments of Formula II, the compound has Formula II-a

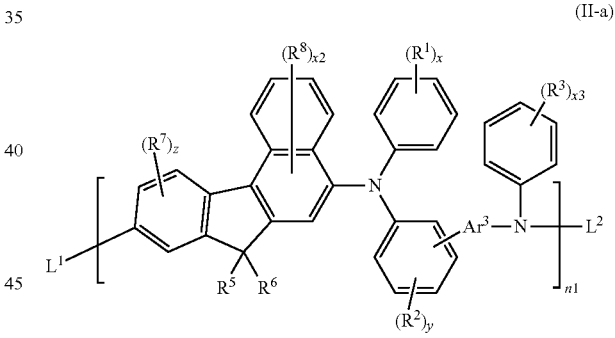

(II-a)

wherein:
  $Ar^3$ is selected from the group consisting of hydrocarbon aryl, heteroaryl, and deuterated analogs thereof;
  $L^1$ and $L^2$ are the same or different and are selected from the group consisting of H, D, halogen, aryl, arylamino, crosslinkable groups, deuterated aryl, deuterated arylamino, and deuterated crosslinkable groups;
  $R^1$-$R^3$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from $R^1$-$R^4$ can be joined together to form a fused ring;

R⁵ and R⁶ are the same or different at each occurrence and are selected from the group consisting of alkyl, aryl, and deuterated analogs thereof, where two alkyl R⁵ and R⁶ groups can be joined together to make a cycloalkyl spiro ring, and where two R⁵ and R⁶ substituted phenyl groups can be joined to form a substituted spiro fluorene group;

R⁷ and R⁸ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R⁷ and/or R⁸ groups can be joined together to form a fused ring;

x, x2, and x3 are the same or different and are an integer from 0-5;

y is an integer from 0-4;

z in an integer from 0-3; and n1 is an integer greater than 1.

All of the embodiments of R⁵-R⁸, x2 and z described above for formula BzF-1 apply equally to Formula II-a.

All of the embodiments of Ar³, L¹, L², R¹-R³, n1, x, x2, x3, y and z described above for Formula II apply equally to Formula II-a.

Any of the above embodiments of Formula II can be combined with one or more of the other embodiments, so long as they are not mutually exclusive.

Any of the above embodiments of Formula II-a can be likewise combined with one or more of the other embodiments, so long as they are not mutually exclusive.

The compounds of Formula II or Formula II-a can be made using any technique that will yield a C—C or C—N bond and known polymerization techniques. A variety of such techniques are known, such as Suzuki, Yamamoto, Stille, and metal-catalyzed coupling as well as metal-catalyzed and oxidative direct arylation.

Deuterated compounds can be prepared in a similar manner using deuterated precursor materials or, more generally, by treating the non-deuterated compound with deuterated solvent, such as d6-benzene, in the presence of a Lewis acid H/D exchange catalyst, such as trifluoromethanesulfonic acid, aluminum trichloride or ethyl aluminum dichloride.

Exemplary preparations are given in the Examples.

Some non-limiting examples of compounds having Formula II or Formula II-a are shown below. In all of the compounds below, the asterisk can be H, Br, phenyl, or biphenyl, or can indicate attachment to the polymer. The polymers have at least ten repeating units.

Polymer 21

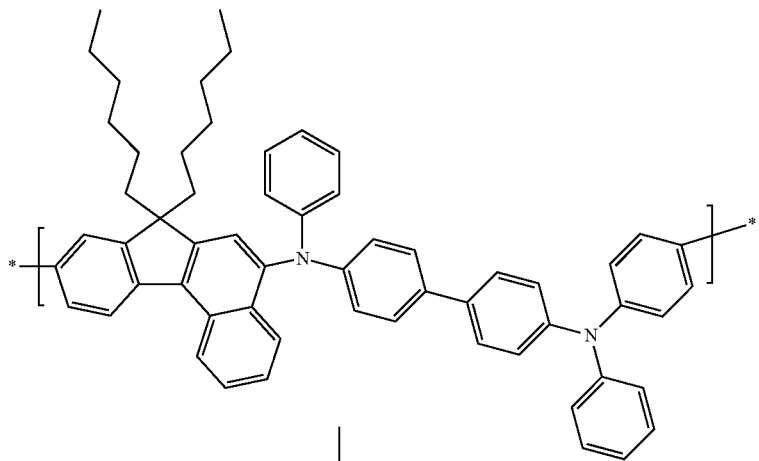

Polymer 22

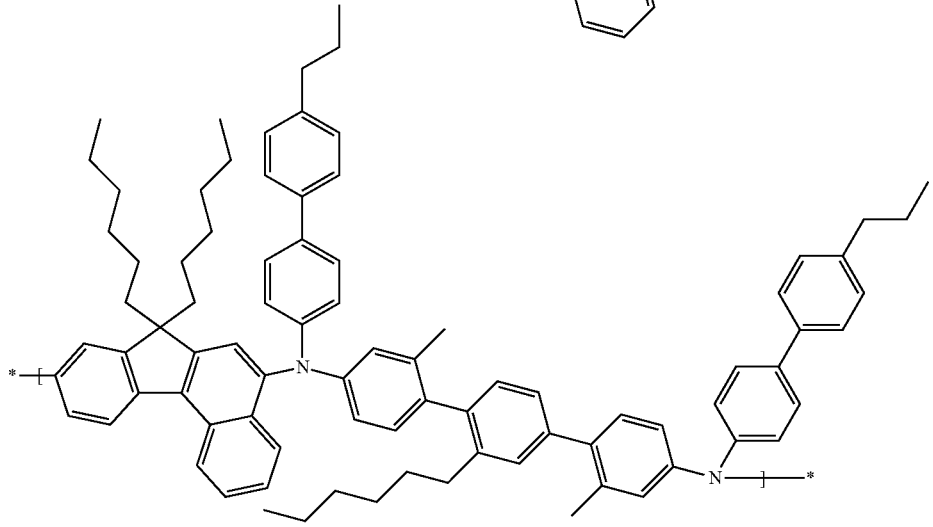

4. Compound Having Formula III

In some embodiments, the electroactive compound has Formula III

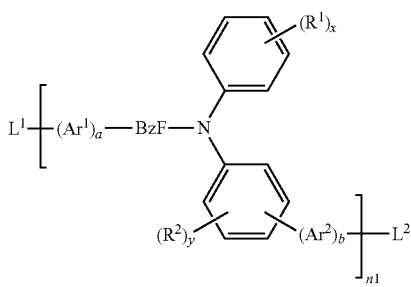

(III)

wherein:

Ar$^1$ and Ar$^2$ are the same or different and are selected from the group consisting of hydrocarbon aryl, heteroaryl, and deuterated analogs thereof;

L$^1$ and L$^2$ are the same or different and are selected from the group consisting of H, D, halogen, aryl, arylamino, crosslinkable groups, deuterated aryl, deuterated arylamino, and deuterated crosslinkable groups;

R$^1$-R$^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from R$^1$-R$^4$ can be joined together to form a fused ring;

a is 0 or 1;

b is 0 or 1;

x is an integer from 0-5;

y is an integer from 0-4;

n1 is an integer greater than 1; and

BzF is selected from the group consisting of BzF-1, BzF-2, and BzF-3, having the formulae shown below

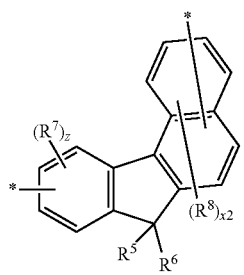

BzF-1

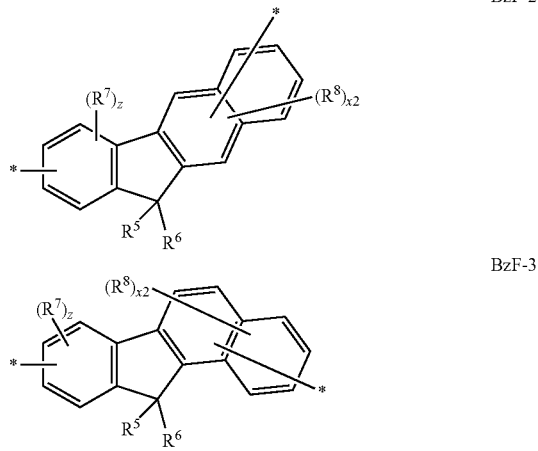

where

R$^5$ and R$^6$ are the same or different at each occurrence and are selected from the group consisting of alkyl, aryl, and deuterated analogs thereof, where two alkyl R$^5$ and R$^6$ groups can be joined together to make a cycloalkyl spiro ring, and where two R$^5$ and R$^6$ phenyl groups can be joined to form a spiro fluorene group;

R$^7$ and R$^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R$^7$ and/or R$^8$ groups can be joined together to form a fused ring;

x2 is an integer from 0-5;

z is an integer from 0-3; and

* indicates a point of attachment.

The compound having Formula III can be a small molecule with n1=2, an oligomer, or a polymer. As used herein, the term "compound having Formula III" is intended to include small molecules, oligomers and polymers.

In some embodiments of Formula III, L$^1$ is Cl or Br.

In some embodiments of Formula III, L$^1$=Br.

In some embodiments of Formula III, L$^2$ is Cl or Br.

In some embodiments of Formula III, L$^2$=Br.

In some embodiments of Formula III, L$^1$ is a crosslinking group or deuterated crosslinking group.

In some embodiments of Formula III, L$^2$ is a crosslinking group or deuterated crosslinking group.

In some embodiments of Formula III, n1=3-10.

In some embodiments of Formula III, the compound is a polymer with n1≥10. In some embodiments, the compound is a polymer with $M_n$>20,000; in some embodiments, $M_{n1}$>50,000.

In some embodiments of Formula III, n1≥10 and L$^1$ is selected from aryl, arylamino, crosslinkable groups, and deuterated analogs thereof.

In some embodiments of Formula III, n1≥10 and L$^2$ is selected from aryl, arylamino, crosslinkable groups, and deuterated analogs thereof.

In some embodiments of Formula III, n1≥10 and $L^1$ is selected from phenyl, biphenyl, diphenylamino, and deuterated analogs thereof.

In some embodiments of Formula III, n1≥10 and $L^2$ is selected from phenyl, biphenyl, diphenylamino, and deuterated analogs thereof.

In some embodiments, the compound having Formula III is deuterated. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula III, BzF has formula BzF-1, shown above. For this core benzofluorene structure, the numbers indicating the positions on the core are shown above.

In some embodiments of Formula III, BzF has formula BzF-1 and at least one amino nitrogen is bonded to position 1 on the benzofluorene core.

In some embodiments of Formula III, BzF has formula BzF-1 and at least one amino nitrogen is bonded to position 2 on the benzofluorene core.

In some embodiments of Formula III, BzF has formula BzF-1 and at least one amino nitrogen is bonded to position 3 on the benzofluorene core.

In some embodiments of Formula III, BzF has formula BzF-1 and at least one amino nitrogen is bonded to position 4 on the benzofluorene core.

In some embodiments of Formula III, BzF has formula BzF-1 and at least one amino nitrogen is bonded to position 5 on the benzofluorene core.

In some embodiments of Formula III, BzF has formula BzF-1 and at least one amino nitrogen is bonded to position 6 on the benzofluorene core.

In some embodiments of Formula III, BzF has formula BzF-1 and at least one amino nitrogen is bonded to position 8 on the benzofluorene core.

In some embodiments of Formula III, BzF has formula BzF-1 and at least one amino nitrogen is bonded to position 9 on the benzofluorene core.

In some embodiments of Formula III, BzF has formula BzF-1 and at least one amino nitrogen is bonded to position 10 on the benzofluorene core.

In some embodiments of Formula III, BzF has formula BzF-1 and at least one amino nitrogen is bonded to position 11 on the benzofluorene core.

In some embodiments of Formula III, BzF has formula BzF-2, shown above. For this core benzofluorene structure, the numbers indicating the positions on the core are shown above.

In some embodiments of Formula III, BzF has formula BzF-2 and at least one amino nitrogen is bonded to position 1 on the benzofluorene core.

In some embodiments of Formula III, BzF has formula BzF-2 and at least one amino nitrogen is bonded to position 2 on the benzofluorene core.

In some embodiments of Formula III, BzF has formula BzF-2 and at least one amino nitrogen is bonded to position 3 on the benzofluorene core.

In some embodiments of Formula III, BzF has formula BzF-2 and at least one amino nitrogen is bonded to position 4 on the benzofluorene core.

In some embodiments of Formula III, BzF has formula BzF-2 and at least one amino nitrogen is bonded to position 5 on the benzofluorene core.

In some embodiments of Formula III, BzF has formula BzF-2 and at least one amino nitrogen is bonded to position 6 on the benzofluorene core.

In some embodiments of Formula III, BzF has formula BzF-2 and at least one amino nitrogen is bonded to position 7 on the benzofluorene core.

In some embodiments of Formula III, BzF has formula BzF-2 and at least one amino nitrogen is bonded to position 8 on the benzofluorene core.

In some embodiments of Formula III, BzF has formula BzF-2 and at least one amino nitrogen is bonded to position 9 on the benzofluorene core.

In some embodiments of Formula III, BzF has formula BzF-2 and at least one amino nitrogen is bonded to position 10 on the benzofluorene core.

In some embodiments of Formula III, BzF has formula BzF-3, shown above. For this core benzofluorene structure, the numbers indicating the positions on the core are shown above.

In some embodiments of Formula III, BzF has formula BzF-3 and at least one amino nitrogen is bonded to position 1 on the benzofluorene core.

In some embodiments of Formula III, BzF has formula BzF-3 and at least one amino nitrogen is bonded to position 2 on the benzofluorene core.

In some embodiments of Formula III, BzF has formula BzF-3 and at least one amino nitrogen is bonded to position 3 on the benzofluorene core.

In some embodiments of Formula III, BzF has formula BzF-3 and at least one amino nitrogen is bonded to position 4 on the benzofluorene core.

In some embodiments of Formula III, BzF has formula BzF-3 and at least one amino nitrogen is bonded to position 5 on the benzofluorene core.

In some embodiments of Formula III, BzF has formula BzF-3 and at least one amino nitrogen is bonded to position 6 on the benzofluorene core.

In some embodiments of Formula III, BzF has formula BzF-3 and at least one amino nitrogen is bonded to position 7 on the benzofluorene core.

In some embodiments of Formula III, BzF has formula BzF-3 and at least one amino nitrogen is bonded to position 8 on the benzofluorene core.

In some embodiments of Formula III, BzF has formula BzF-3 and at least one amino nitrogen is bonded to position 9 on the benzofluorene core.

In some embodiments of Formula III, BzF has formula BzF-3 and at least one amino nitrogen is bonded to position 10 on the benzofluorene core.

Any of the embodiments described above for $Ar^1$, $Ar^2$, BzF, $L^1$, $L^2$, $R^1$, $R^2$, a, b, x, and y, in Formula I apply equally to Formula III.

In some embodiments of Formula III, the compound has Formula III-a

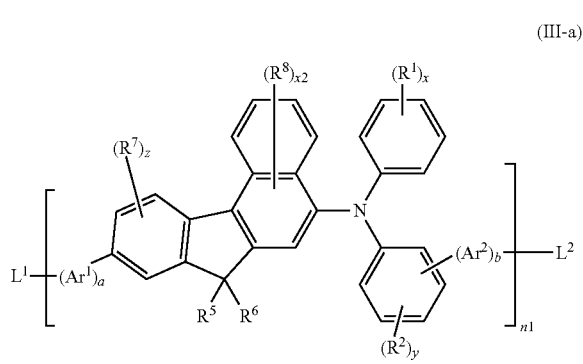

(III-a)

wherein:
- Ar¹ and Ar² are the same or different and are selected from the group consisting of hydrocarbon aryl, heteroaryl, and deuterated analogs thereof;
- L¹ and L² are the same or different and are selected from the group consisting of H, D, halogen, aryl, arylamino, crosslinkable groups, deuterated aryl, deuterated arylamino, and deuterated crosslinkable groups;
- R¹-R² are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, and deuterated siloxy, wherein adjacent groups selected from R¹-R⁴ can be joined together to form a fused ring;
- R⁵ and R⁶ are the same or different at each occurrence and are selected from the group consisting of alkyl, aryl, and deuterated analogs thereof, where two alkyl R⁵ and R⁶ groups can be joined together to make a cycloalkyl spiro ring, and where two R⁵ and R⁶ phenyl groups can be joined to form a spiro fluorene group;
- R⁷ and R⁸ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R⁷ and/or R⁸ groups can be joined together to form a fused ring;
- a is 0 or 1;
- b is 0 or 1;
- x and x2 are the same or different and are an integer from 0-5;
- y is an integer from 0-4;
- z is an integer from 0-3; and
- n1 is an integer greater than 1.

Any of the embodiments described above for Ar¹, Ar², L¹, L², R¹, R², a, b, x, and y, in Formula I apply equally to Formula III-a.

Any of the embodiments described above for R⁵-R⁸, x2, and z in Formula I-a apply equally to Formula III-a.

Any of the embodiments described above for n1 is in Formula III apply equally to Formula III-a.

Any of the above embodiments of Formula III can be combined with one or more of the other embodiments, so long as they are not mutually exclusive.

Any of the above embodiments of Formula III-a can be likewise combined with one or more of the other embodiments, so long as they are not mutually exclusive.

The compounds of Formula III or Formula III-a can be made using any technique that will yield a C—C or C—N bond and known polymerization techniques. A variety of such techniques are known, such as Suzuki, Yamamoto, Stille, and metal-catalyzed couplings as well as metal-catalyzed and oxidative direct arylation. Synthetic methods similar to those used in the preparation of compounds of Formula I above may be used to produce compounds of Formula III and Formula III-a.

Deuterated compounds can be prepared in a similar manner using deuterated precursor materials or, more generally, by treating the non-deuterated compound with deuterated solvent, such as d6-benzene, in the presence of a Lewis acid H/D exchange catalyst, such as trifluoromethanesulfonic acid, aluminum trichloride or ethyl aluminum dichloride.

Exemplary preparations are given in the Examples.

Some non-limiting examples of compounds having Formula III are shown below. In all of the compounds below, the asterisk can be H, Br, phenyl, or biphenyl, or can indicate attachment to the polymer. The polymers have at least ten repeating units.

Polymer 23

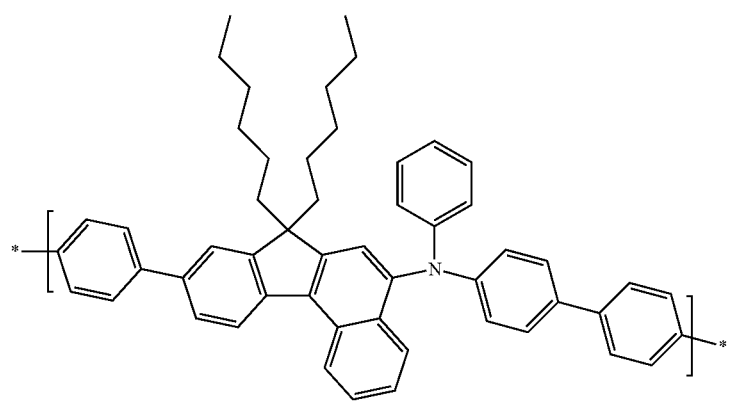

Polymer 24

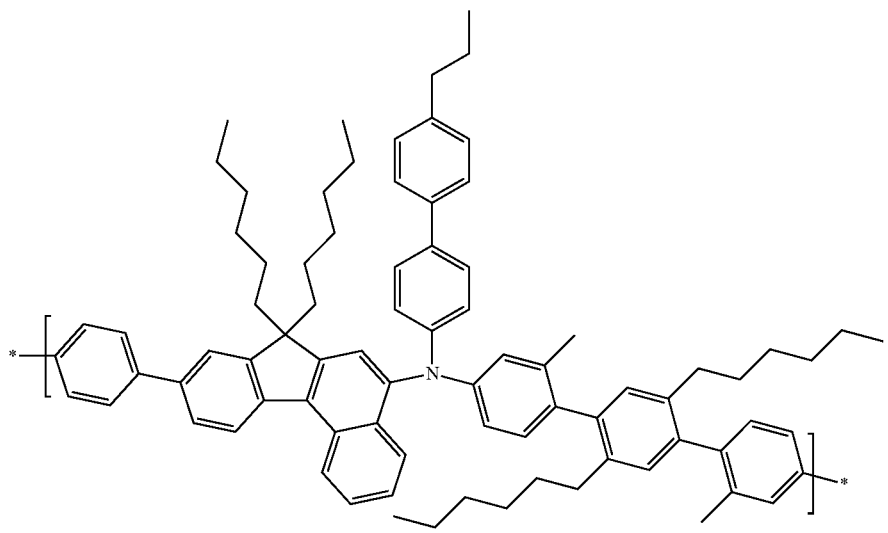

5. Copolymer Having Formula IV

In some embodiments, the electroactive compound is a copolymer having Formula IV

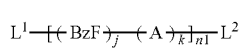  (IV)

wherein:
A is an arylamine monomeric unit;
$L^1$ and $L^2$ are the same or different and are selected from the group consisting of H, D, halogen, aryl, arylamino, crosslinkable groups, deuterated aryl, deuterated arylamino, and deuterated crosslinkable groups;
j and k are non-zero mole fractions, such that j+k=1;
n1 is an integer greater than 1; and
BzF is selected from the group consisting of BzF-1, BzF-2, and
BzF-3, having the formulae shown below BzF-1

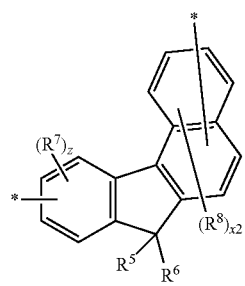

BzF-2

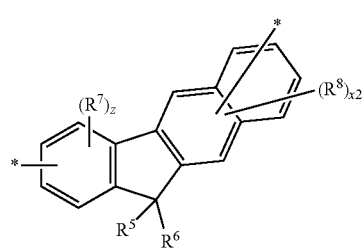

BzF-3

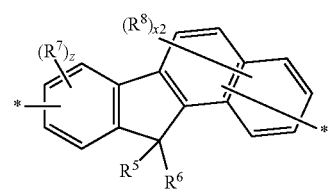

where
$R^5$ and $R^6$ are the same or different at each occurrence and are selected from the group consisting of alkyl, aryl, and deuterated analogs thereof, where two alkyl $R^5$ and $R^6$ groups can be joined together to make a cycloalkyl spiro ring, and where two $R^5$ and $R^6$ phenyl groups can be joined to form a spiro fluorene group;
$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;
x2 is an integer from 0-5;
z is an integer from 0-3; and
* indicates a point of attachment.

The copolymers having Formula IV can have two terminal BzF groups attached to $L^1$ and $L^2$, two terminal amino groups, or one terminal BzF group and one terminal amino group.

In some embodiments of Formula IV, $L^1$ is a crosslinking group or deuterated crosslinking group.

In some embodiments of Formula IV, $L^2$ is a crosslinking group or deuterated crosslinking group.

In some embodiments of Formula IV, n1=3-10.

In some embodiments of Formula IV, the compound is a polymer with $n1 \geq 10$. In some embodiments, the compound is a polymer with $M_n > 20,000$; in some embodiments, $M_{n1} > 50,000$.

In some embodiments of Formula IV, $n1 \geq 10$ and $L^1$ is selected from aryl, arylamino, crosslinkable groups, and deuterated analogs thereof.

In some embodiments of Formula IV, $n1 \geq 10$ and $L^2$ is selected from aryl, arylamino, crosslinkable groups, and deuterated analogs thereof.

In some embodiments of Formula IV, $n1 \geq 10$ and $L^1$ is selected from phenyl, biphenyl, diphenylamino, and deuterated analogs thereof.

In some embodiments of Formula IV, $n1 \geq 10$ and $L^2$ is selected from phenyl, biphenyl, diphenylamino, and deuterated analogs thereof.

In some embodiments, the compound having Formula IV is deuterated. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula IV, BzF has formula BzF-1, shown above. For this core benzofluorene structure, the numbers indicating the positions on the core are shown above.

In some embodiments of Formula IV, BzF has formula BzF-1 and at least one amino nitrogen is bonded to position 1 on the benzofluorene core.

In some embodiments of Formula IV, BzF has formula BzF-1 and at least one amino nitrogen is bonded to position 2 on the benzofluorene core.

In some embodiments of Formula IV, BzF has formula BzF-1 and at least one amino nitrogen is bonded to position 3 on the benzofluorene core.

In some embodiments of Formula IV, BzF has formula BzF-1 and at least one amino nitrogen is bonded to position 4 on the benzofluorene core.

In some embodiments of Formula IV, BzF has formula BzF-1 and at least one amino nitrogen is bonded to position 5 on the benzofluorene core.

In some embodiments of Formula IV, BzF has formula BzF-1 and at least one amino nitrogen is bonded to position 6 on the benzofluorene core.

In some embodiments of Formula IV, BzF has formula BzF-1 and at least one amino nitrogen is bonded to position 8 on the benzofluorene core.

In some embodiments of Formula IV, BzF has formula BzF-1 and at least one amino nitrogen is bonded to position 9 on the benzofluorene core.

In some embodiments of Formula IV, BzF has formula BzF-1 and at least one amino nitrogen is bonded to position 10 on the benzofluorene core.

In some embodiments of Formula IV, BzF has formula BzF-1 and at least one amino nitrogen is bonded to position 11 on the benzofluorene core.

In some embodiments of Formula IV, BzF has formula BzF-2, shown above. For this core benzofluorene structure, the numbers indicating the positions on the core are shown above.

In some embodiments of Formula IV, BzF has formula BzF-2 and at least one amino nitrogen is bonded to position 1 on the benzofluorene core.

In some embodiments of Formula IV, BzF has formula BzF-2 and at least one amino nitrogen is bonded to position 2 on the benzofluorene core.

In some embodiments of Formula IV, BzF has formula BzF-2 and at least one amino nitrogen is bonded to position 3 on the benzofluorene core.

In some embodiments of Formula IV, BzF has formula BzF-2 and at least one amino nitrogen is bonded to position 4 on the benzofluorene core.

In some embodiments of Formula IV, BzF has formula BzF-2 and at least one amino nitrogen is bonded to position 5 on the benzofluorene core.

In some embodiments of Formula IV, BzF has formula BzF-2 and at least one amino nitrogen is bonded to position 6 on the benzofluorene core.

In some embodiments of Formula IV, BzF has formula BzF-2 and at least one amino nitrogen is bonded to position 7 on the benzofluorene core.

In some embodiments of Formula IV, BzF has formula BzF-2 and at least one amino nitrogen is bonded to position 8 on the benzofluorene core.

In some embodiments of Formula IV, BzF has formula BzF-2 and at least one amino nitrogen is bonded to position 9 on the benzofluorene core.

In some embodiments of Formula IV, BzF has formula BzF-2 and at least one amino nitrogen is bonded to position 10 on the benzofluorene core.

In some embodiments of Formula IV, BzF has formula BzF-3, shown above. For this core benzofluorene structure, the numbers indicating the positions on the core are shown above.

In some embodiments of Formula IV, BzF has formula BzF-3 and at least one amino nitrogen is bonded to position 1 on the benzofluorene core.

In some embodiments of Formula IV, BzF has formula BzF-3 and at least one amino nitrogen is bonded to position 2 on the benzofluorene core.

In some embodiments of Formula IV, BzF has formula BzF-3 and at least one amino nitrogen is bonded to position 3 on the benzofluorene core.

In some embodiments of Formula IV, BzF has formula BzF-3 and at least one amino nitrogen is bonded to position 4 on the benzofluorene core.

In some embodiments of Formula IV, BzF has formula BzF-3 and at least one amino nitrogen is bonded to position 5 on the benzofluorene core.

In some embodiments of Formula IV, BzF has formula BzF-3 and at least one amino nitrogen is bonded to position 6 on the benzofluorene core.

In some embodiments of Formula IV, BzF has formula BzF-3 and at least one amino nitrogen is bonded to position 7 on the benzofluorene core.

In some embodiments of Formula IV, BzF has formula BzF-3 and at least one amino nitrogen is bonded to position 8 on the benzofluorene core.

In some embodiments of Formula IV, BzF has formula BzF-3 and at least one amino nitrogen is bonded to position 9 on the benzofluorene core.

In some embodiments of Formula IV, BzF has formula BzF-3 and at least one amino nitrogen is bonded to position 10 on the benzofluorene core.

Any of the embodiments described above for $Ar^1$, $Ar^2$, BzF, $L^1$, $L^2$, $R^1$, $R^2$, a, b, x, and y, in Formula I apply equally to Formula IV.

In some embodiments of Formula IV, A is bonded to the BzF unit directly via an amino nitrogen.

In some embodiments of Formula IV, A has a single amino group.

In some embodiments of Formula IV, A has two amino groups.

In some embodiments of Formula IV, j=k=0.5.

In some embodiments of Formula IV, the copolymer has Formula IV-a

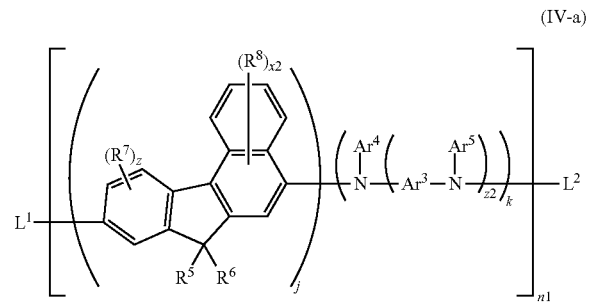

(IV-a)

wherein:
- $Ar^3$-$Ar^5$ are the same or different at each occurrence and are selected from the group consisting of hydrocarbon aryl, heteroaryl, and deuterated analogs thereof;
- $L^1$ and $L^2$ are the same or different and are selected from the group consisting of H, D, halogen, aryl, arylamino, crosslinkable groups, deuterated aryl, deuterated arylamino, and deuterated crosslinkable groups;
- $R^5$ and $R^6$ are the same or different at each occurrence and are selected from the group consisting of alkyl, aryl, and deuterated analogs thereof, where two alkyl $R^5$ and $R^6$ groups can be joined together to make a cycloalkyl spiro ring, and where two $R^5$ and $R^6$ phenyl groups can be joined to form a spiro fluorene group;
- $R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;
- be joined together to form a fused ring;
- j and k are non-zero mole fractions, such that j+k=1;
- n1 is an integer greater than 1;
- x2 is an integer from 0-5;
- z is an integer from 0-3; and
- z1 is an integer from 0-3.

In some embodiments of Formula IV-a, $Ar^3$ is a hydrocarbon aryl group having 6-36 ring carbons. The hydrocarbon aryl group can include one or more single ring groups bonded together, one or more fused rings, or combinations thereof.

In some embodiments of Formula IV-a, $Ar^3$ has Formula c, as described above.

In some embodiments of Formula IV-a, $Ar^3$ has Formula d, as described above.

In some embodiments of Formula IV-a, $Ar^3$ is selected from the group consisting of phenyl, biphenyl, terphenyl, substituted derivatives thereof, and deuterated analogs thereof.

In some embodiments of Formula IV-a, $Ar^4$ is a hydrocarbon aryl group having 6-36 ring carbons. The hydrocarbon aryl group can include one or more single ring groups bonded together, one or more fused rings, or combinations thereof.

In some embodiments of Formula IV-a, $Ar^4$ has Formula a, as described above.

In some embodiments of Formula IV-a, $Ar^4$ has Formula b, as described above.

In some embodiments of Formula IV-a, $Ar^4$ is selected from the group consisting of phenyl, biphenyl, terphenyl, substituted derivatives thereof, and deuterated analogs thereof.

In some embodiments of Formula IV-a, $Ar^5$ is a hydrocarbon aryl group having 6-36 ring carbons. The hydrocarbon aryl group can include one or more single ring groups bonded together, one or more fused rings, or combinations thereof.

In some embodiments of Formula IV-a, $Ar^5$ has Formula a, as described above.

In some embodiments of Formula IV-a, $Ar^5$ has Formula b, as described above.

In some embodiments of Formula IV-a, $Ar^5$ is selected from the group consisting of phenyl, biphenyl, terphenyl, substituted derivatives thereof, and deuterated analogs thereof.

In some embodiments of Formula IV-a, j=k=0.5.

In some embodiments of Formula IV-a, z1=0.

In some embodiments of Formula IV-a, z1=1.

Any of the embodiments described above for $L^1$, $L^2$, $R^5$, $R^6$, $R^7$, $R^8$, x2, z, and n1, in Formula I-a apply equally to Formula IV-a.

Some non-limiting examples of copolymers having Formula IV are shown below. In all of the compounds below, the asterisk can be H, Br, phenyl, or biphenyl, or can indicate attachment to the copolymer. The polymers have at least ten repeating units.

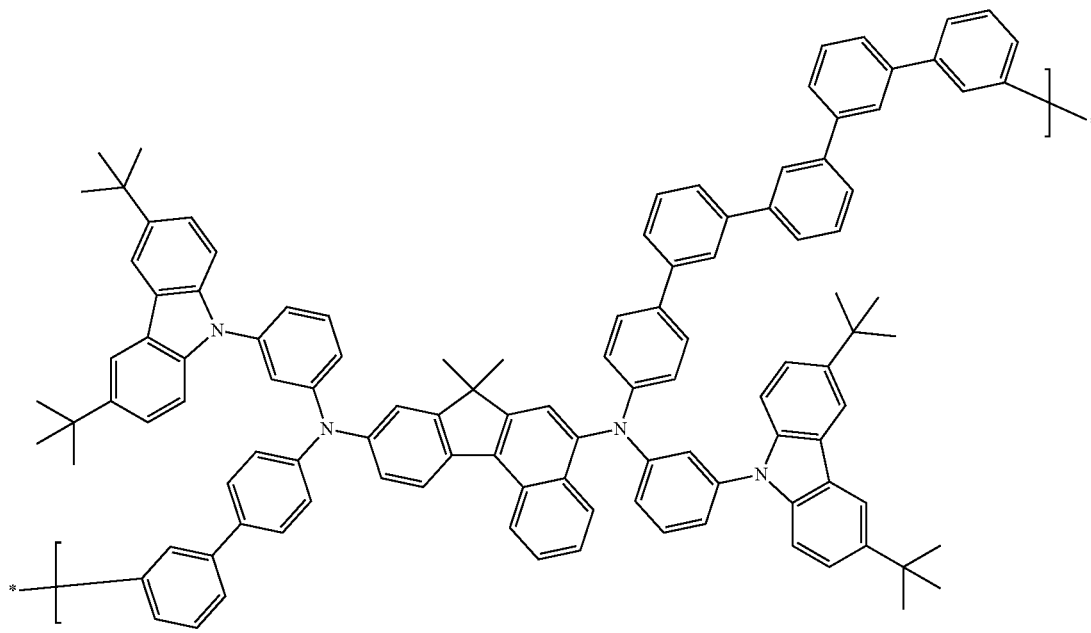

Copolymer 9

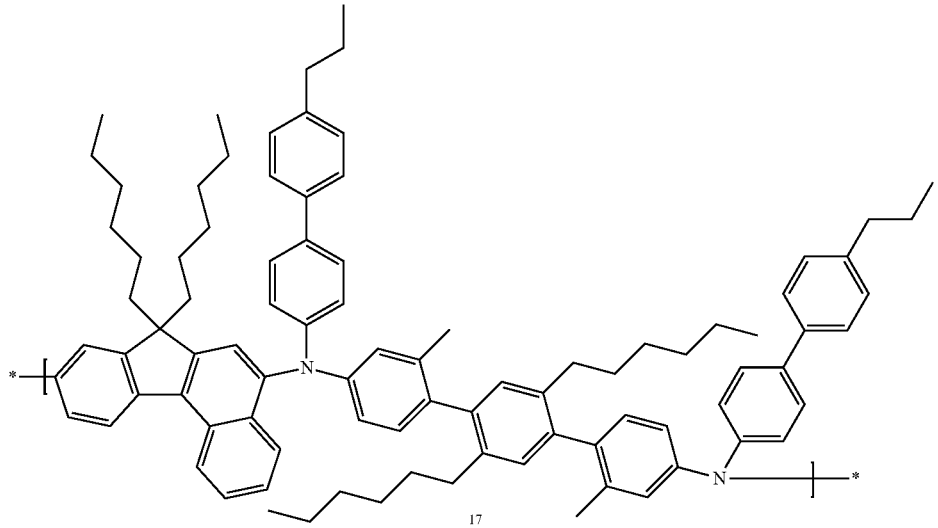

Copolymer 17

6. Polymer Having Monomeric Unit of Formula V and Copolymer Having Formula VI

In some embodiments, the electroactive compound is a copolymer having at least one monomeric unit of Formula V

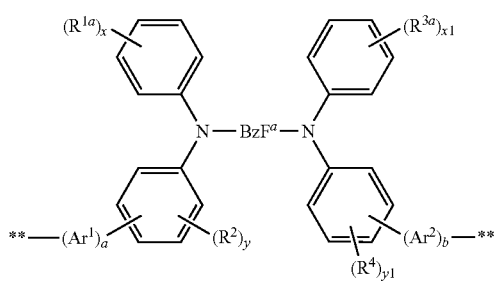

(V)

wherein:

Ar$^1$ and Ar$^2$ are the same or different and are selected from the group consisting of hydrocarbon aryl, heteroaryl, and deuterated analogs thereof;

R$^{1a}$ and R$^{3a}$ are the same or different at each occurrence and are selected from the group consisting of a point of attachment to the copolymer, a hydrocarbon aryl group having a point of attachment to the copolymer, a heteroaryl group having a point of attachment to the copolymer, an alkyl group having a point of attachment to the copolymer, an alkylaryl group having a point of attachment to the copolymer, a deuterated hydrocarbon aryl group having a point of attachment to the copolymer, a deuterated heteroaryl group having a point of attachment to the copolymer, a deuterated alkyl group having a point of attachment to the copolymer, a deuterated alkylaryl group having a point of attachment to the copolymer, D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^{1a}$ and/or $R^{3a}$ groups can be joined together to form a fused ring;

$R^2$ and $R^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^2$ and/or $R^4$ groups can be joined together to form a fused ring;

a is 0 or 1;
b is 0 or 1;
x and x1 are the same or different and are an integer from 0-5;
y and y1 are the same or different and are an integer from 0-4;
$BzF^a$ is selected from the group consisting of $BzF^a$-1, $BzF^a$-2, and $BzF^a$-3, having the formulae shown below

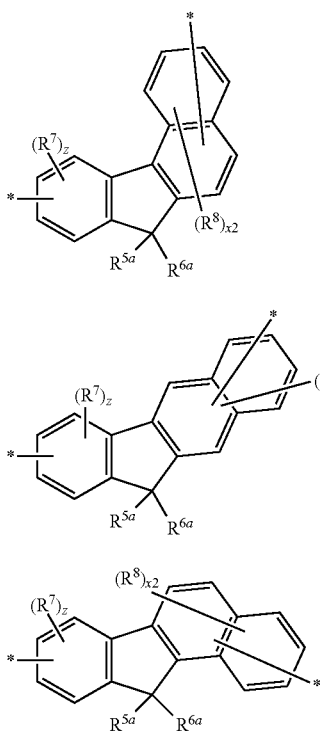

where
$R^{5a}$ and $R^{6a}$ are the same or different at each occurrence and are selected from the group consisting of alkyl, aryl, alkylaryl, alkyl having a point of attachment to the polymer, aryl having a point of attachment to the polymer, alkylaryl having a point of attachment to the polymer, and deuterated analogs thereof, where two alkyl $R^{5a}$ and $R^{6a}$ groups can be joined together to make a cycloalkyl spiro ring, and where two $R^{5a}$ and $R^{6a}$ phenyl groups can be joined to form a spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

groups can be joined together to form a fused ring;
x2 is an integer from 0-5;
z is an integer from 0-3;
* indicates a point of attachment; and
** indicates a point of attachment in the polymer.

The monomeric unit having Formula V has two or more points of attachment.

In some embodiments of Formula V, there are two points of attachment.

In some embodiments of Formula V, there are three points of attachment.

In some embodiments of Formula V, there are four points of attachment.

All of the embodiments described above for BzF in Formula I apply equally to $BzF^a$ in Formula V.

All of the embodiments described above for $R^1$ in Formula I apply equally to $R^{1a}$ in Formula V.

All of the embodiments described above for $R^3$ in Formula I apply equally to $R^{3a}$ in Formula V.

All of the embodiments described above for $Ar^1$, $Ar^2$, $R^2$, $R^4$, a, b, x, x1, y, and y1, in Formula I apply equally to Formula V.

In some embodiments of Formula V, the monomeric unit has Formula V-a.

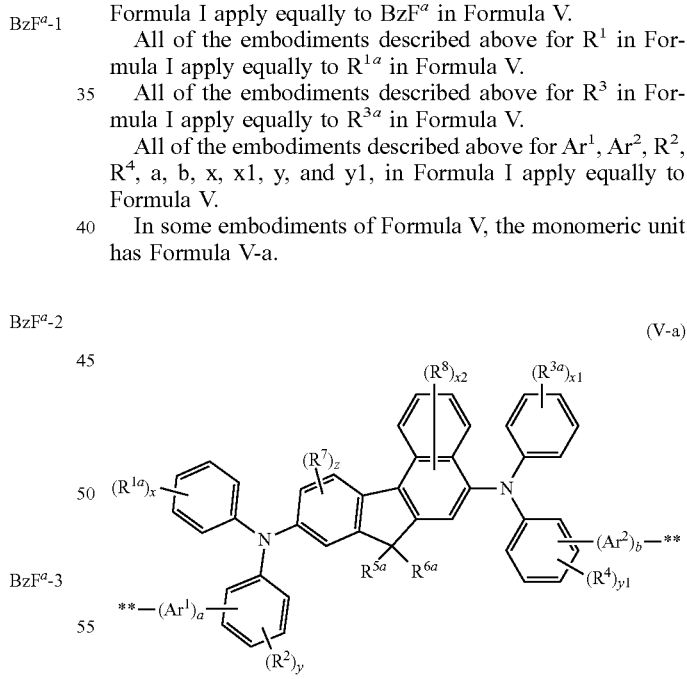

wherein:
$Ar^1$ and $Ar^2$ are the same or different and are selected from the group consisting of hydrocarbon aryl, heteroaryl, and deuterated analogs thereof;

$R^{1a}$ and $R^{3a}$ are the same or different at each occurrence and are selected from the group consisting of a point of attachment to the copolymer, a hydrocarbon aryl group having a point of attachment to the copolymer, a heteroaryl group having a point of attachment to the copolymer, an alkyl group having a point of attachment to the copolymer, an alkylaryl group having a point of attachment to the copolymer, a deuterated hydrocarbon aryl group having a point of attachment to the copolymer, a deuterated heteroaryl group having a point of attachment to the copolymer, a deuterated alkyl group having a point of attachment to the copolymer, a deuterated alkylaryl group having a point of attachment to the copolymer, D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^{1a}$ and/or $R^{3a}$ groups can be joined together to form a fused ring;

$R^2$ and $R^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^2$ and/or $R^4$ groups can be joined together to form a fused ring;

$R^{5a}$ and $R^{6a}$ are the same or different at each occurrence and are selected from the group consisting of alkyl, aryl, alkylaryl, alkyl having a point of attachment to the polymer, aryl having a point of attachment to the polymer, alkylaryl having a point of attachment to the polymer, and deuterated analogs thereof, where two alkyl $R^{5a}$ and $R^{6a}$ groups can be joined together to make a cycloalkyl spiro ring, and where two $R^{5a}$ and $R^{6a}$ phenyl groups can be joined to form a spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

a is 0 or 1;
b is 0 or 1;
x, x1, and x2 are the same or different and are an integer from 0-5;
y and y1 are the same or different and are an integer from 0-4;
z is an integer from 0-3; and
** indicates a point of attachment in the polymer.

In some embodiments of Formula V, the monomeric unit has Formula V-b

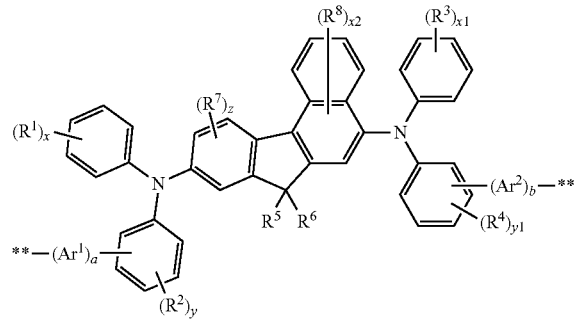

(V-b)

wherein:
$Ar^1$ and $Ar^2$ are the same or different and are selected from the group consisting of hydrocarbon aryl, heteroaryl, and deuterated analogs thereof;

$R^1$-$R^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from $R^1$-$R^4$ can be joined together to form a fused ring;

$R^5$ and $R^6$ are the same or different at each occurrence and are selected from the group consisting of alkyl, aryl, and deuterated analogs thereof, where two alkyl $R^5$ and $R^6$ groups can be joined together to make a cycloalkyl spiro ring, and where two $R^5$ and $R^6$ phenyl groups can be joined to form a spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

a is 0 or 1;
b is 0 or 1;
x, x1, and x2 are the same or different and are an integer from 0-5;
y and y1 are the same or different and are an integer from 0-4;
z is an integer from 0-3; and
** indicates a point of attachment in the copolymer.

All of the embodiments of $R^5$-$R^8$, x2 and z described above for formula BzF-1 apply equally to Formula V-b.

All of the embodiments of $Ar^1$, $Ar^2$, $L^1$, $L^2$, $R^1$-$R^4$, a, b, n, x, x1, y and y1 described above for Formula I apply equally to Formula V-b.

Any of the above embodiments of Formula V can be combined with one or more of the other embodiments, so long as they are not mutually exclusive.

Any of the above embodiments of Formula V-a or Formula V-b can be likewise combined with one or more of the other embodiments, so long as they are not mutually exclusive.

There is also provided a polymer having Formula VI

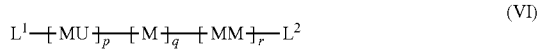
(VI)

wherein:
- $L^1$ and $L^2$ are the same or different and are selected from the group consisting of H, D, halogen, aryl, arylamino, crosslinkable groups, deuterated aryl, deuterated arylamino, and deuterated crosslinkable groups;
- MU is a monomeric unit having Formula V;
- M is a conjugated moiety;
- MM is a conjugated moiety; and
- p, q, and r are mole fractions such that p+q+r=1, where p and q are non-zero.

The "MU", "M", and "MM" units are all different.

In some embodiments of Formula VI, the "MU", "M", and "MM" units are ordered in a regular alternating pattern.

In some embodiments of Formula VI, the "MU", "M", and "MM" units are ordered in blocks of like monomers.

In some embodiments of Formula VI, the "MU", "M", and "MM" units are randomly arranged.

In some embodiments of Formula VI, $L^1$ is selected from aryl, arylamino, crosslinkable groups, and deuterated analogs thereof.

In some embodiments of Formula VI, $L^1$ is selected from phenyl, triphenylamino, and deuterated analogs thereof.

In some embodiments of Formula VI, $L^2$ is selected from aryl, arylamino, crosslinkable groups, and deuterated analogs thereof.

In some embodiments of Formula VI, $L^2$ is selected from phenyl, triphenylamino, and deuterated analogs thereof.

In some embodiments of Formula VI, M is a deuterated aromatic moiety.

In some embodiments of Formula VI, M has Formula IV or Formula IV-a, provided that M≠MU.

In some embodiments of Formula VI, M is a monomeric unit derived from an olefin, an acetylenic compound, a styrene, a stilbene, a substituted derivative thereof, or a deuterated analog thereof.

In some embodiments of Formula VI, M has Formula c as described above.

In some embodiments of Formula VI, M has Formula d as described above.

In some embodiments of Formula VI, M is a monomeric unit derived from a hydrocarbon aryl having two or more fused rings or a deuterated analog thereof.

In some embodiments of Formula VI, M is a monomeric unit derived from the group consisting of naphthalene, anthracene, fluorene, phenanthrene, triphenylene, substituted derivatives thereof, and deuterated analogs thereof.

In some embodiments of Formula VI, M is a monomeric unit derived from a triarylamino group or deuterated analog thereof.

In some embodiments of Formula VI, M is a monomeric unit derived from a heteroaromatic compound having at least one ring atom which is selected from the group consisting of N, O, and S.

In some embodiments of Formula VI, M is a monomeric unit derived from an N-heteroaryl, as described above.

In some embodiments of Formula VI, M is a monomeric unit derived from an S-heteroaryl, as described above.

In some embodiments of Formula VI, M is a monomeric unit derived from an O-heteroaryl, as described above.

In some embodiments of Formula VI, M is a monomeric unit derived from an N,O-heteroaryl, as described above.

In some embodiments of Formula VI, M is a monomeric unit derived from an N,S-heteroaryl, as described above.

In some embodiments of Formula VI, M has one of the formulae given below.

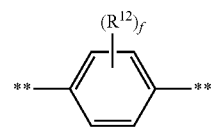
M1

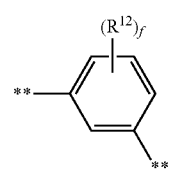
M2

M2a

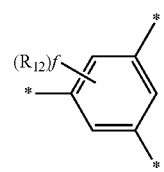
M3

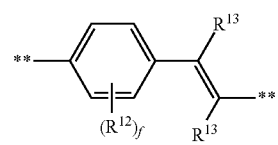
M4

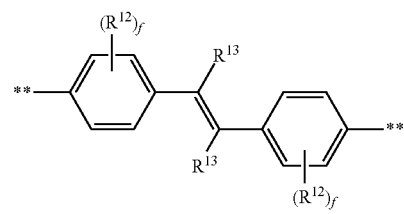
M5

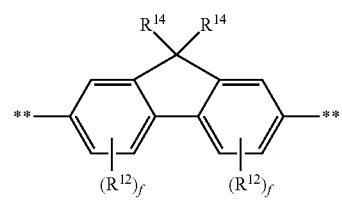
M6

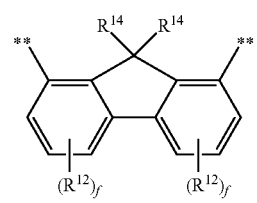

M7
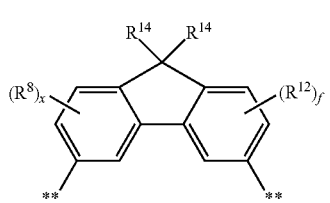
M8
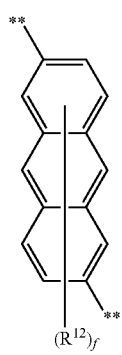
M8a
M9
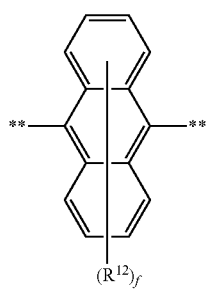
M9a
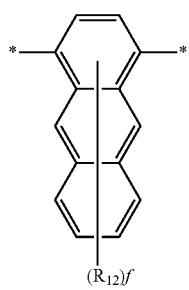
M10
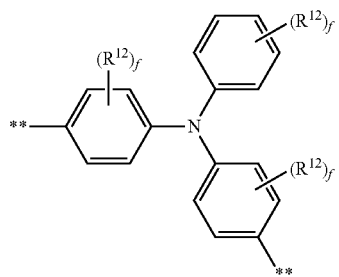
M11
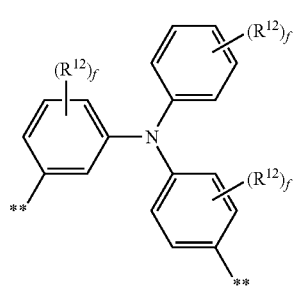
M12
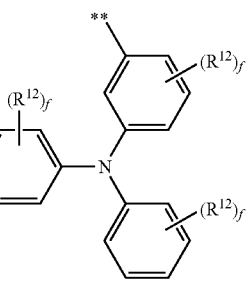
M12a
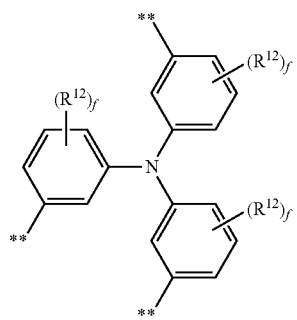
M13
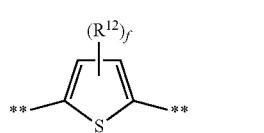

M14 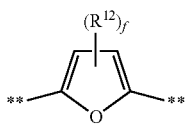

M15 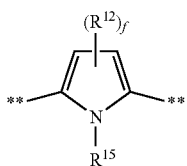

M16 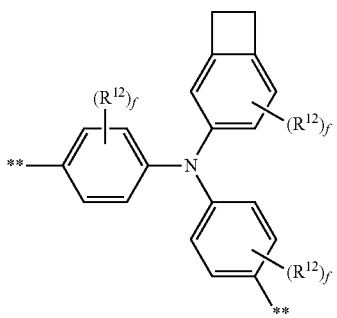

M17 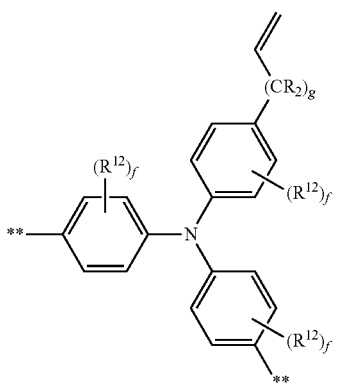

M18 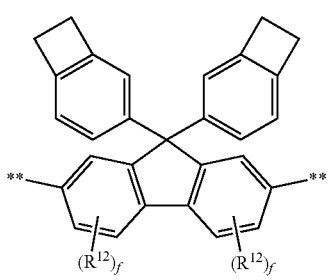

M19 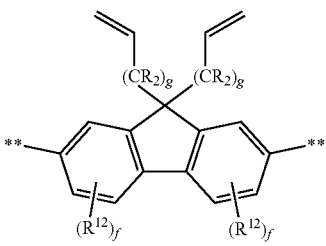

In M1 through M19:

$R^{12}$ is the same or different at each occurrence and is selected from the group consisting of D, alkyl, silyl, aryl, deuterated alkyl, deuterated silyl, and deuterated aryl;

$R^{13}$ is the same or different at each occurrence and is selected from the group consisting of H, D, alkyl, and deuterated alkyl;

$R^{14}$ is the same or different at each occurrence and is selected from the group consisting of alkyl, aryl, alkylaryl, alkyl having a point of attachment to the polymer, aryl having a point of attachment to the polymer, alkylaryl having a point of attachment to the polymer, and deuterated analogs thereof;

$R^{15}$ is the same or different at each occurrence and is selected from the group consisting of aryl and deuterated aryl;

f is the same or different at each occurrence and is an integer from 0 to the maximum number of positions available for substituents;

g is an integer of 0-20; and

** represents the point of attachment in the copolymer.

In some embodiments of M1 through M19, f is 0-2.

Any of the above embodiments for M apply equally to MM, provided that M≠MM.

In some embodiments of Formula VI, M is selected from M1 through M15.

In some embodiments of Formula VI, MM is selected from M16 through M19.

In some embodiments of Formula VI, p is in the range of 0.5-0.99; in some embodiments, 0.6-0.90; in some embodiments, 0.75-0.85.

In some embodiments of Formula VI, q is in the range of 0.01-0.50; in some embodiments, 0.1-0.4; in some embodiments, 0.2-0.3.

In some embodiments of Formula VI, r is in the range of 0-0.4; in some embodiments 0.1-0.2.

Any of the above embodiments for Formula V can be combined with one or more of the other embodiments, so long as they are not mutually exclusive.

The copolymer having Formula V can be made using known coupling techniques and polymerization techniques.

Some non-limiting examples of copolymers having Formula V are shown below. In all of the compounds below, the asterisk can be H, Br, phenyl, or biphenyl, or can indicate attachment to the polymer. The polymers have at least ten sets of repeating units.

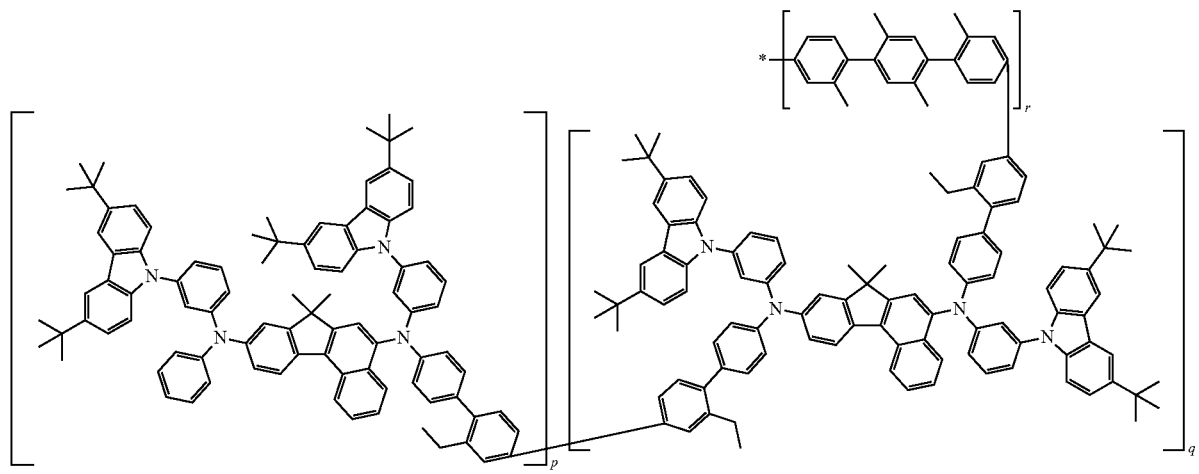
where p, q, and r represent mole fractions.
Copolymer 8
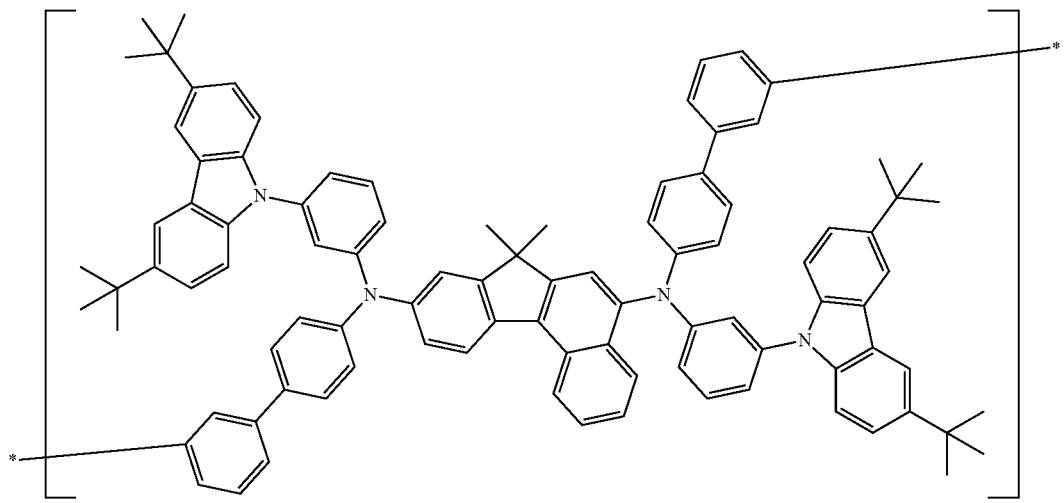
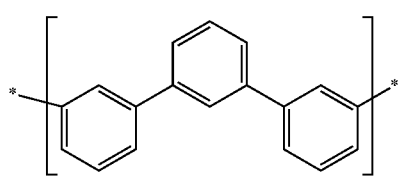

-continued

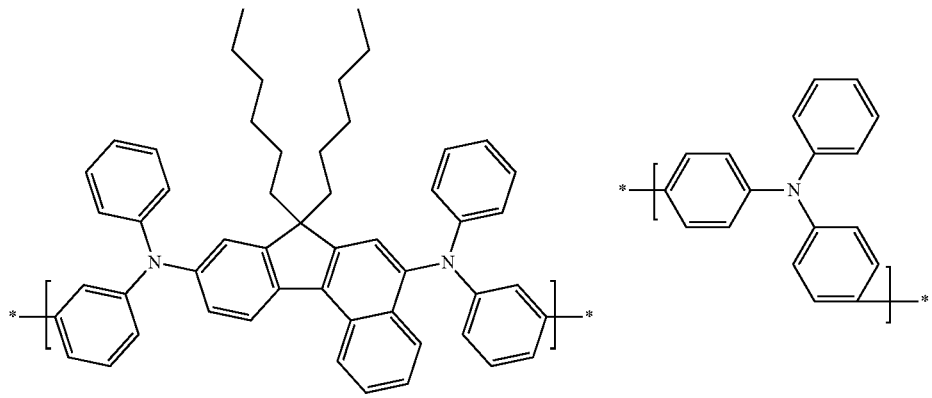

Copolymer 25

7. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
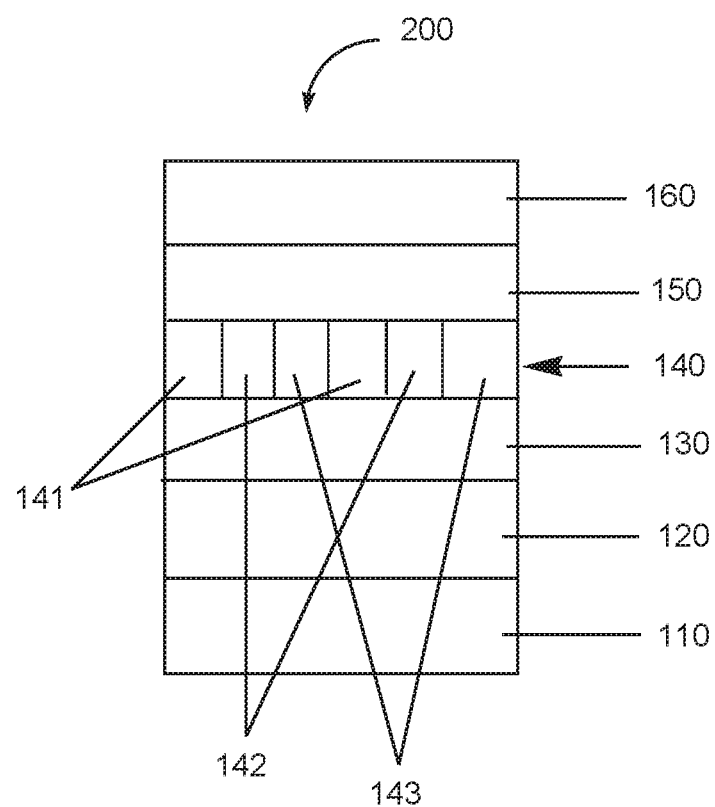
FIG. 2 includes an illustration of another example of an organic electronic device.

In some embodiments, in order to achieve full color, the light-emitting layer is pixellated, with subpixel units for each of the different colors. An illustration of a pixellated device is shown in FIG. 2. The device 200 has anode 110, hole injection layer 120, hole transport layer 130, photoactive layer 140, electron transport layer 150, and cathode 160. The photoactive layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new materials comprising a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, described herein may be present in one or more of the electroactive layers of a device.

In some embodiments, the new materials comprising a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, are useful as photoactive materials in layer 140. In some embodiments, the new materials comprising a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, are present as photoactive dopant materials in one or more host materials. The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material to which a dopant is added. The host material may or may not have electronic characteristic(s) or the ability to emit, receive, or filter radiation. In some embodiments, the host material is present in higher concentration.

In some embodiments, the new materials comprising a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, are useful as host materials for photoactive dopant materials in photoactive layer 140.

In some embodiments, an organic electronic device includes an anode, a cathode, and at least one organic active layer therebetween, where the organic active layer includes a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI.

In some embodiments, an organic electronic device includes an anode, a cathode, and a photoactive layer therebetween, where the photoactive layer includes a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI.

In some embodiments, the compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, is blue light-emitting. The term "blue light-emitting" is intended to mean a material capable of emitting radiation that has an emission maximum at a wavelength in a range of approximately 400-500 nm. In some embodiments, the emission maximum at a wavelength in a range of approximately 445-490 nm.

In some embodiments, the compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, have a photoluminescence y-coordinate of less than 0.15, according to the C.I.E. chromaticity scale (Commission Internationale de L'Eclairage, 1931); in some embodiments, less than 0.10; in some embodiments, less than 0.090.

In some embodiments, electroluminescent devices including the compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI as emissive materials have deep blue color. In some embodiments, the blue emission has an x-coordinate less than 0.15 and a y-coordinate less than 0.10, according to the C.I.E. chromaticity scale (Commission Internationale de L'Eclairage, 1931); in some embodiments, the y-coordinate is less than 0.090.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material.

In some embodiments, layer 130 includes a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI. In some embodiments, layer 130 includes only a compound having Formula I, where additional materials that would materially alter the principle of operation or the distinguishing characteristics of the layer are not present.

In some embodiments, layer 130 includes other hole transport materials. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and nitrogen-containing macrocycliccompounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI as a host material for a photoactive dopant.

In some embodiments, photoactive layer 140 includes only a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI, and a photoactive dopant, where additional materials that would materially alter the principle of operation or the distinguishing characteristics of the layer are not present.

In some embodiments, the photoactive layer 140 includes a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI as a photoactive material and further comprises a host material.

Examples of host materials include, but are not limited to, chrysenes, phenanthrenes, triphenylenes, phenanthrolines, triazines, naphthalenes, anthracenes, quinolines, isoquinolines, quinoxalines, phenylpyridines, carbazoles, indolocarbazoles, indoloindoles, furans, benzofurans, dibenzofurans, benzodifurans, metal quinolinate complexes, substituted derivatives thereof, and deuterated analogs thereof.

In some embodiments, the host is selected from the group consisting of anthracenes, chrysenes, triphenylenes, carbazoles, indolocarbazoles, indoloindoles, furans, benzofurans, dibenzofurans, substituted derivatives thereof, and deuterated analogs thereof.

In some embodiments, the photoactive layer 140 includes only a compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI as a photoactive material and a host material, where additional materials that would materially alter the principle of operation or the distinguishing characteristics of the layer are not present.

When the electroactive materials described herein or other materials are used as host materials, the photoactive dopant can be an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In some embodiments, the photoactive layer further includes a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, indolocarbazoles, furans, benzofurans, dibenzofurans, benzodifurans, and metal quinolinate complexes.

Optional layer 150 can function both to facilitate electron transport, and also serve as a confinement layer to prevent quenching of the exciton at layer interfaces. Preferably, this layer promotes electron mobility and reduces exciton quenching.

In some embodiments, layer 150 includes other electron transport materials. Examples of electron transport materials which can be used in the optional electron transport layer 150, include metal chelated oxinoid compounds, including metal quinolate derivatives such as tris(8-hydroxyquinolato) aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato) zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof. In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, including the new compounds, includes, but not limited to, chlorinated hydrocarbons (such as methylene chloride, chloroform, chlorobenzene), aromatic hydrocarbons (such as substituted and non-substituted toluenes and xylenes), including trifluorotoluene), polar solvents (such as tetrahydrofuran (THP), N-methyl pyrrolidone) esters (such as ethylacetate) alcohols (isopropanol), ketones (cyclopentatone) and mixtures thereof. Suitable solvents for electroluminescent materials have been described in, for example, published PCT application WO 2007/145979.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Synthesis Example 1

This example illustrates the preparation of compounds having Formula I, Monomer 3, Oligomer 4 and Polymer 4.

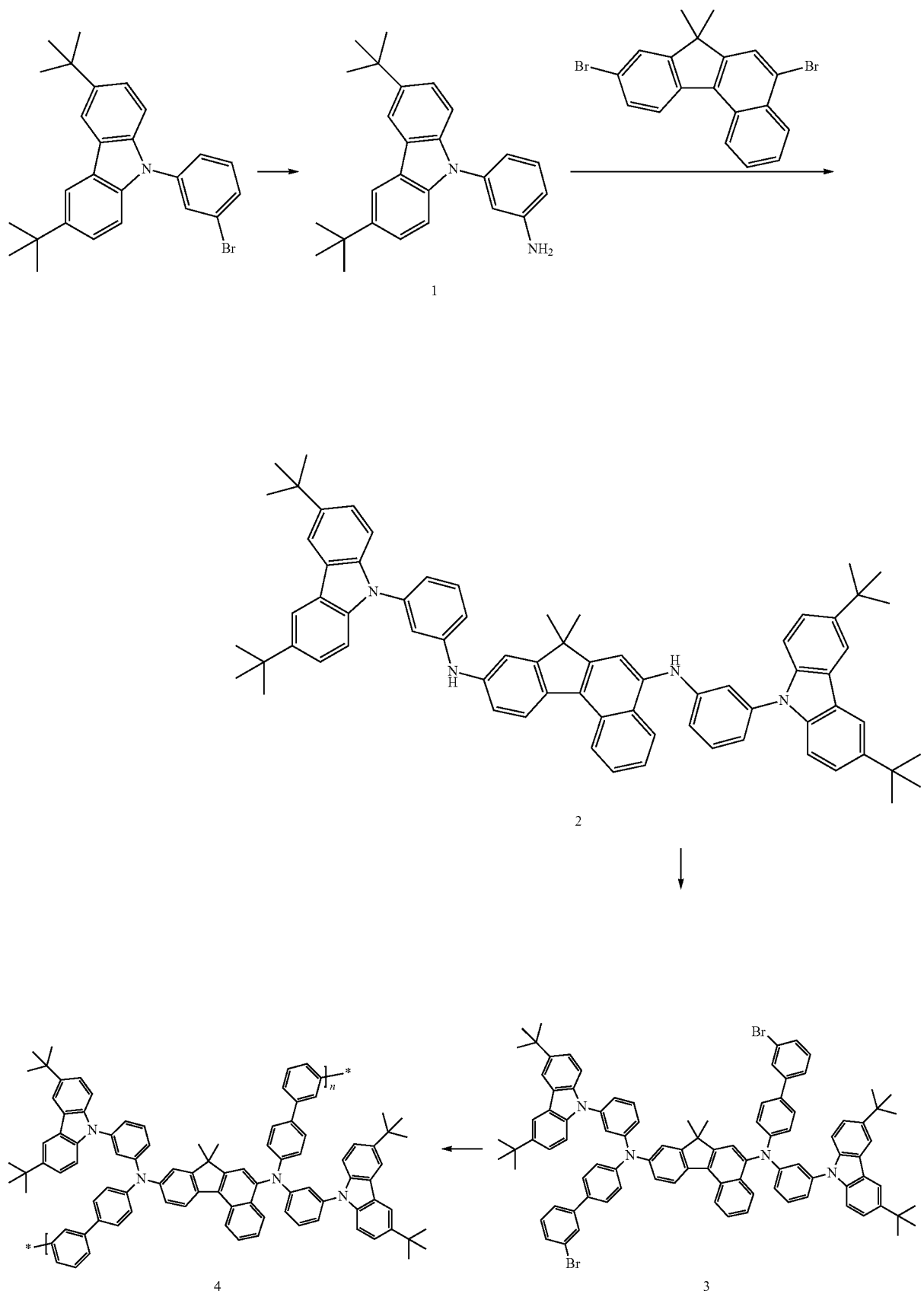

N-(3-aminophenyl)-2,6,-di-tert-butyl-carbazole, Intermediate 1

A solution of 1M LiN(SiMe$_3$)$_2$ in toluene (26.6 ml, 26.6 mmole) was added to a stirred solution of N-(3-bromophenyl)2,6-di-tert-butylcarbazole (10.5 g, 24.2 mmole), Pd$_2$(dba)$_3$ (0.443 g, 0.48 mmole), tri-tert-butyl-phosphine (0.195 g, 0.97 mmole) in dry toluene (150 ml) under nitrogen atmosphere. The resulting mixture was stirred at room temperature for 5 min and then heated to 80° C. overnight until completion by TLC/UPLC. The reaction mixture was cooled down to ambient temperature, water (0.5 ml) carefully added dropwise to quench excess of LiN(SiMe$_3$)$_2$ and the reaction mixture was stirred in the air for 1 min. After that reaction mixture passed through layers of celite, florisil and silica gel washing with toluene (100 mL). Concentrated hydrochloric acid (10 ml) added at once to this solution and the mixture stirred for 30 min at room temperature. Precipitate filtered, washed with methanol and dried to afford hydrochloric salt of N-(3-aminophenyl)-2,6,-di-tert-butyl-carbazole. This salt was converted to free amine by stirring a suspension of the above salt in dichloromethane and 40% aq. KOH, collecting organic phase, drying it over sodium sulfate and evaporating solvent by using rotary evaporator. Yield, 6.62 g (17.9 mmole, 67%). $^1$H-NMR (CDCl$_3$, 500 MHz): 1.47 (s, 18H), 6.74 (ddd, 1H, J=8, 2, 1 Hz), 6.87 (t, 1H, J=2 Hz), 6.95 (ddd, 1H, J=8, 2, 1 Hz), 7.34 (t, 1H, J=8 Hz), 7.40 (d, 2H, J=8.5 Hz), 7.46 (dd, 2H, J=8.5, 2 Hz), 8.13 (d, 2H, J=1.5 Hz). MS: MH+=372.

N,N'-Bis-(N-3-(2,6-di-tert-butylcarbazolyl)phenyl-7,7-dimethyl-benzofluorene (Intermediate 2)

5,9-Dibromo-7,7-dimethyl-7H-benzo[c]fluorene (3.13 g, 7.23 mmole), N-(3-aminophenyl)-2,6-di-tert-butylcarbazole 1 (5.62 g, 15.2 mmole), Pd$_2$(dba)$_3$ (0.401 g, 0.44 mmole), tri-tert-butyl-phosphine (0.179 g, 0.88 mmole) and toluene (200 ml) were added to 250 mL round bottom reaction flask at room temperature under nitrogen atmosphere. After that sodium tert-butoxide (1.53 g, 15.91 mmole) was added to the mixture and the resulting suspension stirred at room temperature for 5 min, then heated to 33° C. overnight. The reaction mixture was cooled down to ambient temperature, water (100 ml) added and mixture was stirred in the air for 30 min. After that organic layer was separated and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using mixture of hexanes and dichloromethane as eluent. All fractions containing the product combined, eluent evaporated and the residue was recrystallized from hot toluene-hexanes mixture. Product photodecomposes in chloroform-di. Yield of bis-(N-3-(2,6-di-tert-butylcarbazolyl)phenyl-7,7-dimethyl-benzofluorene, 3.0 g (3.06 mmole, 42%). MS: MH+=982. Purity by UPLC—97.3%.

N,N'-bis(3-(2,6-di-tert-butylcarbazolyl))-N,N'-bis(3'-bromobiphenyl)-7,7-dimethylbenzofluorene, Monomer 3

Bis-(N-3-(2,6-di-tert-butylcarbazolyl)phenyl-7,7-dimethyl-benzofluorene 2 (3.0 g, 3.06 mmole), 3-bromo-4-iodobiphenyl (3.30 g, 9.18 mmole), Pd$_2$(dba)$_3$ (0.084 g, 0.092 mmole), 1,1'-bis(diphenylphosphino)ferrocene (0.102 g, 0.184 mmole) and toluene (100 ml) were added to 250 mL round bottom reaction flask at room temperature under nitrogen atmosphere. After that sodium tert-butoxide (0.88 g, 9.18 mmole) was added to the mixture and the resulting suspension stirred at room temperature for 5 min, then heated to 80° C. overnight and at 100° C. for an additional 3 hours monitoring progress of the reaction by UPLC. The reaction mixture was cooled down to ambient temperature, water (100 ml) added and mixture was stirred in the air for 30 min. After that organic layer was separated and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using mixture of hexanes and dichloromethane as eluent. Column chromatography was repeated consecutively on silica gel and basic alumina. All fractions containing the product combined, eluent evaporated, the residue redissolved in dichloromethane and precipitated into methanol. Yield of N,N'-bis(3-(2,6-di-tert-butylcarbazolyl))-N,N'-bis(-3'-bromobiphenyl)-7,7-dimethylbenzofluorene, 2.3 g (1.59 mmole, 52%). Product photodecomposes in chloroform-di. MS: MH+=1444.

Polymerization of Monomer 3 to Form Oligomer 4 and Polymer 4.

A mixture of bis(1,5-cyclooctadiene)nickel (0.289 g, 1.05 mmole), 2,2'-dipyridyl (0.164 g, 1.05 mmole) and 1,5-cyclooctadiene (0.114 g, 1.05 mmole) in toluene (9.5 ml) and dimethylformamide (9.5 ml) was stirred at 60° C. for 45 minutes under nitrogen atmosphere. After that a solution of N,N'-bis(3-(2,6-di-tert-butylcarbazolyl))-N,N'-bis(-3'-bromobiphenyl)-7,7-dimethylbenzofluorene (0.75 g, 0.519 mmole) in anhydrous toluene (9.5 ml) was added at once and the reaction mixture was stirred at 60° C. for 3 hours. After that reaction mixture was poured into methanol (300 ml) containing conc. hydrochloric acid (15 ml) and stirred for 1 hour. Precipitate filtered, dissolved in toluene and passed through a column filled with layers of silica gel and basic alumina washing with toluene. Solvent evaporated on rotary evaporator, the residue redissolved in toluene and fractionated by addition of acetone. Supernatant decanted and used to recover oligomeric fraction whereas solids were dissolved in toluene (20 ml) and precipitated into methanol (300 ml) to give 0.18 g (yield 27%) of Polymer 4: $^1$H-NMR (CDCl$_3$, 500 MHz): 1.40 (s, 36H), 1.50 (s, 6H), 7.12-7.62 (35H), 7.82 (d, 1H, J=8 Hz), 7.85 (d, 1H, J=8 Hz), 8.04 (d, 2H, J=2 Hz), 8.09 (d, 2H, J=1.5 Hz), 8.16 (d, 1H, J=8 Hz), 8.24 (d, 1H, J=7.5 Hz), 8.74 (d, 1H, J=8 Hz). GPC (THF): Mw=182900 Da, PDI=1.63. UV-vis (toluene), lambda$_{max}$: 410 nm. Photoluminescence (toluene): lambda$_{max}$: 452 nm.

Oligomer 4: composition by UPLS/MS: dimer (31%), MH+=2568, trimer (16%), MH+=3848, tetramer (10.6%), MH (2+)=2568, pentamer (7.3%), MH (2+)=3208, hexamer (5.2%), MH (2+)=3848 and peaks that can be attributed to higher molecular weight oligomers.

Synthesis Example 2

This example illustrates the preparation of compounds having Formula I, Monomer 5 and Polymer 6.

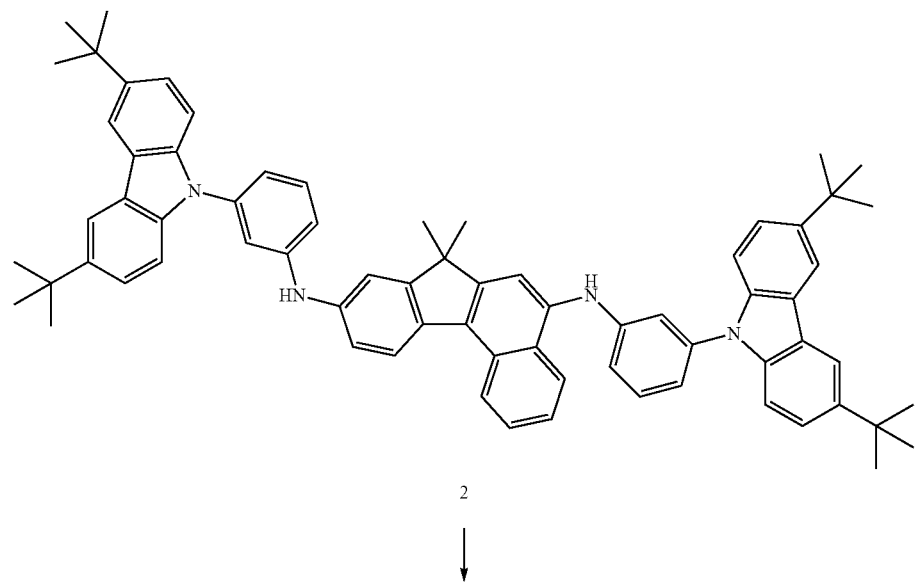
2
↓
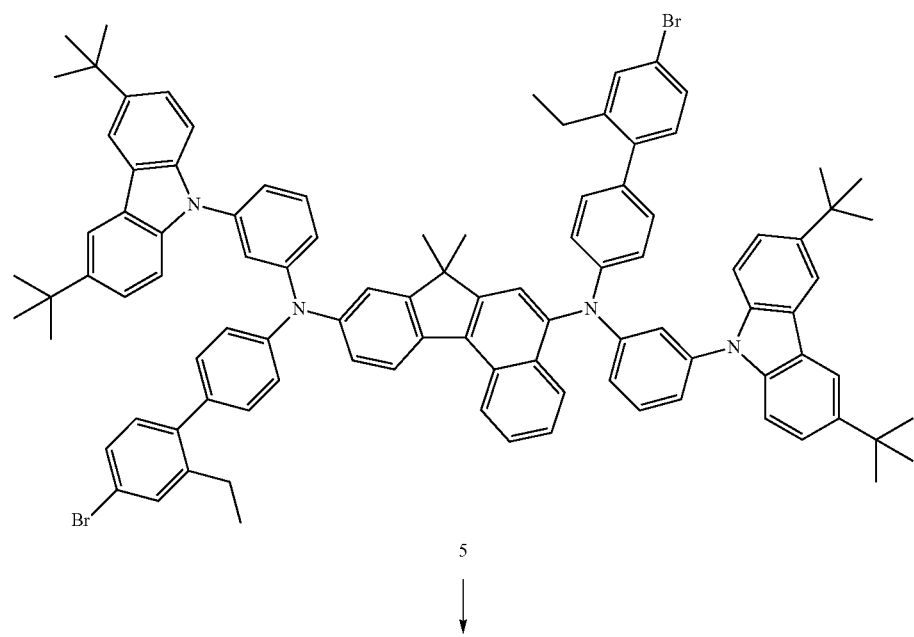
5
↓

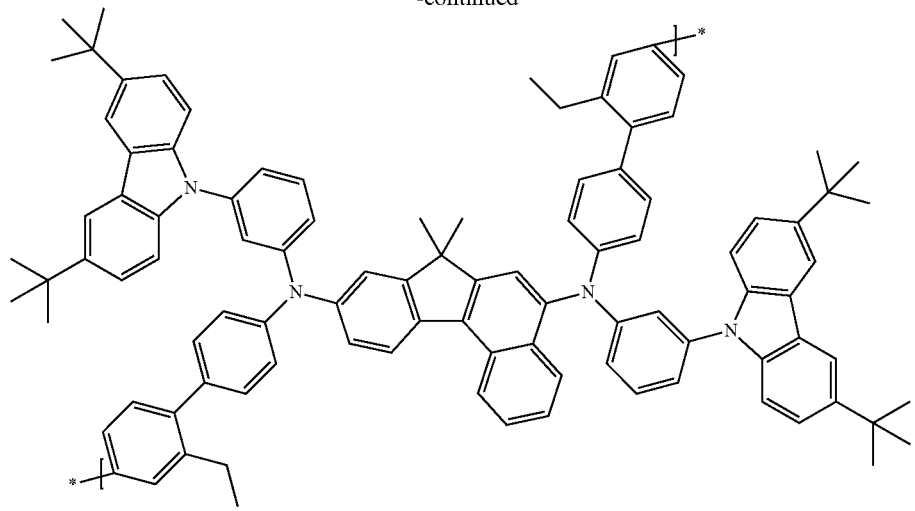

6

N,N'-bis(3-(2,6-di-tert-butylcarbazolyl))-N,N'-bis(-4'-bromo-2-ethyl-biphenyl)-7,7-dimethylbenzofluorene, Monomer 5

Bis-(N-3-(2,6-di-tert-butylcarbazolyl)phenyl-7,7-dimethyl-benzofluorene intermediate 2 (1.32 g, 1.35 mmole), 4-bromo-2-ethyl-4'-iodobiphenyl (1.56 g, 4.03 mmole), $Pd_2(dba)_3$ (0.074 g, 0.081 mmole), 1,1'-bis(diphenylphosphino)ferrocene (0.088 g, 0.158 mmole) and toluene (100 ml) were added to 250 mL round bottom reaction flask at room temperature under nitrogen atmosphere. After that sodium tert-butoxide (0.39 g, 4.03 mmole) was added to the mixture and the resulting suspension stirred at room temperature for 5 min, then heated to 80° C. for 3 hours and at 110° C. for an additional 4 hours monitoring progress of the reaction by UPLC. The reaction mixture was cooled down to ambient temperature, water (100 ml) added and mixture was stirred in the air for 30 min. After that organic layer was separated and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using mixture of hexanes and dichloromethane as eluent. Column chromatography was repeated consecutively on silica gel (two times) and basic alumina. All fractions containing the product combined, eluent evaporated, the residue redissolved in toluene and precipitated into methanol. Yield of N,N'-bis(3-(2,6-di-tert-butylcarbazolyl))-N,N'-bis(-4'-bromo-2-ethyl-biphenyl)-7,7-dimethylbenzofluorene, 0.47 g (purity 97%) and 0.6 g (purity 90%). $^1$H-NMR (CDCl$_3$, 500 MHz): 1.08 and 1.12 (t, 6H, J=8 Hz), 1.42 and 1.44 (s, 32H), 1.49 (s, 6H), 2.60 and 2.64 (q, 4H, J=7.5 Hz), 7.07-7.49 (m, 33H), 7.56 (s, 1H), 7.64 (t, 1H, J=7.5 Hz), 8.06 (d, 2H, J=2 Hz), 8.10 (d, 2H, J=1.5 Hz), 8.17 (d, 1H, J=8.5 Hz), 8.25 (d, 1H, J=8.5 Hz), 8.75 (d, 1H, J=8.5 Hz). MS: MH+=1500.

The monobromomonomer, Monomer 5A, could also be isolated.

Polymerization of Monomer 5 to Form Polymer 6.

A mixture of bis(1,5-cyclooctadiene)nickel (0.13 g, 0.485 mmole), 2,2'-dipyridyl (0.076 g, 0.485 mmole) and 1,5-cyclooctadiene (0.05 g, 0.485 mmole) in toluene (4.4 ml) and dimethylformamide (2.2 ml) was stirred at 60° C. for 45 minutes under nitrogen atmosphere. After that a solution of N,N'-bis(3-(2,6-di-tert-butylcarbazolyl))-N,N'-bis(-4'-bromo-2-ethyl-biphenyl)-7,7-dimethylbenzofluorene (0.36 g, 0.24 mmole) in anhydrous toluene (4.4 ml) was added at once and the reaction mixture was stirred at 60° C. for 3 hours. After that reaction mixture was poured into methanol (100 ml) containing conc. hydrochloric acid (5 ml) and stirred for 30 min. Precipitate filtered, dissolved in toluene and passed through a column filled with layers of silica gel and basic alumina washing with toluene. Solvent evaporated on rotary evaporator, the residue redissolved in toluene and fractionated by addition of acetone. Solution decanted and solids were dissolved in toluene and precipitated into methanol to give 0.12 g (yield 38%) of Polymer 6. $^1$H-NMR (CDCl$_3$, 500 MHz): 1.13-1.22 (m, 6H), 1.42 and 1.44 (s, 32H), 1.52 (s, 6H), 2.72-2.77 (m, 4H), 7.12-7.65 (m, 37H), 8.06 (s, 2H), 8.10 (s, 2H), 8.20 (d, 2H, J=8 Hz), 8.25-8.27 (br d, 1H, J=8 Hz), 8.76 (d, 1H, J=7.5 Hz). GPC (THF): Mw=119500 Da, PDI=1.79.

Synthesis Example 3

This example illustrates the preparation of a copolymer of Formula V, Copolymer 7.

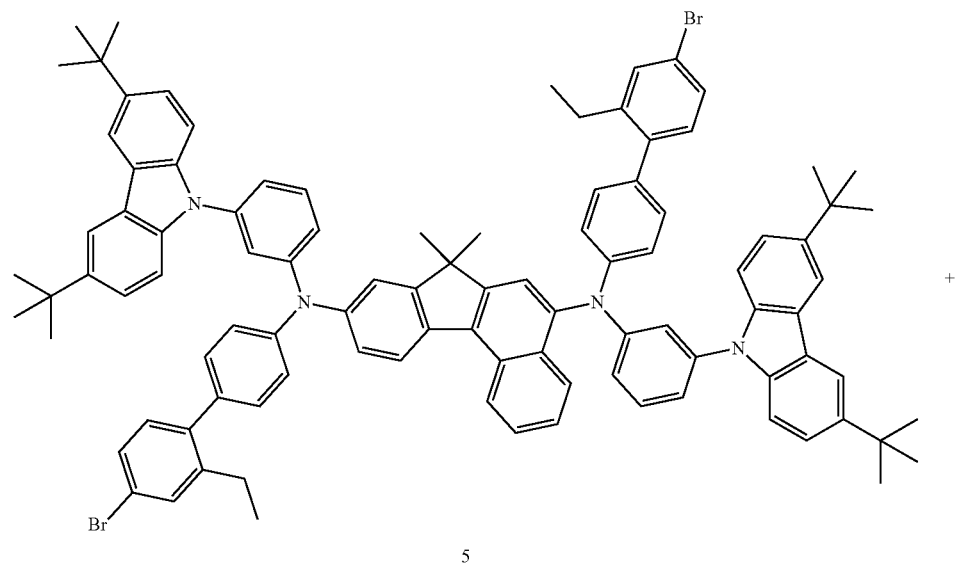
5
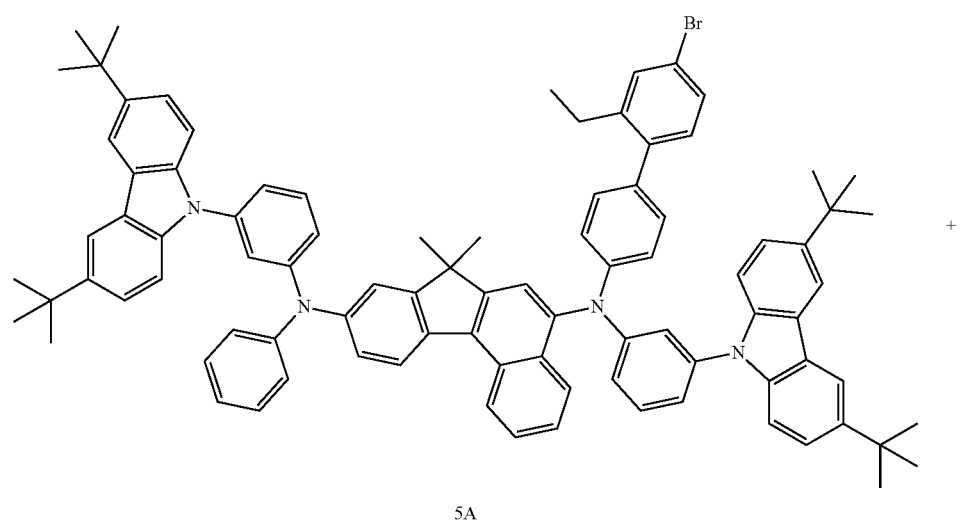
5A
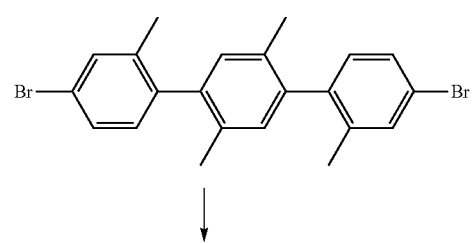

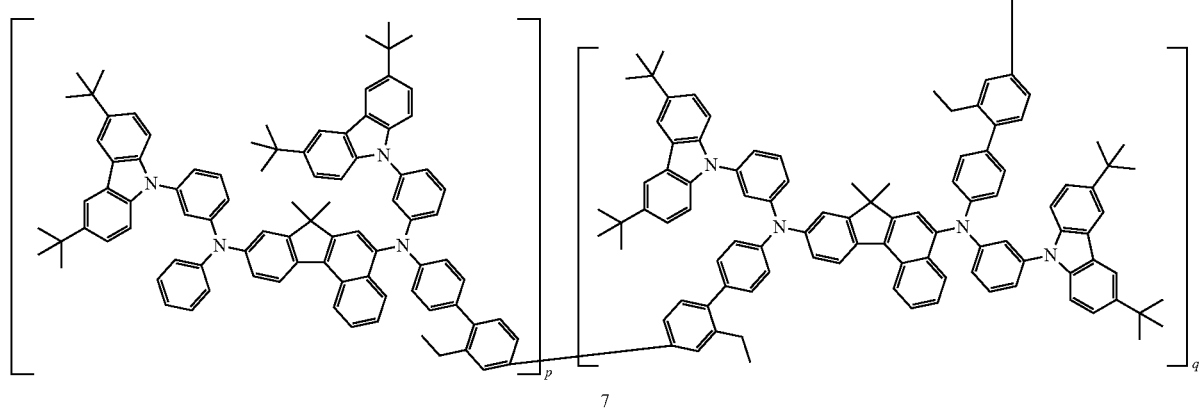

7

Copolymerization of Monomer 5 and Monomer 5A with Dibromoterphenyl, to Form Copolymer 7.

A mixture of bis(1,5-cyclooctadiene)nickel (0.187 g, 0.68 mmole), 2,2'-dipyridyl (0.106 g, 0.68 mmole) and 1,5-cyclooctadiene (0.073 g, 0.68 mmole) in toluene (6 ml) and dimethylformamide (3 ml) was stirred at 60° C. for 45 minutes under nitrogen atmosphere. After that a solution of N,N'-bis(3-(2,6-di-tert-butylcarbazolyl))-N,N'-bis(-4'-bromo-2-ethyl-biphenyl)-7,7-dimethylbenzofluorene (0.5 g, 0.334 mmole, composition—bisbromomonomer—90%, monobromomonomer—10%) and 4,4'-dibromo-3',6'-dimethyl-6,6'-dimethyl-1,1': 4,1'-terphenyl (0.148 g, 0.334 mmole) in anhydrous toluene (6 ml) was added at once and the reaction mixture was stirred at 60° C. for 3 hours. After that reaction mixture was poured into methanol (150 ml) containing conc. hydrochloric acid (10 ml) and stirred for 30 min. Precipitate filtered, dissolved in toluene and passed through a column filled with layers of silica gel and basic alumina washing with toluene. Solvent evaporated on rotary evaporator, the residue redissolved in toluene and fractionated by addition of acetone. Solution decanted and solids were dissolved in toluene and precipitated into methanol to give 0.16 g (yield 50%) of Copolymer 7. GPC (THF): Mw=16500 Da, PDI=1.46.

Synthesis Example 4

This example illustrates the preparation of a compound having Formula V, Copolymer 8 and a compound having Formula IV, Copolymer 9.

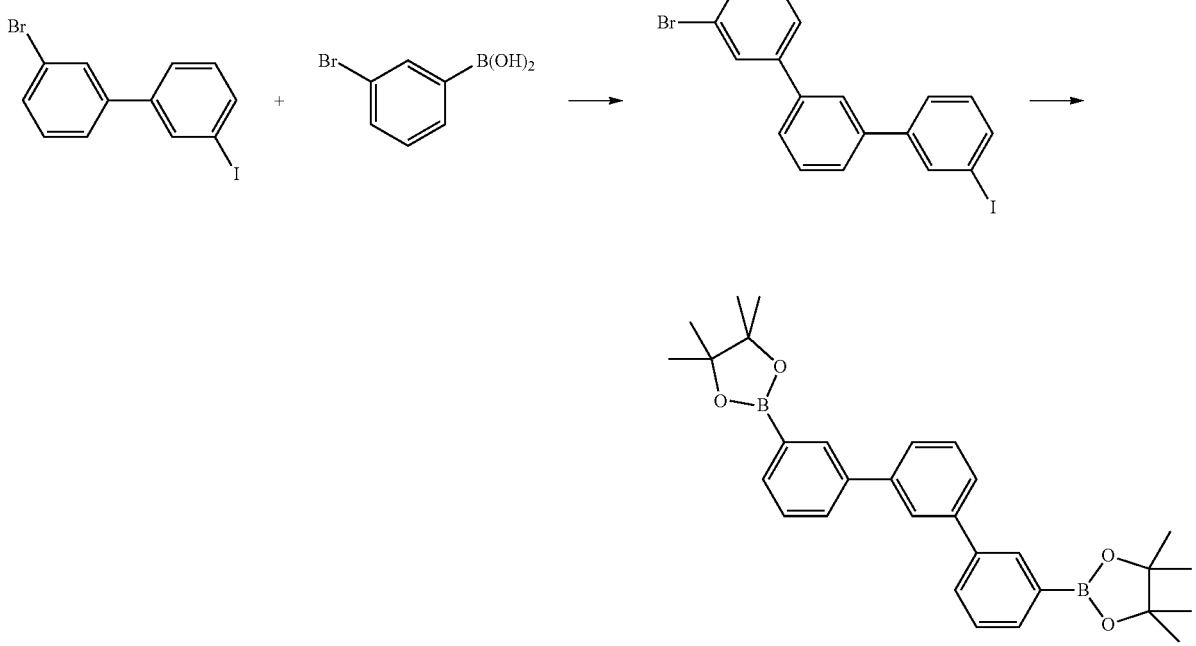

-continued
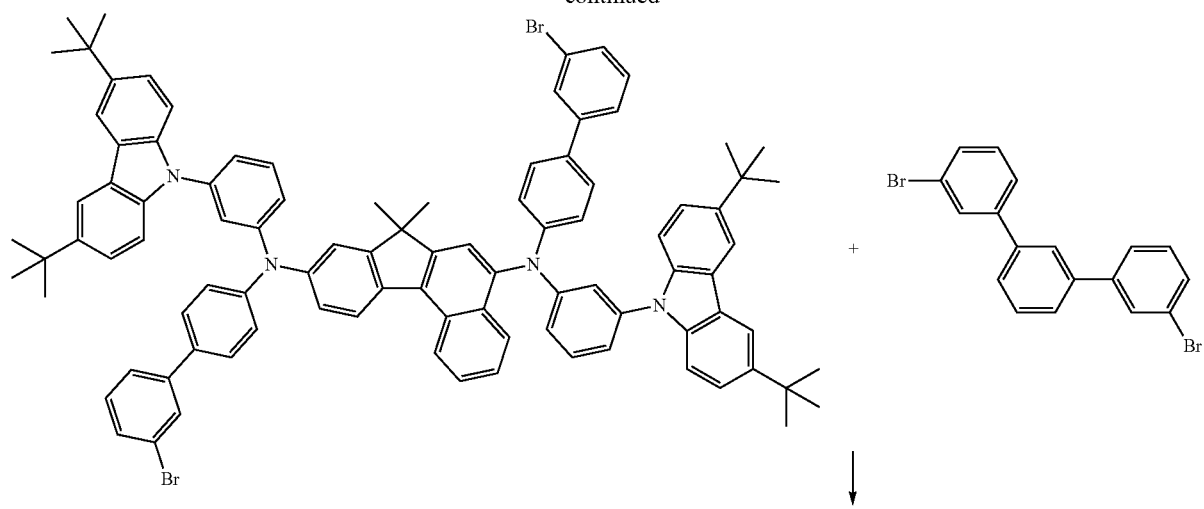
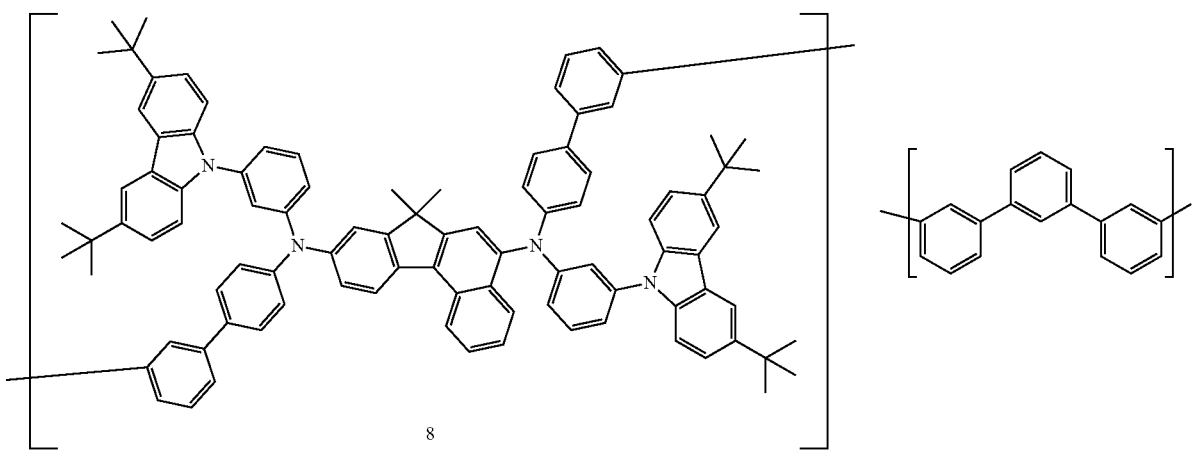
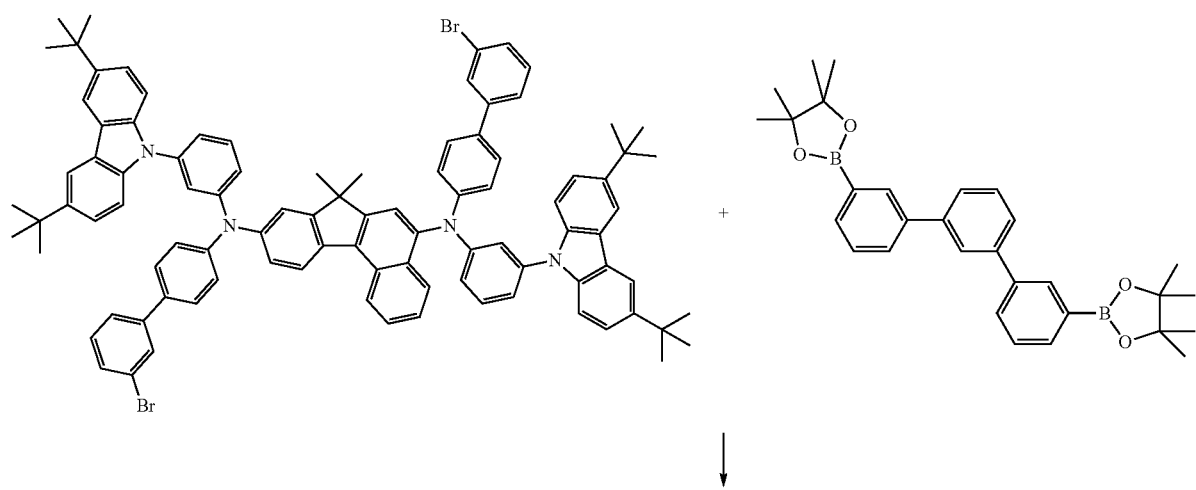

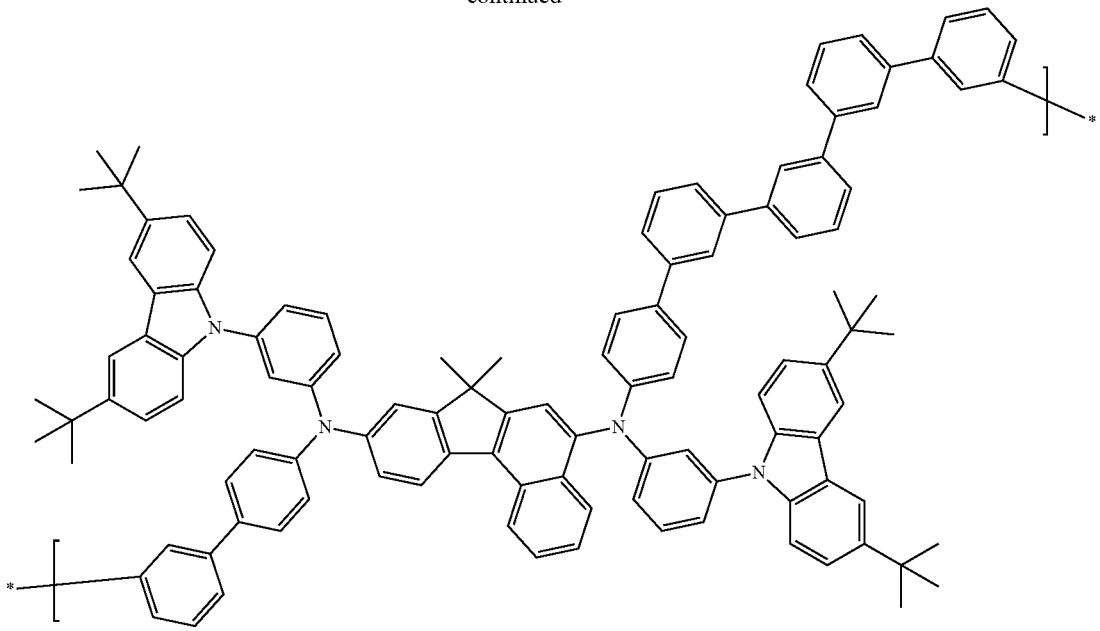

9

3,3"-Dibromo-1,1':3,1"-terphenyl, Intermediate

3-Bromo-3'-iodo-1,1'-biphenyl (3.3 g, 9.19 mmole), 3-bromophenylboronic acid (1.85 g, 9.19 mmole), Pd(PPh$_3$)$_4$ (0.53 g, 0.46 mmole), Cs$_2$CO$_3$ (14.8 g, 45.6 mmole) and toluene (100 ml) were heated at 80° C. overnight under nitrogen atmosphere and then second portion of 3-bromophenylboronic acid (0.85 g, 4.25 mmole) was added and the mixture heated at 100° C. for additional ca. 6-8 hours until consumption of starting bromoiodobiphenyl by UPLC. The reaction mixture was cooled down to ambient temperature and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using hexanes as an eluent. All fractions containing the product combined, eluent evaporated. Purity by UPLC>99.7%. Yield of 3,3"-Dibromo-1,1':3,1"-terphenyl, 2.22 g (5.72 mmole, 62%). $^1$H-NMR (CDCl$_3$, 500 MHz): 7.33 (t, 2H, J=8 Hz), 7.50-7.57 (m, 7H), 7.71 (t, 1H, J=2 Hz), 7.78 (t, 2H, J=2 Hz). MS: MH+=388.

3,3"-bis-(1,2,3-dioxaborolane-4,4,5,5-tetramethyl-5'-yl)-1,1':3',1"-terphenyl, Intermediate 3,3"-Dibromo-1,1':3,1"-terphenyl (1.8 g, 4.64 mmole), bis(pinacolato)diboron (2.59 g, 10.2 mmole), dichloro(1,1'-bis(diphenylphosphino)ferrocene)palladium(II) Cl$_2$Pd (dppf) (0.34 g, 0.46 mmole), potassium acetate (2.73 g, 27.84 mmole) and 1,4-dioxane (100 ml) were heated at 100° C. overnight under nitrogen atmosphere. The reaction mixture was cooled down to ambient temperature and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using mixtures of hexanes and dichloromethane as eluent. All fractions containing the product combined, eluent evaporated, the residue redissolved in toluene and precipitated into methanol. Yield of 3,3"-bis-(1,2,3-dioxaborolane-4,4,5,5-tetramethyl-5'-yl)-1,1':3',1"-terphenyl, 1.31 g (2.72 mmole, 59%). $^1$H-NMR (CDCl$_3$, 500 MHz): 1.37 (s, 24H), 7.46-7.50 (m, 3H), 7.59 (d, 2H, J=8 Hz), 7.75 (d, 2H, J=8 Hz), 7.81 (d, 2H, J=8 Hz), 7.84 (br s, 1H), 8.08 (s 2H). MS: MH+=484.

Copolymerization of Monomer 3 with 3,3"-dibromo-1,1':3,1"-terphenyl to Form Copolymer 8

A mixture of bis(1,5-cyclooctadiene)nickel (0.77 g, 2.8 mmole), 2,2'-dipyridyl (0.437 g, 2.8 mmole) and 1,5-cyclooctadiene (0.302 g, 2.8 mmole) in toluene (9.5 ml) and dimethylformamide (4.8 ml) was stirred at 60° C. for 45 minutes under nitrogen atmosphere. After that a solution of N,N'-bis(3-(2,6-di-tert-butylcarbazolyl))-N,N'-bis(-4'-bromo-2-ethyl-biphenyl)-7,7-dimethylbenzofluorene (0.5 g, 0.347 mmole) and 3,3"-dibromo-1,1':3,1"-terphenyl (0.148 g, 0.334 mmole) in anhydrous toluene (9.5 ml) was added at once and the reaction mixture was stirred at 60° C. for 3 hours. After that reaction mixture was poured into methanol (300 ml) containing conc. hydrochloric acid (15 ml) and stirred for 30 min. Precipitate filtered (crude yield 650 mg), dissolved in toluene and passed through a column filled with layers of silica gel and basic alumina washing with toluene. Solvent evaporated on rotary evaporator, the residue redissolved in toluene and fractionated by addition of acetone. Solution decanted and solids were dissolved in toluene and precipitated into methanol to give 0.06 g of copolymer 8. GPC (THF): Mw=86400 Da, PDI=2.34.

Copolymerization of Monomer 3 with 3,3"-Bis-(1,2,3-Dioxaborolane-4,4,5,5-Tetramethyl-5'-Yl)-1,1':3',1"-Terphenyl to Form Copolymer 9

A mixture of 3,3"-bis-(1,2,3-dioxaborolane-4,4,5,5-tetramethyl-5'-yl)-1,1':3',1"-terphenyl (0.178 g, 0.367 mmole), N,N'-bis(3-(2,6-di-tert-butylcarbazolyl))-N,N'-bis(-3'-bromobiphenyl)-7,7-dimethylbenzofluorene monomer 3 (0.53 g, 0.367 mmole), Pd$_2$(dba)$_3$ (0.034 g, 0.018 mmole), tri-tert-butylphosphine (0.014 g, 0.037 mmole), Cs$_2$CO$_3$ (1.19 g, 3.67 mmole) and toluene (50 ml) were heated at 100° C. overnight under nitrogen atmosphere. After that mixture was cooled to room temperature, diluted with toluene (100 ml) and passed through a filter filled with basic alumina and silica washing with toluene. Toluene evaporated, the residue dissolved in toluene (10 ml) and precipitated into methanol to give 0.39 g of the product. Subsequent fractionation using toluene and acetone afforded polymeric fraction. GPC of crude material (THF): Mw=7000 Da, PDI=2.69.

Synthesis Example 5

This example illustrates the preparation of compounds having Formula I, Monomer 11 and Polymer 12.

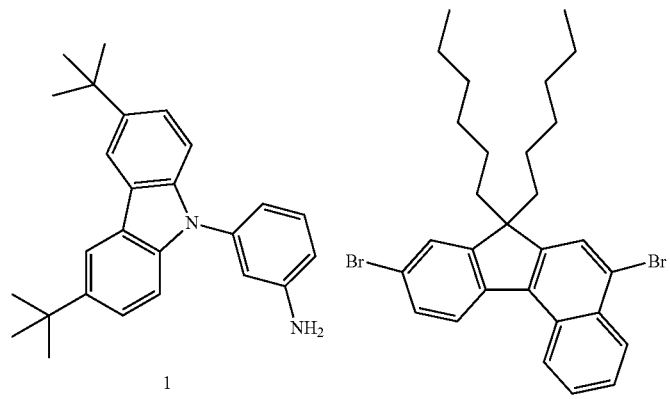

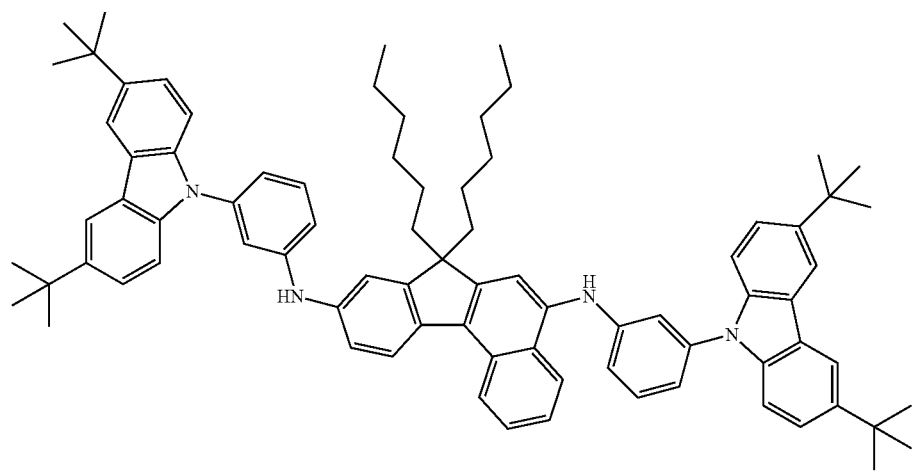

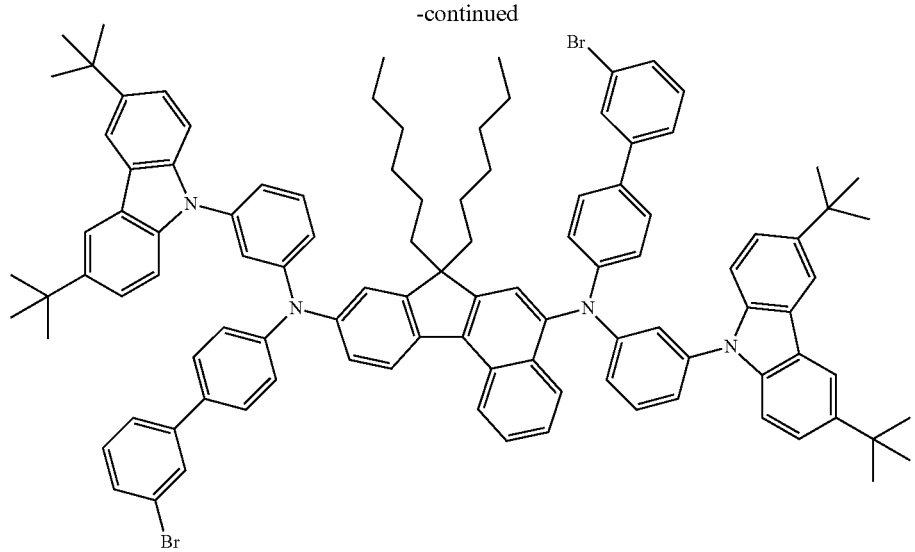

11

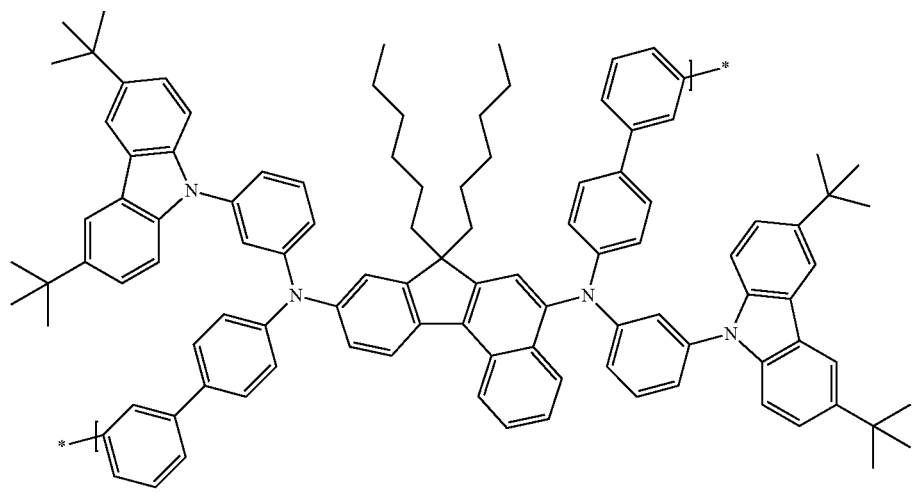

12

N,N'-Bis(N-3-(2,6)-di-tert-butylcarbazolyl)phenyl-7,7-dihexylbenzofluorene, Intermediate 10

5,9-Dibromo-7,7-dihexyl-7H-benzo[c]fluorene (4.62 g, 8.52 mmole), N-(3-aminophenyl)-2,6-di-tert-butylcarbazole Intermediate 1 (6.62 g, 17.9 mmole), $Pd_2(dba)_3$ (0.468 g, 0.51 mmole), tri-tert-butyl-phosphine (0.206 g, 1.02 mmole) and toluene (200 ml) were added to 250 mL round bottom reaction flask at room temperature under nitrogen atmosphere. After that sodium tert-butoxide (1.8 g, 18.74 mmole) was added to the mixture and the resulting suspension stirred at room temperature for 5 min, then heated to 33° C. overnight. The reaction mixture was cooled down to ambient temperature, water (100 ml) added and mixture was stirred in the air for 30 min. After that organic layer was separated and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using mixture of hexanes and dichloromethane as eluent. All fractions containing the product combined, eluent evaporated to afford 7.32 g of crude product. The product was redissolved in toluene and precipitated portion wise by addition of methanol. Yield— 4.79 g (4.27 mmole, 50%) of N,N'-bis-(N-3-(2,6-di-tert-butylcarbazolyl)phenyl-7,7-dihexylbenzofluorene 10 with purity 99.2% by UPLC. Product photodecomposes in chloroform-d1. The product was used for the next step without further purification.

N,N'-Bis(3-(2,6-di-tert-butylcarbazolyl))-N,N'-bis(3'-bromobiphenyl)-7,7-dihexylbenzofluorene, Intermediate 11

Bis-(N-3-(2,6-di-tert-butylcarbazolyl)phenyl-7,7-dihexylbenzofluorene, Intermediate 10 (2.0 g, 1.78 mmole), 3-bromo-4'-iodobiphenyl (1.92 g, 5.34 mmole), Pd$_2$(dba)$_3$ (0.004 g, 0.0045 mmole), 1,1'-bis(diphenylphosphino)ferrocene (0.005 g, 0.009 mmole) and toluene (100 ml) were added to 250 mL round bottom reaction flask at room temperature under nitrogen atmosphere. After that sodium tert-butoxide (0.51 g, 5.34 mmole) was added to the mixture and the resulting suspension stirred at room temperature for 5 min, then heated to 110° C. overnight. After that another portion of Pd$_2$(dba)$_3$ (0.004 g, 0.0045 mmole), 1,1'-bis(diphenylphosphino)ferrocene (0.005 g, 0.009 mmole) were added and the mixture stirred at 110° C. for an additional 24 hours until complete conversion by UPLC. The reaction mixture was cooled down to ambient temperature, water (100 ml) added and mixture was stirred in the air for 30 min. After that organic layer was separated and passed through a filter filled with layers of celite, florisil and silica gel washing with toluene (100 mL). Solvent was removed on rotary evaporator, the residue was redissolved in dichloromethane, evaporated onto celite and subjected to separation on silica gel column using mixtures of hexanes and dichloromethane as eluent. Column chromatography was repeated consecutively on silica gel and basic alumina. Fractions containing product with purity >99.6% by UPLC combined, eluent evaporated, the residue redissolved in toluene and precipitated into methanol to afford 1.62 g of N,N'-bis(3-(2,6-di-tert-butylcarbazolyl))-N,N'-bis(3'-bromobiphenyl)-7,7-dihexylbenzofluorene, Monomer 11. Less pure fractions (>95%) of the desired product combined to give additional 0.92 g. Photodecomposition in chloroform-d$_1$. MS: (MH−2t−Bu)+=1472.

Polymerization of Monomer 11 to Form Polymer 12.

A mixture of bis(1,5-cyclooctadiene)nickel (0.228 g, 0.829 mmole), 2,2'-dipyridyl (0.129 g, 0.829 mmole) and 1,5-cyclooctadiene (0.09 g, 0.829 mmole) in toluene (8.2 ml) and dimethylformamide (4.1 ml) was stirred at 60° C. for 45 minutes under nitrogen atmosphere. After that a solution of N,N'-bis(3-(2,6-di-tert-butylcarbazolyl))-N,N'-bis(3'-bromobiphenyl)-7,7-dihexylbenzofluorene (0.65 g, 0.41 mmole) in anhydrous toluene (8.2 ml) was added at once and the reaction mixture was stirred at 60° C. for 3 hours. After that reaction mixture was poured into methanol (200 ml) containing conc. hydrochloric acid (10 ml) and stirred for 1 hour. Precipitate filtered, dissolved in toluene and passed through a column filled with layers of silica gel and basic alumina washing with toluene. Solvent evaporated on rotary evaporator, the residue redissolved in toluene and fractionated by addition of acetone. Solution decanted and used to recover oligomeric fraction (yield, 173 mg) whereas solid polymeric fraction (yield after first fractionation, 182 mg) were fractionated one time more using toluene and acetone and the resulting solids dissolved in toluene and precipitated into methanol to give 0.101 g of polymer 12: $^1$H-NMR (CDCl$_3$, 500 MHz): 0.60, 0.88 and 1.87 (br. s, 26H), 1.38 and 1.41 (s, 32H), 7.03-7.72 (m, 35H), 7.79 (d, 1H, J=8.5 Hz), 7.83 (d, 1H, J=8.5 Hz), 8.02 (s, 2H), 8.08 (s, 2H), 8.17 (d, 1H, J=8 Hz), 8.27 (br. s, 1H), 8.79 (d, 1H, J=7.5 Hz). GPC (THF): Mw=308900 Da, PDI=1.69. Oligomer 12: composition by UPLC/MS: dimer (33.4%), MH+=2846.6, trimer (18.6%), MH+=4272.3 and peaks that can be attributed to higher molecular weight oligomers.

Synthesis Example 6

This example illustrates the preparation of a monomer having Formula I, Monomer 14, and a polymer having Formula I, Polymer 14.

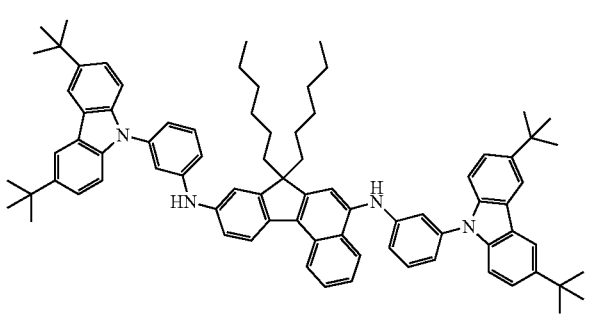

10

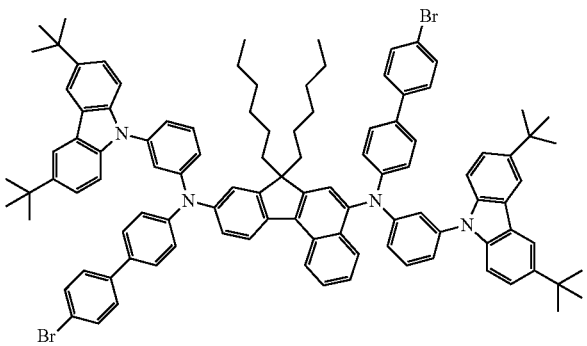

13

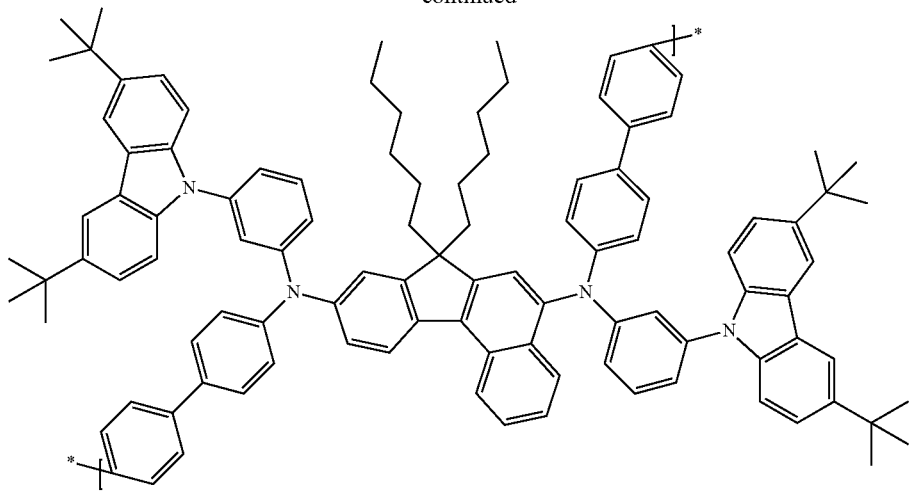

14

N,N'-Bis(3-(2,6-di-tert-butylcarbazolyl))-N,N'-bis(4'-bromobiphenyl)-7,7-dihexylbenzofluorene, Monomer 13

Bis-(N-3-(2,6-di-tert-butylcarbazolyl)phenyl-7,7-dihexylbenzofluorene Intermediate 10 (2.0 g, 1.78 mmole), 4'-bromo-4-iodobiphenyl (1.92 g, 5.34 mmole), Pd$_2$(dba)$_3$ (0.016 g, 0.0178 mmole), 1,1'-bis(diphenylphosphino)ferrocene (0.020 g, 0.0356 mmole) and toluene (100 ml) were added to 250 mL round bottom reaction flask at room temperature under nitrogen atmosphere. After that sodium tert-butoxide (0.51 g, 5.34 mmole) was added to the mixture and the resulting suspension stirred at room temperature for 5 min, then heated to 110° C. overnight until complete conversion by UPLC. The reaction mixture was cooled down to ambient temperature, water (100 ml) added and mixture was stirred in the air for 30 min. After that organic layer was separated and passed through a filter filled with layers of celite, florisil and silica gel washing with toluene (100 mL). Solvent was removed on rotary evaporator, the residue was redissolved in dichloromethane, evaporated onto celite and subjected to separation on basic alumina column using mixtures of hexanes and dichloromethane as eluent. Fractions containing product with purity >99.5% by UPLC combined, eluent evaporated, the residue redissolved in toluene and fractionally precipitated with minimal amount of methanol to afford fractions with purity 99.5% and above (yield, 1.41 totally) of N,N'-bis(3-(2,6-di-tert-butylcarbazolyl))-N,N'-bis(4'-bromobiphenyl)-7,7-dihexylbenzofluorene, Monomer 13. Less pure fractions (>92%) of the desired product combined to give additional 1.15 g. Photodecomposition in chloroform-d$_1$. MS: (MH−2t−Bu)+=1472.

Polymerization of Monomer 13 to Form Polymer 14.

A mixture of bis(1,5-cyclooctadiene)nickel (0.211 g, 0.77 mmole), 2,2'-dipyridyl (0.120 g, 0.77 mmole) and 1,5-cyclooctadiene (0.083 g, 0.77 mmole) in toluene (8.2 ml) and dimethylformamide (4.1 ml) was stirred at 60° C. for 45 minutes under nitrogen atmosphere. After that a solution of N,N'-bis(3-(2,6-di-tert-butylcarbazolyl))-N,N'-bis(4'-bromobiphenyl)-7,7-dihexylbenzofluorene Monomer 13 (0.6 g, 0.38 mmole) in anhydrous toluene (8.2 ml) was added at once and the reaction mixture was stirred at 60° C. for 3 hours. After that reaction mixture was poured into methanol (200 ml) containing conc. hydrochloric acid (10 ml) and stirred for 1 hour. Precipitate filtered, dissolved in toluene and passed through a column filled with layers of silica gel and basic alumina washing with toluene. Solvent evaporated on rotary evaporator, the residue dissolved in toluene and fractionated by addition of acetone. Solids redissolved in toluene and precipitated into methanol to give 0.28 of crude polymer (GPC (THF): Mw=634500 Da, PDI=8.2). Crude polymer was dissolved in toluene and was subjected to fractionation (2 times consecutively) by adding minimal amount of acetone. Supernatant decanted and used to recover lower molecular weight fraction whereas gummy residue was redissolved in toluene and precipitated into methanol to afford 0.13 g of very high molecular weight fraction of polymer 14. Lower molecular weight fraction (yield, 50 mg) was recovered by adding more acetone to supernatant, collecting solid product, redisolving it in toluene and precipitating into methanol. Very high Mw Polymer 14: $^1$H-NMR (CDCl$_3$, 500 MHz): 0.64, 0.85, 0.94 and 1.88 (br. s, 26H), 1.41 and 1.43 (s, 32H), 7.05-7.80 (m, 37H), 8.03 (s, 2H), 8.09 (s, 2H), 8.17 (d, 1H, J=8.5 Hz), 8.28 (br. s, 1H), 8.79 (d, 1H, J=7 Hz). GPC (THF): Mw=1001300 Da, PDI=1.72. Lower Mw polymer 14: GPC (THF): Mw=369400 Da, PDI=1.72.

Synthesis Example 7

This example illustrates the preparation of a copolymer having Formula V, Copolymer 15, and oligomer 15.

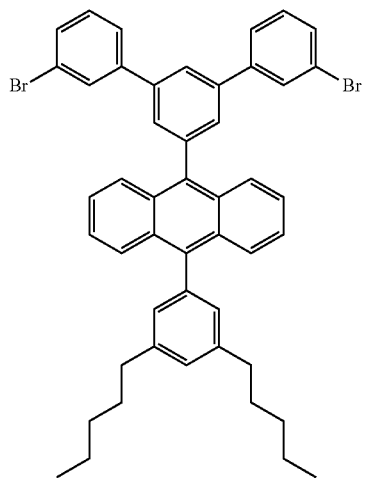
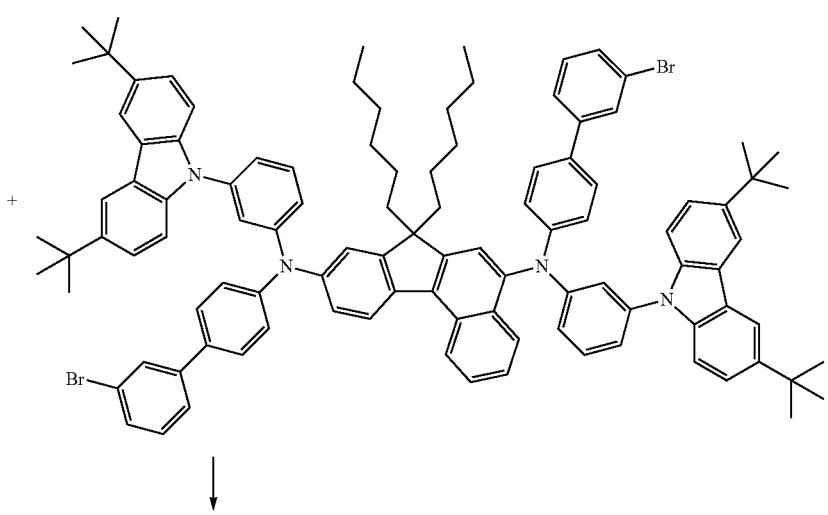

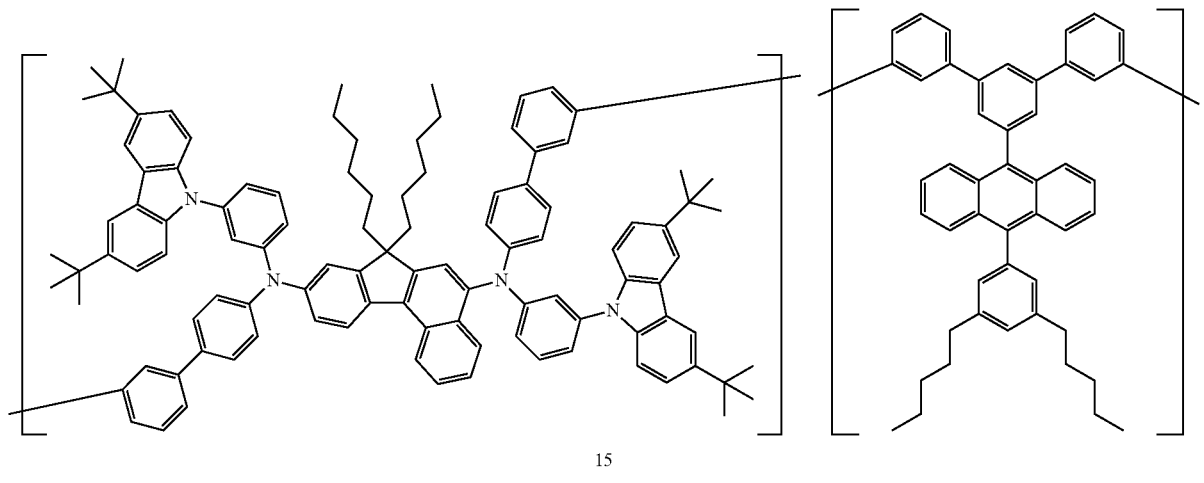

15

Copolymerization of Monomer 13 with Anthracene Comonomer to Form Polymer 15; Oligomer 15.

A mixture of bis(1,5-cyclooctadiene)nickel (0.496 g, 1.802 mmole), 2,2'-dipyridyl (0.281 g, 1.802 mmole) and 1,5-cyclooctadiene (0.195 g, 1.802 mmole) in toluene (19.2 ml) and dimethylformamide (9.6 ml) was stirred at 60° C. for 45 minutes under nitrogen atmosphere. After that a solution of N,N'-bis(3-(2,6-di-tert-butylcarbazolyl))-N,N'-bis(3'-bromobiphenyl)-7,7-dihexylbenzofluorene monomer 11 (0.141 g, 0.089 mmole) and 9-[(2,2'-dibromo-1,1':3',1''-terphenyl)-5-yl]-10-(3,5-bispentyl)phenyl-anthracene (0.627 g, 0.803 mmole) in anhydrous toluene (19.2 ml) was added at once and the reaction mixture was stirred at 60° C. for 3 hours. After that reaction mixture was poured into methanol (300 ml) containing conc. hydrochloric acid (15 ml) and stirred for 1 hour. Precipitate filtered, dissolved in toluene and passed through a column filled with layers of silica gel and basic alumina washing with toluene. Solvent evaporated on rotary evaporator, the residue dissolved in toluene and fractionated by addition of acetone. Solids redissolved in toluene and precipitated into methanol to give 68 mg of polymer. Oligomeric fraction (yield, 220 mg) was isolated by distilling solvents from supernatant, redissolving solid residue in toluene and precipitating it into methanol. Copolymer 15: GPC (THF): peak 1: Mw=11700 Da, PDI=1.56; peak 2: Mw=1500 Da, PDI=1.1. Oligomer 15: composition by UPLC/MS: anthracene dimer (17.4%), MH+=1241.6; anthracene-benzofluorene dimer (9.5%), MH+=2045; anthracene trimer (18.2%), MH+=1862.9; bisanthracene-benzofluorene trimer (8.8%), MH+=2666.2.

Synthesis Example 8

This example illustrates the preparation of a copolymer having Formula V, Copolymer 16.

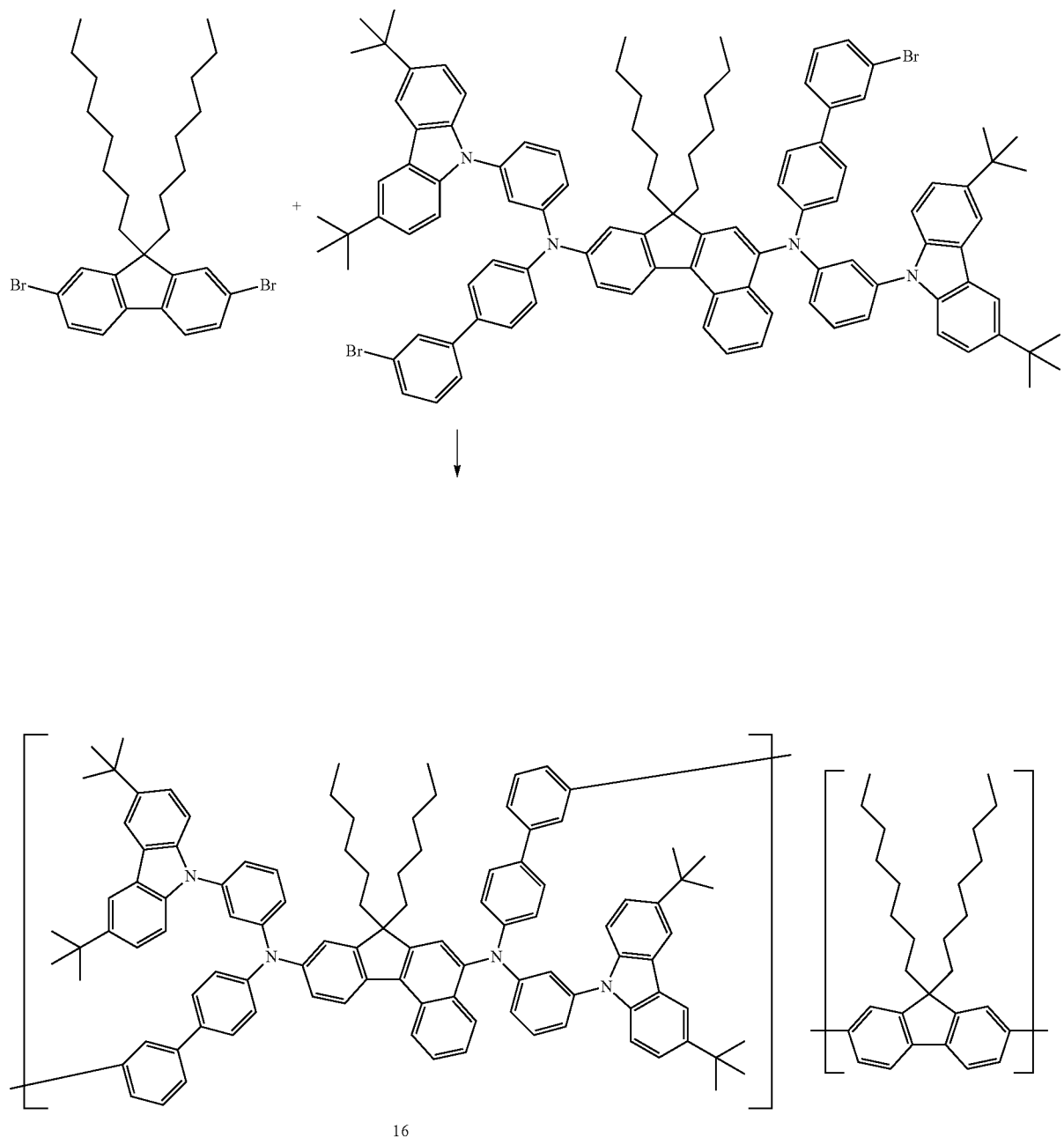

16

Copolymerization of Monomer 11 with bis-9,9-octyl-fluorene Comonomer to Form Copolymer 16.

A mixture of bis(1,5-cyclooctadiene)nickel (0.496 g, 1.802 mmole), 2,2'-dipyridyl (0.281 g, 1.802 mmole) and 1,5-cyclooctadiene (0.195 g, 1.802 mmole) in toluene (19.2 ml) and dimethylformamide (9.6 ml) was stirred at 60° C. for 45 minutes under nitrogen atmosphere. After that a solution of N,N'-bis(3-(2,6-di-tert-butylcarbazolyl))-N,N'-bis(3'-bromobiphenyl)-7,7-dihexylbenzofluorene monomer 11 (0.141 g, 0.089 mmole) and 2,7-dibromo-9,9-dioctyl-fluorene (0.44 g, 0.803 mmole) in anhydrous toluene (19.2 ml) was added at once and the reaction mixture was stirred at 60° C. for 3 hours. After that reaction mixture was poured into methanol (300 ml) containing conc. hydrochloric acid (15 ml) and stirred for 1 hour. Precipitate filtered, dissolved in toluene and passed through a column filled with layers of silica gel and basic alumina washing with toluene. Solvent evaporated on rotary evaporator, the residue dissolved in toluene and fractionated by addition of acetone. Solids redissolved in toluene and precipitated into methanol to give 160 mg of copolymer 16: GPC (THF): Mw=440000 Da, PDI=1.93. UV-vis (toluene), lambda$_{max}$: 383, 433 (sh) nm. Photoluminescence (toluene): lambda$_{max}$: 414 (sh), 450 nm.

Synthesis Example 9

This example illustrates the preparation of a compound having Formula IV, Copolymer 17.

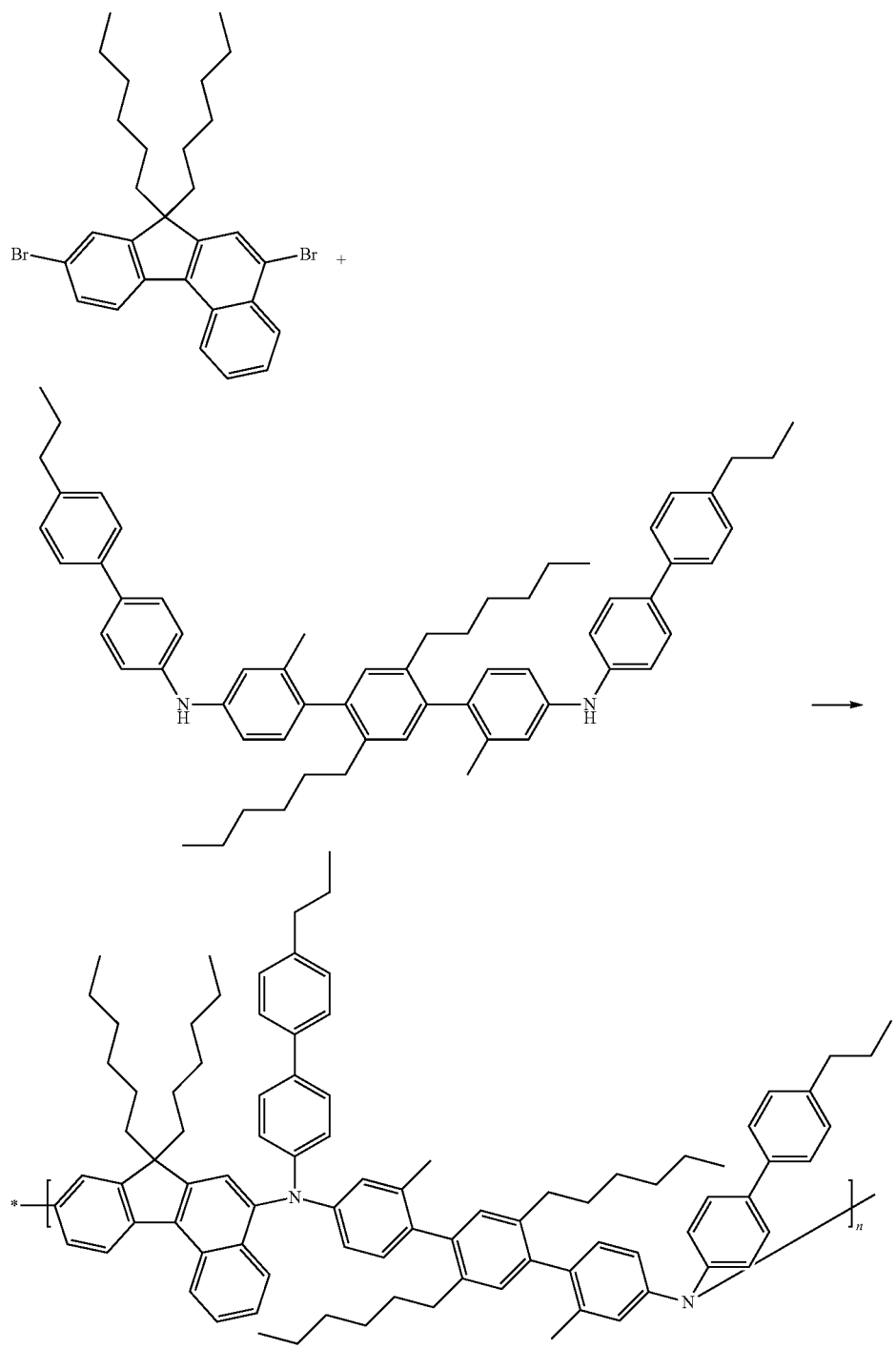

Copolymer 17.

A mixture of 5,9-dibromo-7,7-dihexyl-7H-benzo[c]fluorene (1.0 g, 1.85 mmole), 4,4'''-diamino-4,4''-bis(4'propylbiphenyl)-3,3'''-dimethyl-6',6'-dihexyl-1,1',4',1''terphenyl (1.56 g, 1.85 mmole), Pd$_2$(dba)$_3$ (0.17 g, 0.185 mmole), tri-tert-butylphosphine (0.074 g, 0.37 mmole) and toluene (150 ml) were heated at 100° C. overnight under nitrogen atmosphere. After that sodium tert-butoxide (0.39 g, 4.07 mmole) was added to the mixture and the resulting suspension stirred at room temperature for 5 min, then heated to 100° C. overnight. More Pd$_2$(dba)$_3$ (0.17 g, 0.185 mmole), tri-tert-butylphosphine (0.074 g, 0.37 mmole) added to the reaction mixture and heating continued for additional 24 hours followed by addition of the same amount of catalyst and ligand and 4-bromobiphenyl (0.3 g, 1.29 mmole) and heating for 6 hours at the same temperature. The reaction mixture was cooled down to ambient temperature, water (100 ml) added and mixture was stirred in the air for 30 min.

After that mixture was cooled to room temperature, diluted with toluene (100 ml) and passed through a filter filled with celite, basic alumina and silica washing with toluene. Toluene evaporated, the residue fractionated by using toluene-acetone, solids redissolved in toluene and precipitated into methanol to give 0.98 g of Copolymer 17. $^1$H-NMR (CDCl$_3$, 500 MHz): 0.51-1.31 (m, 44H), 1.34-1.77 (m, 10H), 1.80-2.12 (m, 10H), 2.22-2.76 (m, 8H), 6.90-7.59 (m, 27H), 8.16 (br. s, 3H), 8.73 (br. s, 2H). GPC (THF): Mw=62200 Da, PDI=2.41.

Device Examples (1) Materials
Add-1 is an additive which is an aromatic compound having no heteroatoms.
ET-1 is shown below

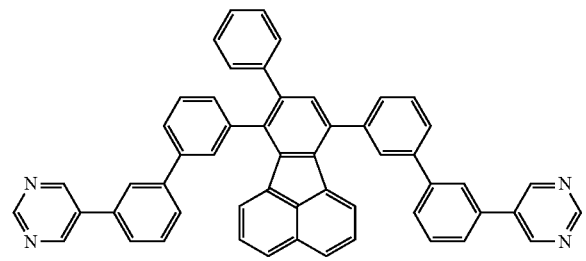 [SMILES: c1ccc(-c2cc(-c3cccc(-c4cccc(-c5cncnc5)c4)c3)c3c(c2-c2cccc(-c4cccc(-c5cncnc5)c4)c2)-c2cccc4cccc-3c24)cc1]

ET-2 is lithium quinolate.
HIJ-1 is a hole injection material which is made from an aqueous dispersion of an electrically conductive polymer and a polymeric fluorinated sulfonic acid. Such materials have been described in, for example, U.S. Pat. No. 7,351,358.
Host H1 is a deuterated anthracene compound.
HTM-1 is a hole transport material which is a triarylamine polymer. Such materials have been described in, for example, published US Application 2013-0082251.

(2) Device Fabrication
OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a toluene solution of HT-1, and then heated to remove solvent. After cooling the substrates were spin-coated with a methyl benzoate solution of the host and dopant, and heated to remove solvent. The substrates were masked and placed in a vacuum chamber. A layer of electron transport material was deposited by thermal evaporation, followed by a layer of electron injection material. Masks were then changed in vacuo and a layer of Al was deposited by thermal evaporation. The chamber was vented, and the devices were encapsulated using a glass lid, dessicant, and UV curable epoxy.

(3) Device Characterization
The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The color coordinates were determined using either a Minolta CS-100 meter or a Photoresearch PR-705 meter.

Device Examples

Examples 1-3

These examples illustrate the use of Polymer 4 and Oligomer 4 from Synthetic Example 1 as the photoactive material in a device. The device results are given in Table 1. Device Structure, in Order (all Percentages are by Weight, Based on the Total Weight of the Layer):
Glass substrate
Anode: ITO (50 nm)
Hole injection layer: HIJ-1 (100 nm)
Hole transport layer: 8:2 weight ratio of HTM-1:Add-1 (105 nm)
Photoactive layer:
Ex. 1=7 wt % of Polymer 4+93 wt % of host H1 (38 nm);
Ex. 2=7 wt % of Oligomer 4+93 wt % of host H1 (38 nm);
Ex. 3=12 wt % of Oligomer 4+88 wt % of host H1 (38 nm);
Electron transport layer: ET-1 (20 nm)
Electron injection layer: ET-2 (3.8 nm)
Cathode: Al (100 nm)

TABLE 1

| | Device results | | | | |
|---|---|---|---|---|---|
| Example | CE (Cd/A) | EQE (%) | CIE x | CIE y | Voltage @ 15 mA/cm$^2$ |
| 1 | 4.8 | 5.9 | 0.141 | 0.089 | 4.8 |
| 2 | 4.7 | 5.8 | 0.142 | 0.090 | 5.1 |
| 3 | 4.8 | 5.8 | 0.142 | 0.090 | 5.1 |

All measurements are at 1000 nits unless otherwise specified; CE is the current efficiency; EQE=external quantum efficiency; CIEx and CIEy are the x and y color coordinates according to the C.I.E. chromaticity scale (Commission Internationale de L'Eclairage, 1931).

Examples 4-6

These examples illustrate the use of Polymer 6 as the photoactive material in a device. The device results are given in Table 2.
Device Structure, in Order (all Percentages are by Weight, Based on the Total Weight of the Layer):
Glass substrate
Anode: ITO (50 nm)
Hole injection layer: HIJ-1 (100 nm)

Hole transport layer: 8:2 weight ratio of HTM-1:Add-1 (105 nm)
Photoactive layer:
Ex. 4=7 wt % of Polymer 6+93 wt % of host H1 (38 nm);
Ex. 5=5 wt % of Polymer 6+95 wt % of host H1 (38 nm);
Ex. 4=10 wt % of Polymer 6+90 wt % of host H1 (38 nm);
Electron transport layer: ET-1 (20 nm)
Electron injection layer: ET-2 (3.8 nm)
Cathode: Al (100 nm)

TABLE 2

Device results

| Example | CE (Cd/A) | EQE (%) | CIE x | CIE y | Voltage @ 15 mA/cm$^2$ |
|---|---|---|---|---|---|
| 4 | 3.7 | 4.9 | 0.143 | 0.083 | 4.8 |
| 5 | 3.5 | 4.7 | 0.144 | 0.080 | 5.0 |
| 6 | 3.9 | 5.1 | 0.142 | 0.087 | 4.8 |

All measurements are at 1000 nits unless otherwise specified; CE is the current efficiency; EQE=external quantum efficiency; CIEx and CIEy are the x and y color coordinates according to the C.I.E. chromaticity scale (Commission Internationale de L'Eclairage, 1931).

Example 7

This example illustrates the use of Copolymer 7 as the photoactive material in a device. The device results are given in Table 3.
Device Structure, in Order (all Percentages are by Weight, Based on the Total Weight of the Layer):
Glass substrate
Anode: ITO (50 nm)
Hole injection layer: HIJ-1 (100 nm)
Hole transport layer: HTM-1 (105 nm)
Photoactive layer: 7 wt % of Copolymer 7+93 wt % of host H1 (38 nm);
Electron transport layer: ET-1 (20 nm)
Electron injection layer: ET-2 (3.8 nm)
Cathode: Al (100 nm)

TABLE 3

Device results

| Example | CE (Cd/A) | EQE (%) | CIE x | CIE y | Voltage @ 15 mA/cm$^2$ |
|---|---|---|---|---|---|
| 7 | 3.3 | 4.2 | 0.141 | 0.089 | 5.0 |

All measurements are at 1000 nits unless otherwise specified; CE is the current efficiency; EQE=external quantum efficiency; CIEx and CIEy are the x and y color coordinates according to the C.I.E. chromaticity scale (Commission Internationale de L'Eclairage, 1931).

Examples 8-16

These examples illustrate the use of various oligomers and polymers having Formula I as the photoactive material in a device. The materials are given in Table 4. The device results are given in Table 5.
Device Structure, in Order (all Percentages are by Weight, Based on the Total Weight of the Layer):
Glass substrate
Anode: ITO (50 nm)
Hole injection layer: HIJ-1 (100 nm)
Hole transport layer: 8:2 weight ratio of HTM-1:Add-1 (105 nm)
Photoactive layer: given in Table 4 (38 nm)
Electron transport layer: ET-1 (20 nm)
Electron injection layer: ET-2 (3.8 nm)
Cathode: Al (100 nm)

TABLE 4

| | Photoactive Layer | | |
|---|---|---|---|
| Example | Photoactive Material | Host | Ratio |
| 8 | Polymer 12 | H1 | 12:88 |
| 9 | Polymer 12 | H1 | 7:93 |
| 10 | Polymer 12 | H1 | 9:91 |
| 11 | Polymer 14 (high MW) | H1 | 7:98 |
| 12 | Polymer 14 (high MW) | H1 | 9:91 |
| 13 | Polymer 14 (high MW) | H1 | 12:88 |
| 14 | Oligomer 15 | H1 | 7:93 |
| 15 | Oligomer 15 | H1 | 17:83 |
| 16 | Copolymer 15 | H1 | 7:93 |

Ratio = Photoactive material:Host, by weight

TABLE 5

Device results

| Example | CE (Cd/A) | EQE (%) | CIE x | CIE y | Voltage @ 15 mA/cm$^2$ |
|---|---|---|---|---|---|
| 8 | 5.0 | 6.1 | 0.138 | 0.093 | 5.6 |
| 9 | 4.5 | 5.7 | 0.139 | 0.089 | 5.5 |
| 10 | 4.8 | 5.9 | 0.138 | 0.092 | 5.5 |
| 11 | 4.8 | 5.0 | 0.132 | 0.115 | 4.8 |
| 12 | 4.9 | 4.7 | 0.130 | 0.127 | 5.2 |
| 13 | 5.0 | 4.6 | 0.128 | 0.138 | 5.1 |
| 14 | 4.0 | 5.2 | 0.141 | 0.083 | 5.3 |
| 15 | 4.0 | 5.3 | 0.141 | 0.083 | 5.5 |
| 16 | 4.0 | 5.2 | 0.142 | 0.079 | 5.1 |

All measurements are at 1000 nits unless otherwise specified; CE is the current efficiency; EQE=external quantum efficiency; CIEx and CIEy are the x and y color coordinates according to the C.I.E. chromaticity scale (Commission Internationale de L'Eclairage, 1931).

Example 17

This example illustrates the use of Copolymer 16 as the photoactive material in a device. The device results are given in Table 6.
Device Structure, in Order (all Percentages are by Weight, Based on the Total Weight of the Layer):
Glass substrate
Anode: ITO (50 nm)
Hole injection layer: HIJ-1 (100 nm)
Hole transport layer: 8:2 weight ratio of HTM-1:Add-1 (105 nm)
Photoactive layer: 7 wt % Copolymer 16+93 wt % host H1 (25 nm)
Blocking layer: H1 (20 nm)
Electron transport layer: ET-1 (20 nm)
Electron injection layer: ET-2 (3.8 nm)
Cathode: Al (100 nm)

TABLE 6

| | Device results | | | | |
|---|---|---|---|---|---|
| Example | CE (Cd/A) | EQE (%) | CIE x | CIE y | Voltage @ 15 mA/cm² |
| 17 | 2.0 | 3.5 | 0.152 | 0.053 | 4.5 |

All measurements are at 1000 nits unless otherwise specified; CE is the current efficiency; EQE=external quantum efficiency; CIEx and CIEy are the x and y color coordinates according to the C.I.E. chromaticity scale (Commission Internationale de L'Eclairage, 1931).

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An electroactive material comprising compound having Formula I, Formula I-a, Formula II, Formula II-a, Formula III, Formula III-a, a copolymer having Formula IV or Formula IV-a, a polymer having at least one monomeric unit of Formula V, Formula V-a, or Formula V-b, or a copolymer having Formula VI

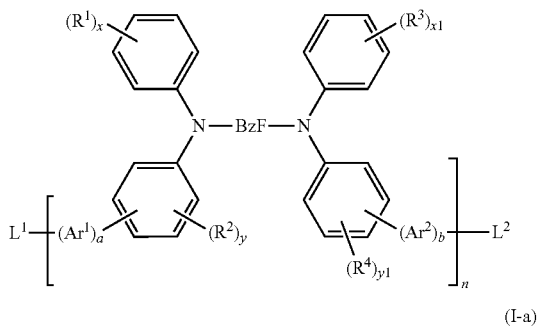

(I)

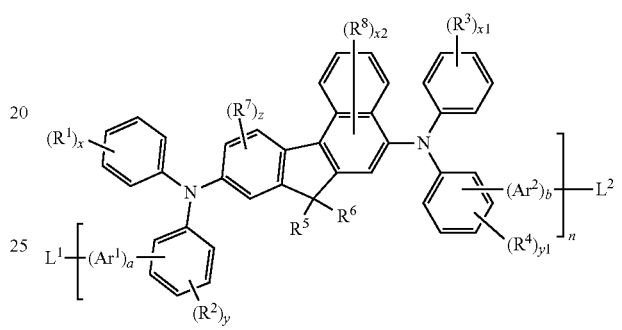

(I-a)

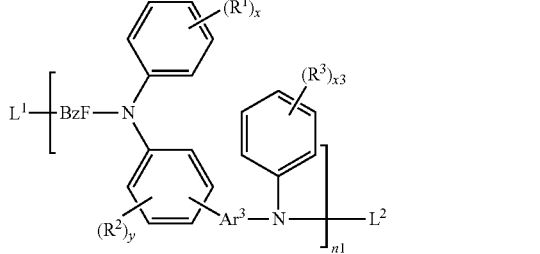

(II)

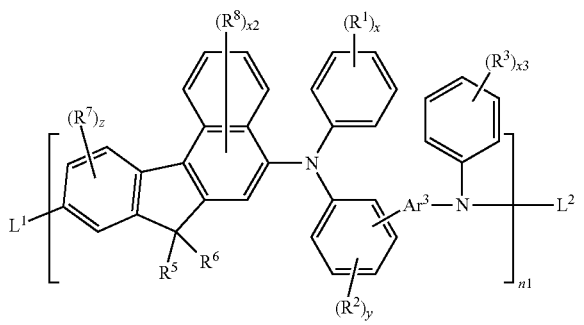

(II-a)

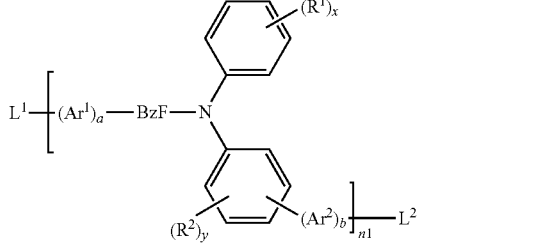

(III)

-continued (III-a)

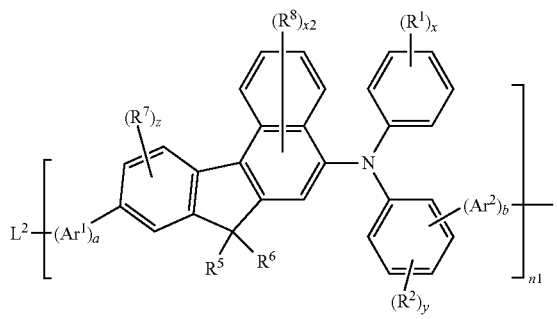

(IV)

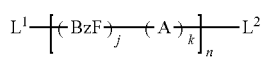

(IV-a)

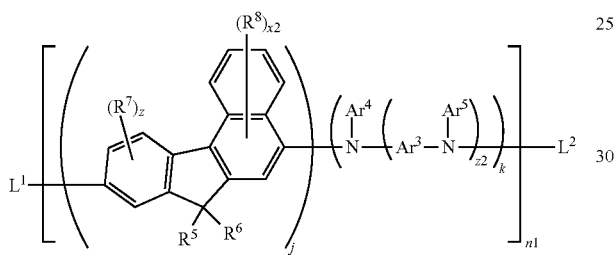

(V)

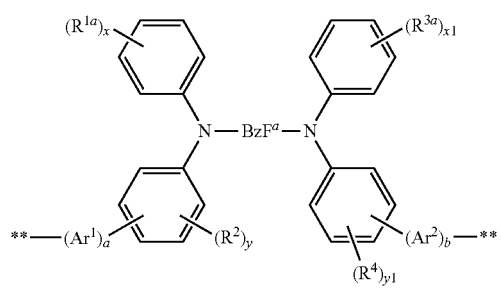

(V-a)

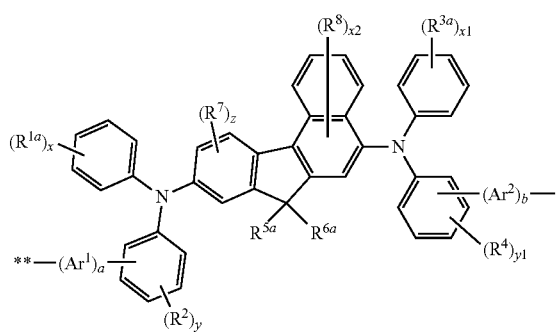

(V-b)

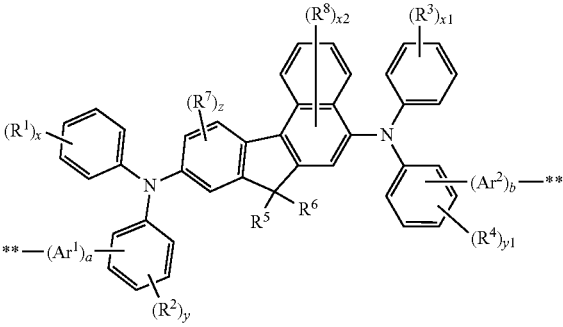

(VI)

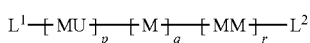

wherein:
$Ar^1$-$Ar^5$ are the same or different at each occurrence and are selected from the group consisting of hydrocarbon aryl, heteroaryl, and deuterated analogs thereof;
$L^1$ and $L^2$ are the same or different and are selected from the group consisting of H, D, halogen, aryl, arylamino, crosslinkable groups, deuterated aryl, deuterated arylamino, and deuterated crosslinkable groups;
MU is a monomeric unit having Formula V;
M is a conjugated moiety;
MM is a conjugated moiety;
$R^1$-$R^4$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from $R^1$-$R^4$ can be joined together to form a fused ring;
$R^{1a}$ and $R^{3a}$ are the same or different at each occurrence and are selected from the group consisting of a point of attachment to the copolymer, a hydrocarbon aryl group having a point of attachment to the copolymer, a heteroaryl group having a point of attachment to the copolymer, an alkyl group having a point of attachment to the copolymer, an alkylaryl group having a point of attachment to the copolymer, a deuterated hydrocarbon aryl group having a point of attachment to the copolymer, a deuterated heteroaryl group having a point of attachment to the copolymer, a deuterated alkyl group having a point of attachment to the copolymer, a deuterated alkylaryl group having a point of attachment to the copolymer, 0, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^{1a}$ and/or $R^{3a}$ groups can be joined together to form a fused ring; a and b are the same or different and are 0 or 1;

$R^5$ and $R^6$ are the same or different at each occurrence and are selected from the group consisting of alkyl, aryl, and deuterated analogs thereof, where two alkyl $R^5$ and $R^6$ groups can be joined together to make a cycloalkyl spiro ring, and where two $R^5$ and $R^6$ phenyl groups can be joined to form a spiro fluorene group;

j and k are non-zero mole fractions, where j+k=1;

p, q, and r are mole fractions such that p+q+r=1, where p and q are non-zero;

a is 0 or 1;

b is 0 or 1;

x and x1 are the same or different and are an integer from 0-5;

y and y1 are the same or different and are an integer from 0-4;

n and n1 are integers of 2 or greater;

** indicates a point of attachment in a copolymer;

BzF is selected from the group consisting of BzF-1, BzF-2, and BzF-3;

$BzF^a$ is selected from the group consisting of $BzF^a$-1, $BzF^a$-2, and $BzF^a$-3;

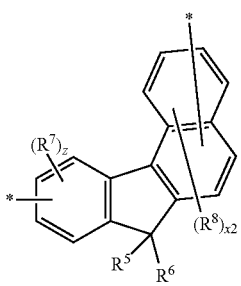

BzF-1

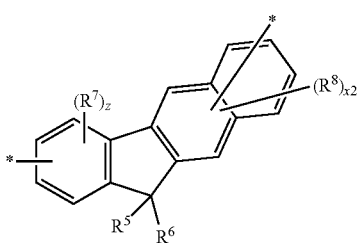

BzF-2

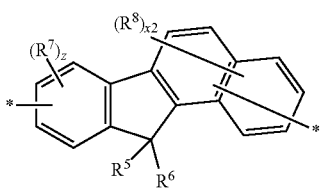

BzF-3

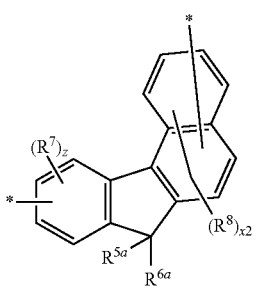

$BzF^a$-1

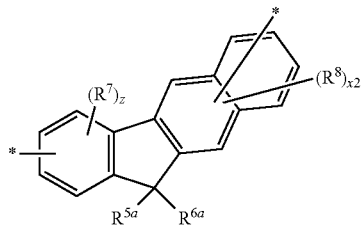

$BzF^a$-2

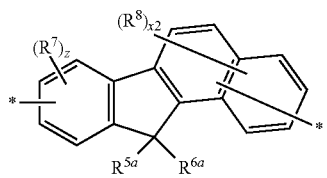

$BzF^a$-3 where:

$R^{5a}$ and $R^{6a}$ are the same or different at each occurrence and are selected from the group consisting of alkyl, aryl, alkylaryl, alkyl having a point of attachment to the polymer, aryl having a point of attachment to the polymer, alkylaryl having a point of attachment to the polymer, and deuterated analogs thereof, where two alkyl $R^{5a}$ and $R^{6a}$ groups can be joined together to make a cycloalkyl spiro ring, and where two $R^{5a}$ and $R^{6a}$ phenyl groups can be joined to form a spiro fluorene group;

$R^7$ and $R^8$ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^7$ and/or $R^8$ groups can be joined together to form a fused ring;

x2 is an integer from 0-5;

z is an integer from 0-3; and

* indicates a point of attachment.

2. The electroactive material of claim 1, wherein the material is a compound having Formula I-a, Formula II-a, or Formula III-a, a copolymer having Formula IV-a, or a polymer having at least one monomeric unit of Formula V-a or Formula V-b.

3. The electroactive material of claim 1, wherein n≥10 and n1≥10.

4. The electroactive material of claim 1, wherein x>0 and at least one $R^1$ is an N-heteroaryl selected from the group consisting of pyrrole, pyridine, pyrimidine, carbazole, imidazole, benzimidazole, imidazolobenzimidazole, triazole, benzotriazole, triazolopyridine, indolocarbazole, phenanthroline, quinoline, isoquinoline, quinoxaline, substituted derivatives thereof, and deuterated analogs thereof.

5. The electroactive material of claim 1, wherein x>0 and at least one $R^1$ has Formula a Formula a

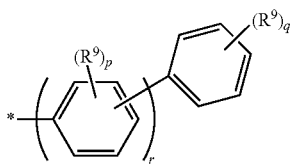

where:
R⁹ is the same or different at each occurrence and is selected from the group consisting of D, alkyl, alkoxy, siloxane, silyl, diarylamino, carbazolyl, deuterated alkyl, deuterated alkoxy, deuterated siloxane, deuterated silyl, deuterated diarylamino, and deuterated carbazolyl, where adjacent R⁹ groups can be joined together to form an fused aromatic ring or a deuterated fused aromatic ring;

p is the same or different at each occurrence and is an integer from 0-4;

q is an integer from 0-5;

r is an integer from 1 to 5; and

* indicates the point of attachment.

6. The electroactive compound of claim 1, wherein Ar¹ is a hydrocarbon aryl group or deuterated hydrocarbon aryl group having 6-36 ring carbons.

7. An organic electronic device comprising an anode, a cathode, and at least one organic active layer therebetween, where the organic active layer comprises the compound of claim 1.

8. The device of claim 7, wherein the organic active layer is a photoactive layer.

9. The device of claim 8, wherein the photoactive layer further comprises at least one host material.

10. The device of claim 8, wherein the device has blue emission with an x-coordinate less than 0.15 and a y-coordinate less than 0.10, according to the C.I.E. chromaticity scale, Commission Internationale de L'Eclairage, 1931.

11. An electroactive material comprising compound having Formula I or Formula I-a

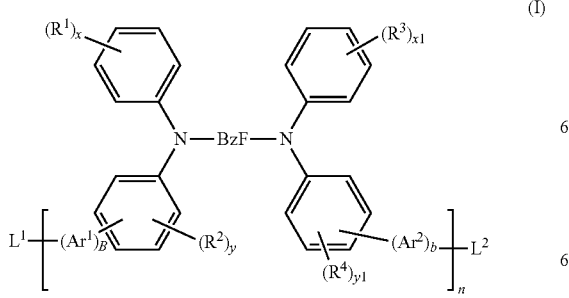

(I)

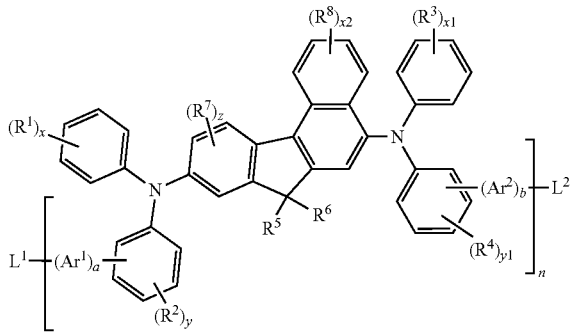

(I-a)

wherein:
Ar¹Ar² are the same or different at each occurrence and are selected from the group consisting of hydrocarbon aryl, heteroaryl, and deuterated analogs thereof;

L¹ and L² are the same or different and are selected from the group consisting of H, D, halogen, aryl, arylamino, crosslinkable groups, deuterated aryl, deuterated arylamino, and deuterated crosslinkable groups;

R¹-R⁴ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent groups selected from R¹-R⁴ can be joined together to form a fused ring;

R⁵ and R⁶ are the same or different at each occurrence and are selected from the group consisting of alkyl, aryl, and deuterated analogs thereof, where two alkyl R⁵ and R⁶ groups can be joined together to make a cycloalkyl spiro ring, and where two R⁵ and R⁶ phenyl groups can be joined to form a spiro fluorene group;

a is 0 or 1;
b is 0 or 1;
x and x1 are the same or different and are an integer from 0-5;
y and y1 are the same or different and are an integer from 0-4;
n is an integer of 2 or greater;
BzF is selected from the group consisting of BzF-1, BzF-2, and BzF-3;

BzF-1

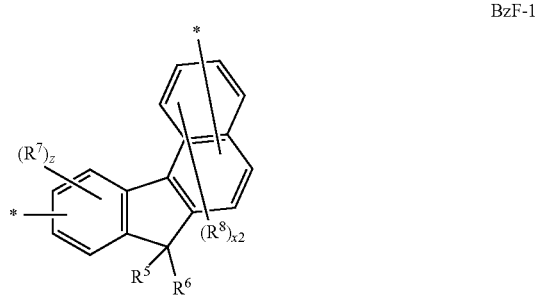

-continued

BzF-2

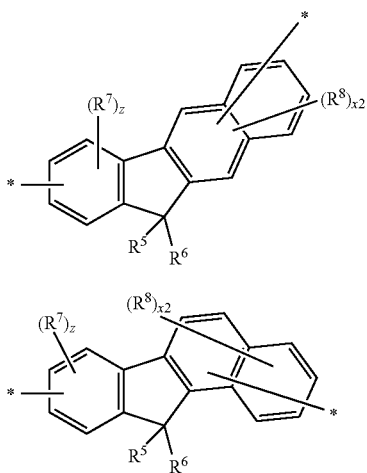

BzF-3

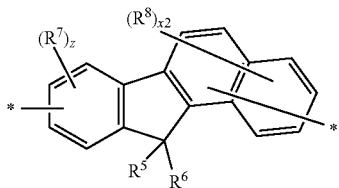

where:
R⁷ and R⁸ are the same or different at each occurrence and are selected from the group consisting of D, F, CN, hydrocarbon aryl, heteroaryl, aryloxy, fluoroaryl, alkyl, fluoroalkyl, alkoxy, fluoroalkoxy, amino, silyl, siloxane, siloxy, germyl, deuterated hydrocarbon aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R⁷ and/or R⁸ groups can be joined together to form a fused ring;
x2 is an integer from 0-5;
z is an integer from 0-3; and
* indicates a point of attachment.

12. The electroactive material of claim 11, wherein n≥10.

13. The electroactive material of claim 11, wherein x>0 and at least one R¹ is an N-heteroaryl selected from the group consisting of pyrrole, pyridine, pyrimidine, carbazole, imidazole, benzimidazole, imidazolobenzimidazole, triazole, benzotriazole, triazolopyridine, indolocarbazole, phenanthroline, quinoline, isoquinoline, quinoxaline, substituted derivatives thereof, and deuterated analogs thereof.

14. The electroactive material of claim 11, wherein x>0 and at least one R¹ has Formula a

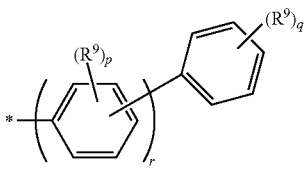

Formula a where:
R⁹ is the same or different at each occurrence and is selected from the group consisting of D, alkyl, alkoxy, siloxane, silyl, diarylamino, carbazolyl, deuterated alkyl, deuterated alkoxy, deuterated siloxane, deuterated silyl, deuterated diarylamino, and deuterated carbazolyl, where adjacent R⁹ groups can be joined together to form an fused aromatic ring or a deuterated fused aromatic ring;
p is the same or different at each occurrence and is an integer from 0-4;
q is an integer from 0-5;
r is an integer from 1 to 5; and
* indicates the point of attachment.

15. The electroactive compound of claim 11, wherein Ar¹ is a hydrocarbon aryl group or deuterated hydrocarbon aryl group having 6-36 ring carbons.

16. An organic electronic device comprising an anode, a cathode, and at least one organic active layer therebetween, where the organic active layer comprises the compound of claim 11.

17. The device of claim 16, wherein the organic active layer is a photoactive layer.

18. The device of claim 17, wherein the photoactive layer further comprises at least one host material.

19. The device of claim 17, wherein the device has blue emission with an x-coordinate less than 0.15 and a y-coordinate less than 0.10, according to the C.I.E. chromaticity scale, Commission Internationale de L'Eclairage, 1931.

* * * * *